(12) United States Patent
Yen et al.

(10) Patent No.: US 11,239,435 B2
(45) Date of Patent: Feb. 1, 2022

(54) IRIDIUM COMPLEX AND ORGANIC ELECTROLUMINESCENCE DEVICE USING THE SAME

(71) Applicants: Feng-Wen Yen, Taipei (TW); Li-Hsin Hsu, New Taipei (TW)

(72) Inventors: Feng-Wen Yen, Taipei (TW); Li-Hsin Hsu, New Taipei (TW)

(73) Assignee: LUMINESCENCE TECHNOLOGY CORP., Hsin-Chu (TW)

( * ) Notice: Subject to any disclaimer, the term of this patent is extended or adjusted under 35 U.S.C. 154(b) by 338 days.

(21) Appl. No.: 16/252,730

(22) Filed: Jan. 21, 2019

(65) Prior Publication Data

US 2020/0235318 A1    Jul. 23, 2020

(51) Int. Cl.
| | | |
|---|---|---|
| *H01L 51/00* | (2006.01) | |
| *C09K 11/06* | (2006.01) | |
| *C07F 15/00* | (2006.01) | |
| *H01L 51/50* | (2006.01) | |

(52) U.S. Cl.
CPC ...... *H01L 51/0085* (2013.01); *C07F 15/0033* (2013.01); *C09K 11/06* (2013.01); *C09K 2211/1007* (2013.01); *C09K 2211/1011* (2013.01); *C09K 2211/1029* (2013.01); *C09K 2211/1044* (2013.01); *C09K 2211/1088* (2013.01); *C09K 2211/1092* (2013.01); *C09K 2211/1096* (2013.01); *C09K 2211/185* (2013.01); *H01L 51/5016* (2013.01)

(58) Field of Classification Search
None
See application file for complete search history.

(56) References Cited

U.S. PATENT DOCUMENTS

2016/0351835 A1    12/2016    Yen

*Primary Examiner* — Jay Yang

(57) ABSTRACT

The present invention discloses an iridium complex represented by the following formula (1) and an organic electroluminescence device using the iridium complex as a phosphorescent dopant material. The phosphorescent dopant material may be for lowering a driving voltage or power consumption or increasing a current efficiency of half-life of the organic electroluminescence device.

formula (1)

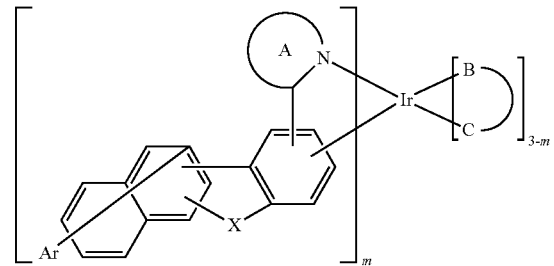

The same definition as described in the present invention.

10 Claims, 1 Drawing Sheet

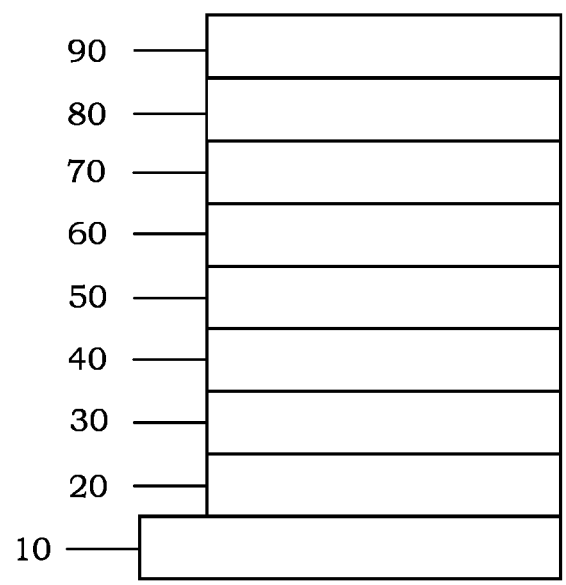

IRIDIUM COMPLEX AND ORGANIC ELECTROLUMINESCENCE DEVICE USING THE SAME

FIELD OF INVENTION

The present invention relates generally to an iridium complex, and, more specifically, to an organic electroluminescence (hereinafter referred to as organic EL) device using the iridium complex.

BACKGROUND OF THE INVENTION

An organic EL device is a light-emitting diode (LED) in which the light emitting layer is a film made from organic compounds, which emits light in response to an electric current. The light emitting layer containing the organic compound is sandwiched between two electrodes. The organic EL device is applied to flat panel displays due to its high illumination, low weight, ultra-thin profile, self-illumination without back light, low power consumption, wide viewing angle, high contrast, simple fabrication methods and rapid response time.

The first observation of electroluminescence in organic materials was in the early 1950s by Andre Bernanose and his co-workers at the Nancy-University in France. Martin Pope and his co-workers at New York University first observed direct current (DC) electroluminescence on a single pure crystal of anthracene and on anthracene crystals doped with tetracene under vacuum in 1963. The first diode device was created by Ching W. Tang and Steven Van Slyke at Eastman Kodak in 1987. The diode device used a two-layer structure with separate hole transporting and electron transporting layers, resulting in reduction of operating voltage and improvement of the efficiency, thereby leading to the current era of organic EL research and device production.

Typically, organic EL device is composed of organic material layers sandwiched between two electrodes. The organic material layers include the hole transporting layer, the light emitting layer, and the electron transporting layer. The basic mechanism of organic EL involves the injection, transport, and recombination of carriers as well as exciton formation for emitting light. When an external voltage is applied across the organic EL device, electrons and holes are injected from the cathode and the anode, respectively. Electrons will be injected from a cathode into a LUMO (lowest unoccupied molecular orbital) and holes will be injected from an anode into a HOMO (highest occupied molecular orbital). Subsequently, the electrons recombine with holes in the light emitting layer to form excitons and then emit light. When luminescent molecules absorb energy to achieve an excited state, the exciton may either be in a singlet state or a triplet state, depending on how the spins of the electrons and holes have been combined. 75% of the excitons is formed by recombination of electrons and holes to achieve the triplet excited state. Decay from triplet states is spin forbidden, thus, a fluorescence electroluminescent device has only 25% internal quantum efficiency. In contrast to fluorescence electroluminescent device, phosphorescent organic EL device make use of spin-orbit interactions to facilitate intersystem crossing between singlet and triplet states, thus obtaining emission from both singlet and triplet states and the internal quantum efficiency of electroluminescent devices from 25% to 100%. The spin-orbit interactions is achieved by certain heavy atoms, such as iridium, rhodium, platinum, and palladium, and the phosphorescent transition may be observed from an excited MLCT (metal to ligand charge transfer) state of organic metallic complexes.

The phosphorescent organic EL device utilizes both triplet and singlet excitons. Cause of longer lifetime and diffusion length of triplet excitons compared to those of singlet excitons, the phosphorescent organic EL device generally need an additional hole blocking layer (HBL) between the emitting layer (EML) and the electron transporting layer (ETL) or an electron blocking layer (EBL) between the emitting layer (EML) and the hole transporting layer (HTL). The purpose of the use of HBL or EBL is to confine the recombination of injected holes and electrons and the relaxation of created excitons within the EML; hence the device's efficiency can be improved. To meet such roles, the hole blocking materials or the electron blocking materials must have HOMO (highest occupied molecular orbital) and LUMO (lowest unoccupied molecular orbital) energy levels suitable to block hole or electron transport from the EML to the ETL or the HTL.

However, there is still a need for improvement in the case of use of those organic materials in an organic EL device of some prior art displays, for example, in relation to the half-life, current efficiency or driving voltage of the organic EL device.

SUMMARY OF THE INVENTION

According to the reasons described above, the present invention has the objective of resolving the problems of prior arts and offering an organic EL device, which has high current efficiency or long half-life. The present invention discloses an iridium complex, which is used as a phosphorescent dopant material to lower a driving voltage or power consumption and increase a current efficiency or half-life of an organic electroluminescence device. The iridium complex exhibits good thermal stability in the process for producing the organic EL device.

The present invention has the economic advantages for industrial practice. Accordingly, the present invention discloses an iridium complex which may be used in organic EL devices. The mentioned iridium complex may be represented by the following formula (1):

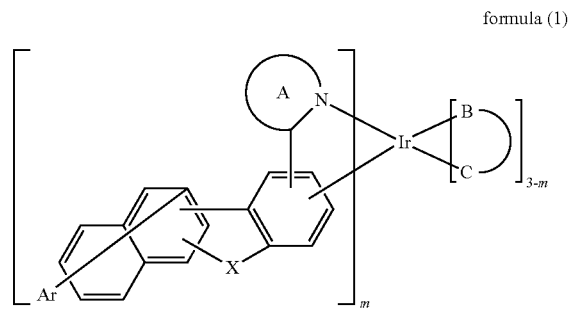

formula (1)

wherein B-C may represent a bidentate ligand. Ar may represent a substituted or unsubstituted fused ring hydrocarbon unit having one or two rings. Ring A may represent an imidazole, a pyridine, a quinoline or an isoquinoline. X may be O or S. The symbol m may represent an integer of 1, 2 or 3. The symbol n may represent an integer of 0, 1, 2, 3 or 4. $R_1$ may be selected from the group consisting of a hydrogen atom, a halogen, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

The organic compound may also be represented by one of the following formula (2) to formula (6):

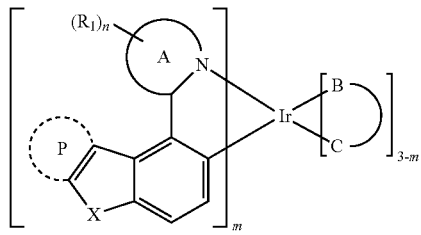

formula (2)

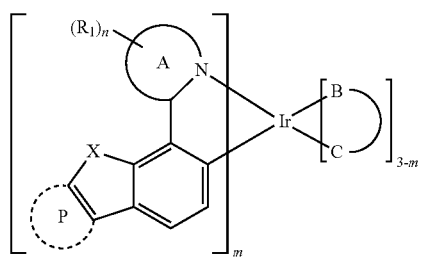

formula (3)

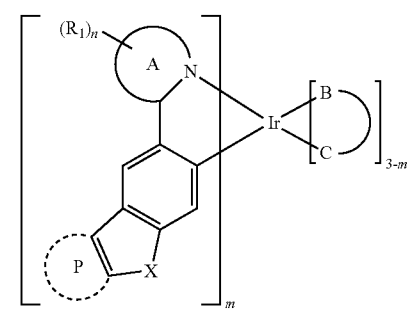

formula (4)

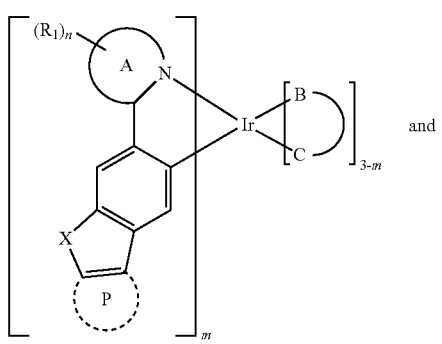

formula (5)

and

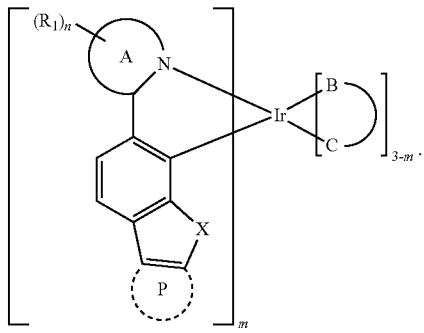

formula (6)

In each of the formula (2) to formula (6), P may represent a substituted or unsubstituted fused ring hydrocarbons unit having two, three or four rings. The fused ring hydrocarbons unit may be, for example, and not limited to a naphthyl group, an anthracenyl group, a phenanthrenyl group, a triphenylenyl group, a pyrenyl group, a tetracenyl group or one of the following substituents:

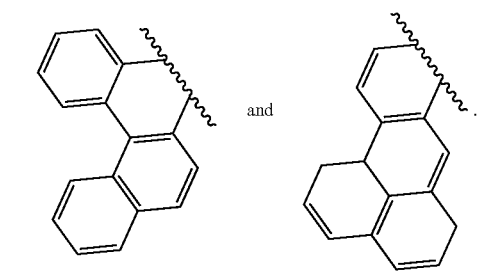

The present invention further discloses an organic EL device. The organic EL device comprises a pair of electrodes having a cathode and an anode. The organic EL device may comprise a light emitting layer and one or more layers of organic thin film layers between the pair of electrodes. The light emitting layer and/or the one or more organic thin film layers comprise the iridium complex of formula (1). The light emitting layer may be an emitting layer comprising emitting host materials and an emitting guest (dopant) material. The emitting host material may be doped with about 15% emitting guest material. The emitting layer may have a thickness of about 30 nm.

An organic EL device of the present invention comprises an organic compound of formula (1) as a dopant material to collocate with, for example, and not limited to co-host material H2 and H3, to emit a red light, thereby lowering a driving voltage to about 3.7-4.5 V, increasing a current efficiency to about 18-24 cd/A, or increasing a half-life to about 630-770 hours.

An organic EL device of the present invention comprises an organic compound of formula (1) as a dopant material to collocate with, for example, and not limited to co-host material H2 and H3, to emit a yellow light, thereby lowering a driving voltage to about but not limited to 4.0-4.6 V, increasing a current efficiency to about but not limited to 43-45 cd/A, or increasing a half-life to about but not limited to 410-530 hours.

An organic EL device of the present invention comprises an organic compound of formula (1) as a dopant material to collocate with, for example, and not limited to co-host material H2 and H3, to emit a green light, thereby lowering a driving voltage to about but not limited to 3.6-4.7 V, increasing a current efficiency to about but not limited to 40-47 cd/A, or increasing a half-life to about but not limited to 480-740 hours.

BRIEF DESCRIPTION OF THE DRAWINGS

The FIGURE is a schematic view showing an organic EL device according to an embodiment of the present invention.

DESCRIPTION OF THE PREFERRED EMBODIMENTS

What probed into the invention is the iridium complex and organic EL device using the iridium complex. Detailed descriptions of the production, structure and elements will be provided as follows such that the invention can be fully understood. Obviously, the application of the invention is not confined to specific details familiar to those skilled in the art. On the other hand, the common elements and procedures that are well known are not described in detail to avoid unnecessary limits of the invention. Some preferred embodiments of the present invention will now be described in greater detail as follows. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

In one embodiment of the present invention, an iridium complex which can be used as a phosphorescent dopant material of a light emitting layer for an organic EL device is disclosed. The iridium complex may be represented by the following formula (1):

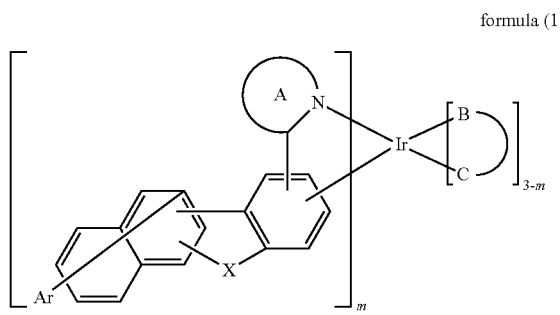

formula (1)

wherein B-C may represent a bidentate ligand. Ar may represent a substituted or unsubstituted fused ring hydrocarbon unit having one or two rings. Ring A may represent an imidazole, a pyridine, a quinoline or an isoquinoline. X may be O or S. The symbol m may represent an integer of 1, 2 or 3. The symbol n may represent an integer of 0, 1, 2, 3 or 4. $R_1$ may be selected from the group consisting of a hydrogen atom, a halogen, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

In some embodiments, the B-C represent one of the following formulas:

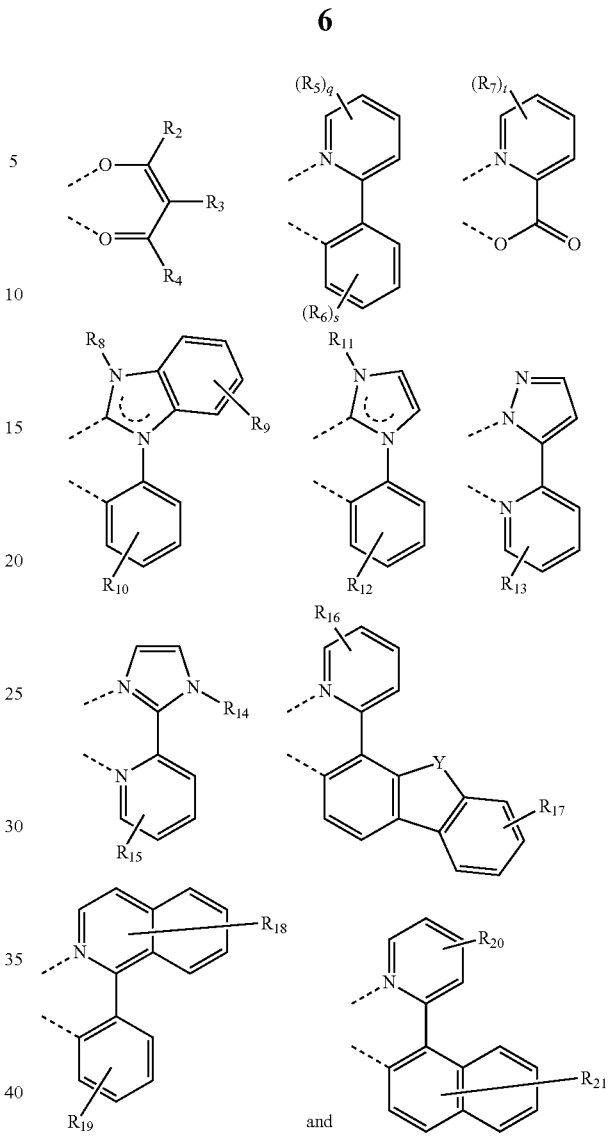

wherein Y is selected from the atom or group consisting from O, S, Se, $CR_{22}R_{23}$, $NR_{24}$ or $SiR_{25}R_{26}$. The symbols q, s, and t independently represent an integer of 1, 2, 3 or 4. $R_2$ to $R_{26}$ may independently be a hydrogen atom, a halogen, a substituted or unsubstituted alkyl group having 1 to 30 carbon atoms, a substituted or unsubstituted cycloalkyl group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

In certain embodiments, $R_2$ to $R_{21}$ may independently be a hydrogen atom, a methyl group, an isopropyl group, an isobutyl group, a cyclopentyl group, a hexyl group, a cyclohexyl group, or a phenyl group.

Ring A may represent a phenyl group, a naphthyl group, an anthracenyl group, a phenanthrenyl group, a pyrenyl group, a chrysenyl group, a triphenylenyl group, a perylenyl group, an imidazole group, a pyridine group, an isoquinoline group, a thiophenyl group, or a benzothiophenyl group.

The iridium complex may be selected from the group consisting of:

EX1
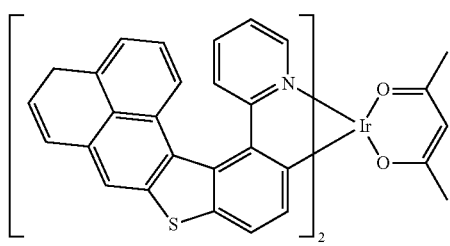
EX2
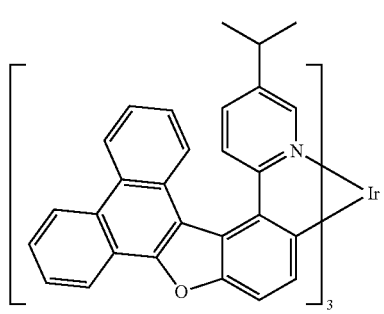
EX3
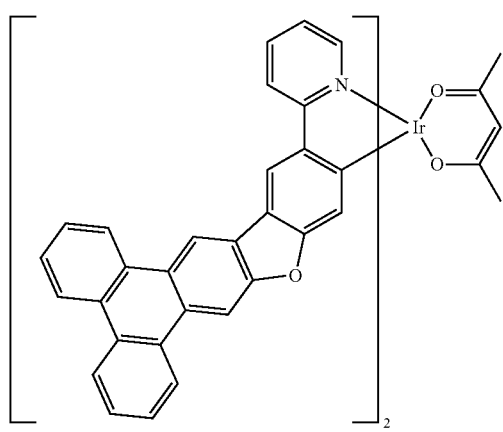
EX4
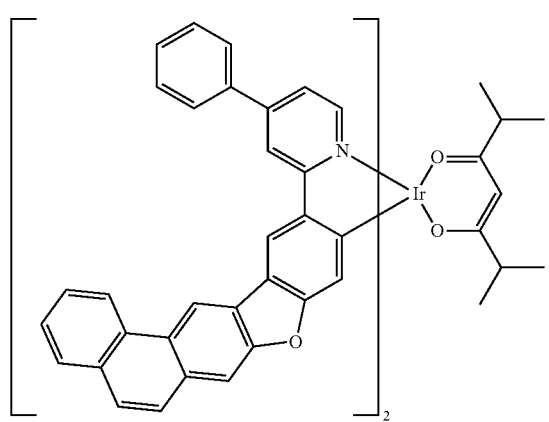
EX5
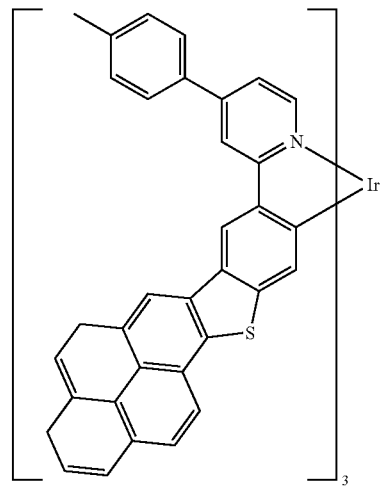
EX6
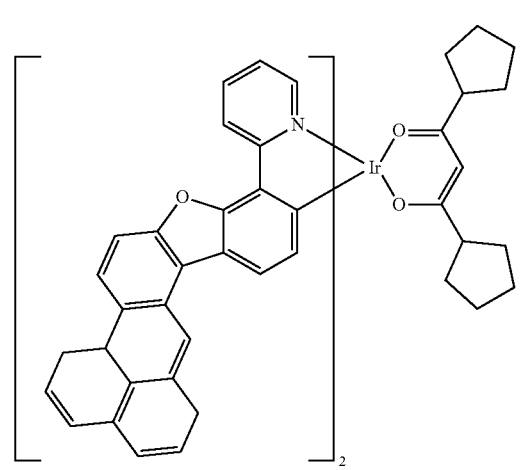
EX7

-continued
EX8
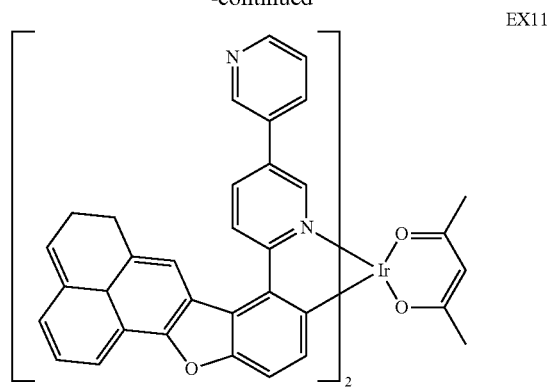
EX9
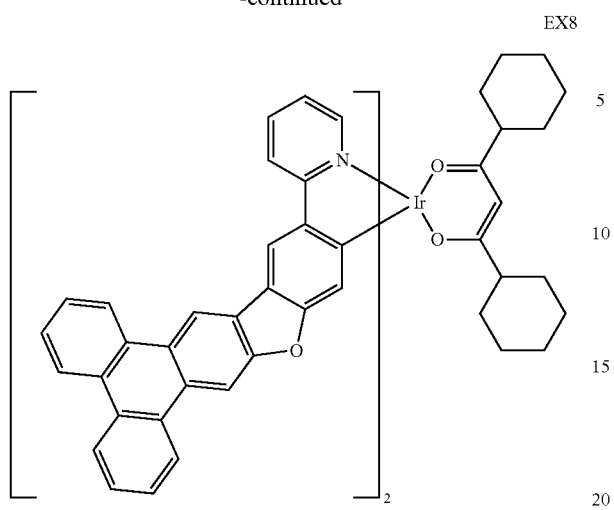
EX10
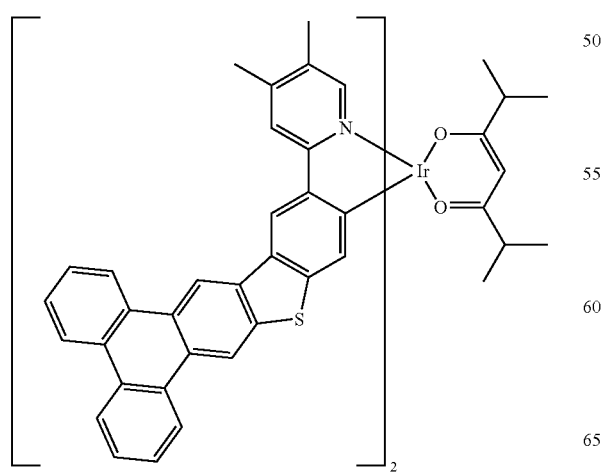
-continued
EX11
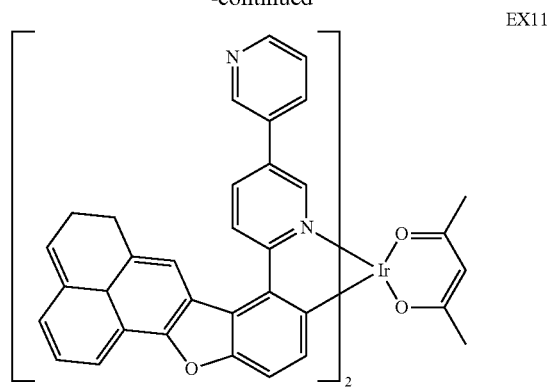
EX12
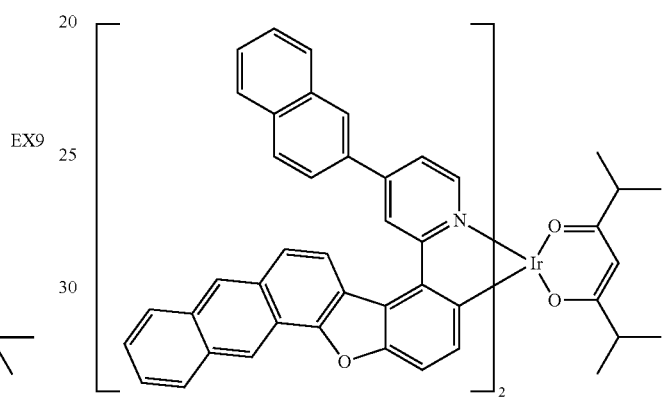
EX13
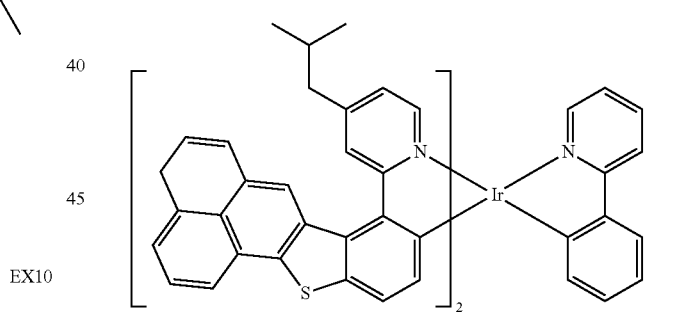
EX14
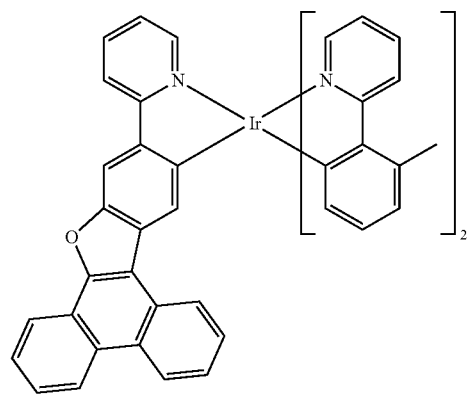

EX15
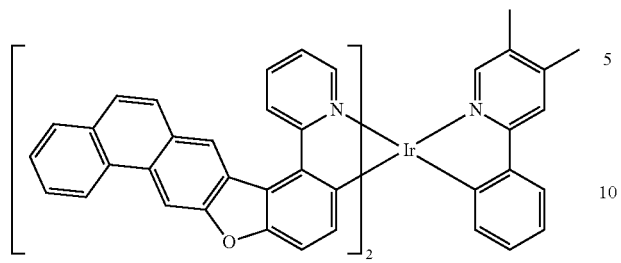
EX16
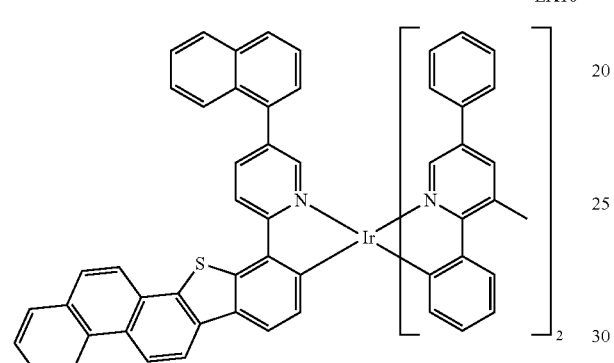
EX17
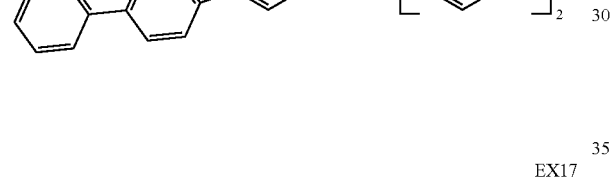
EX18
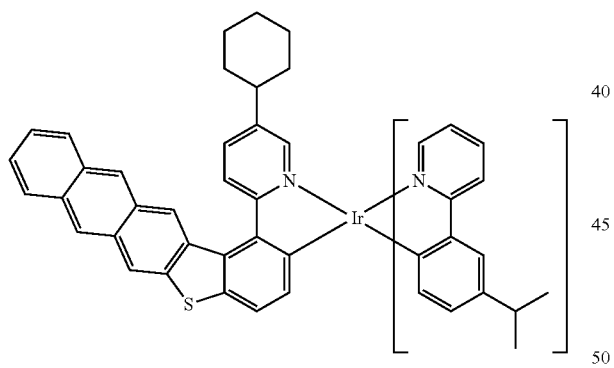
EX19
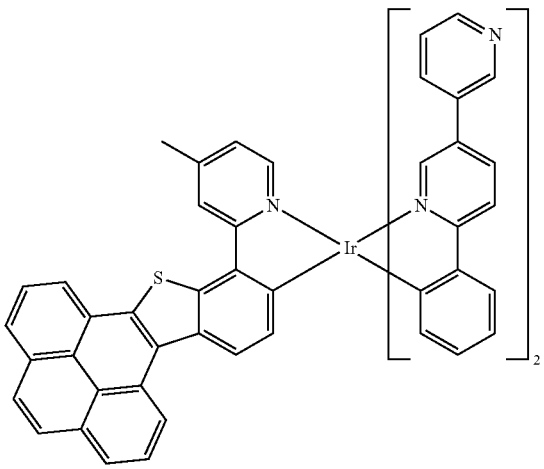
EX20
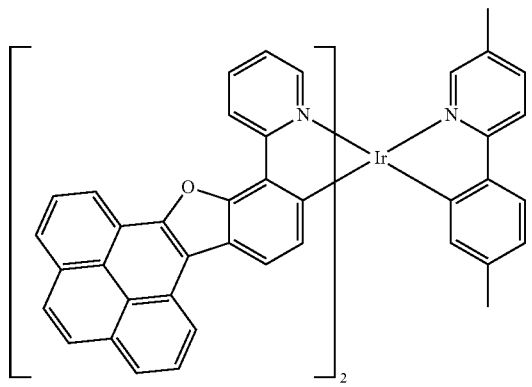
EX21
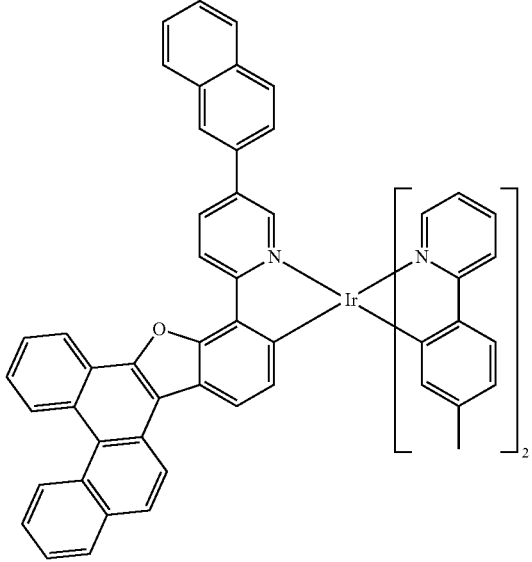

EX22
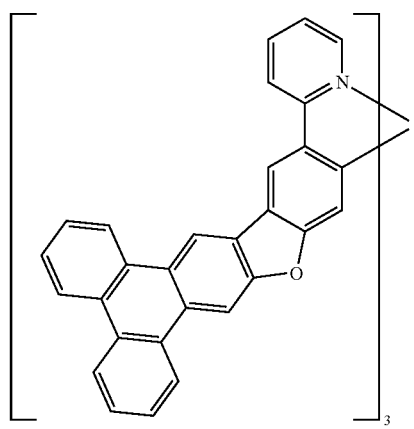
EX23
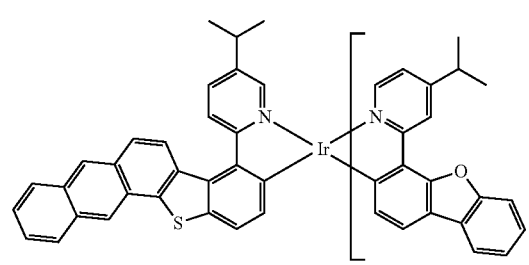
EX24
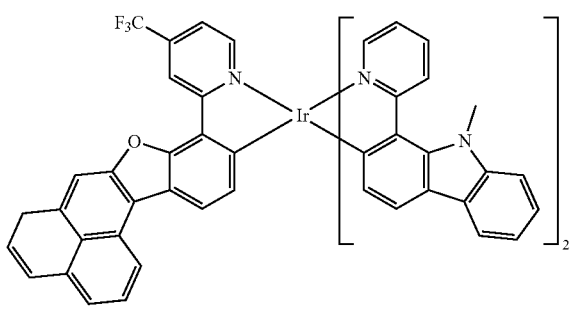
EX25
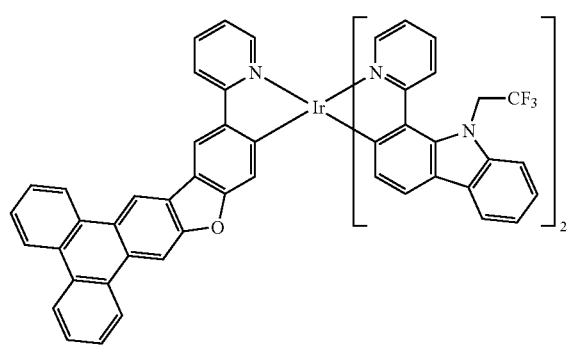
EX26
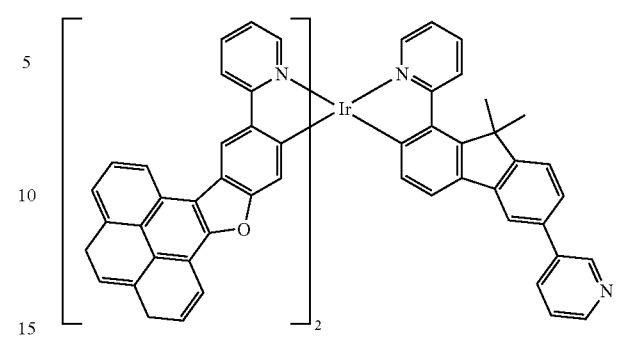
EX27
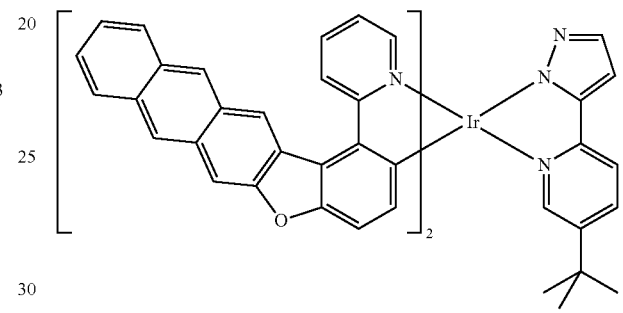
EX28
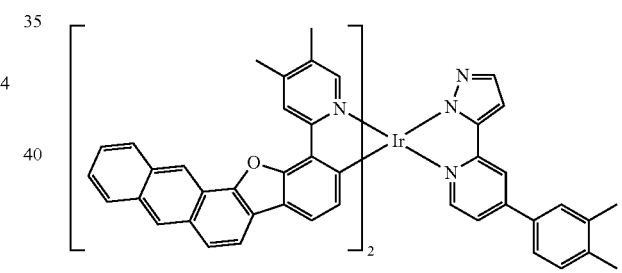
EX29
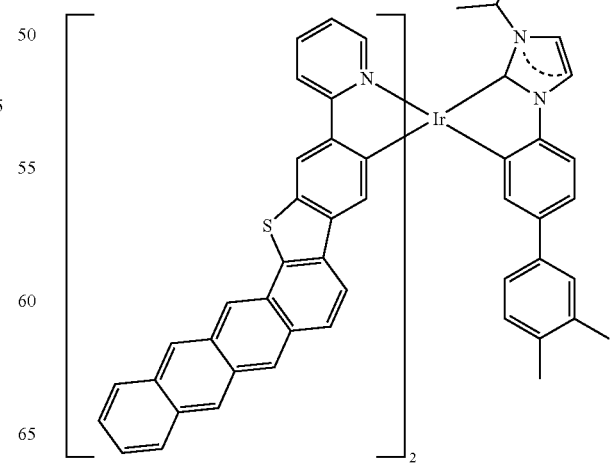

EX30
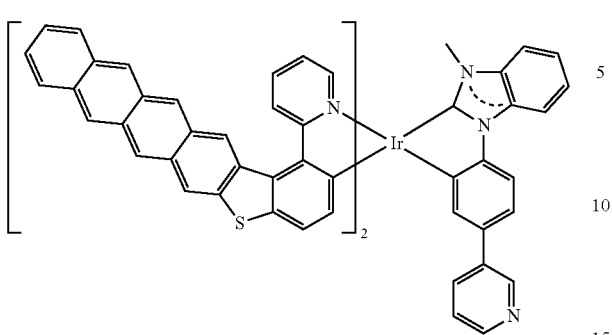
EX31
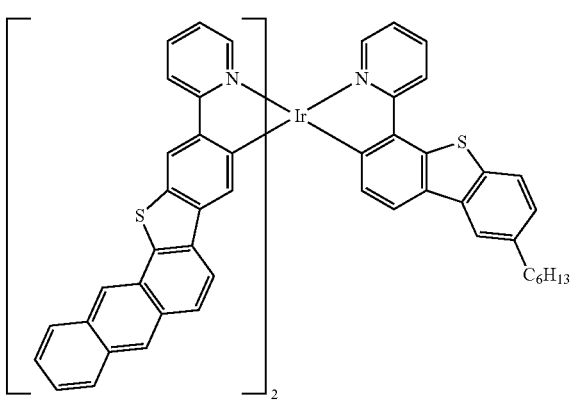
EX32
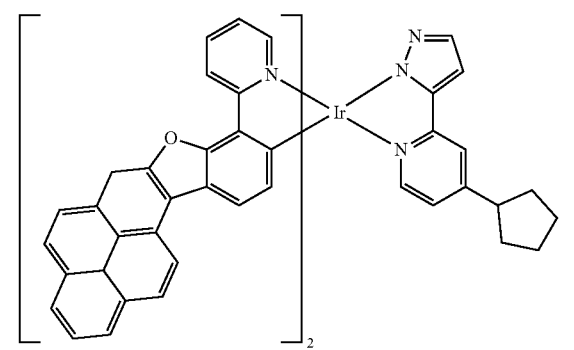
EX33
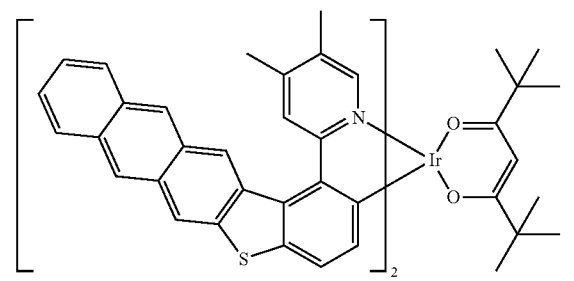
EX34
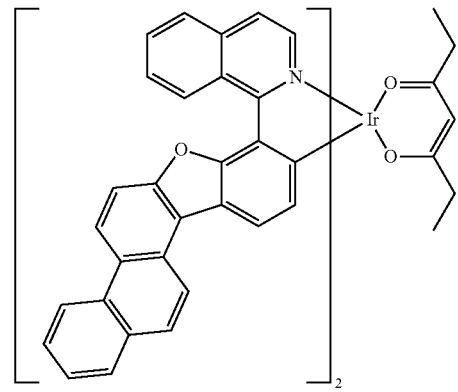
EX35
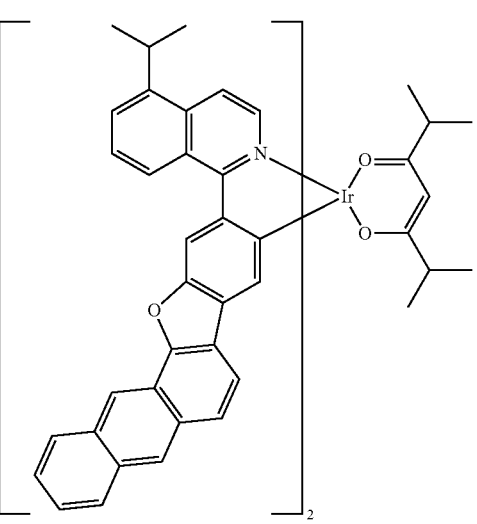
EX36
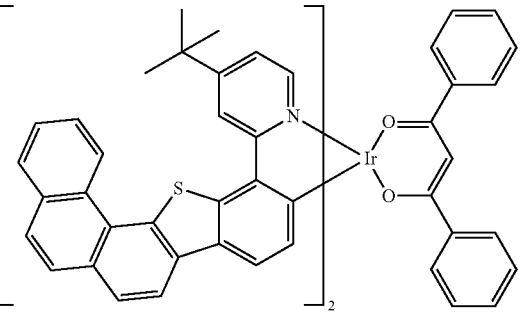

-continued
EX37
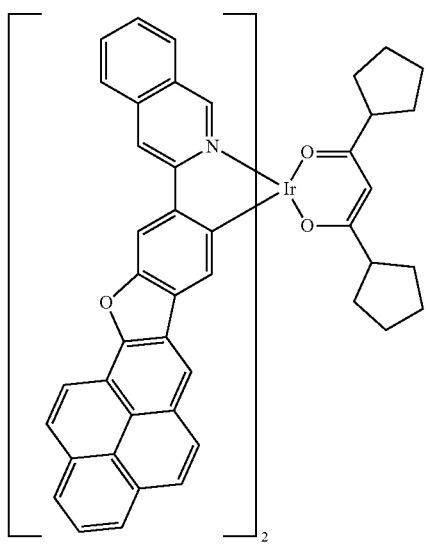
EX38
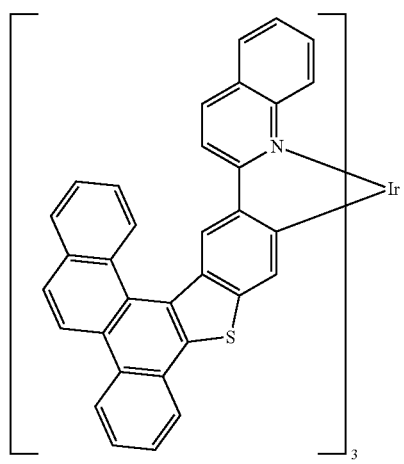
EX39
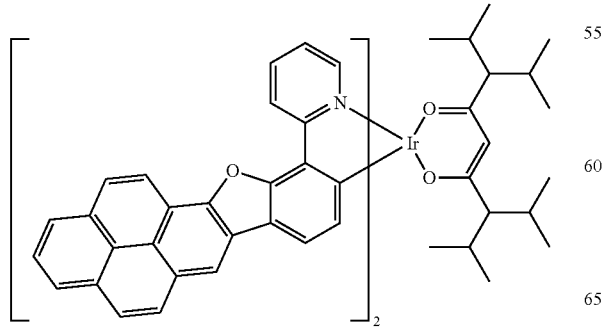
-continued
EX40
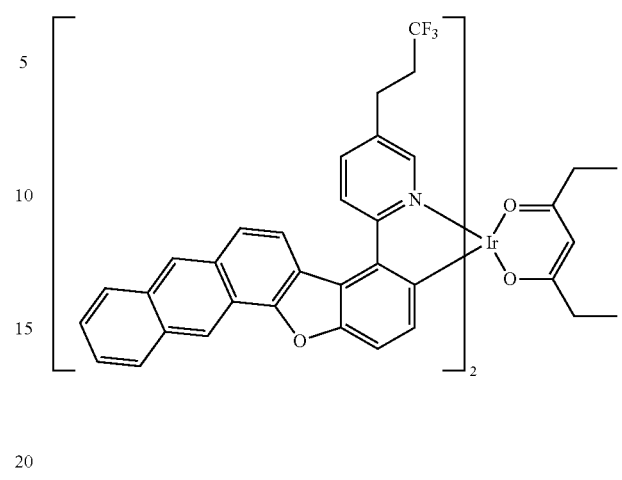
EX41
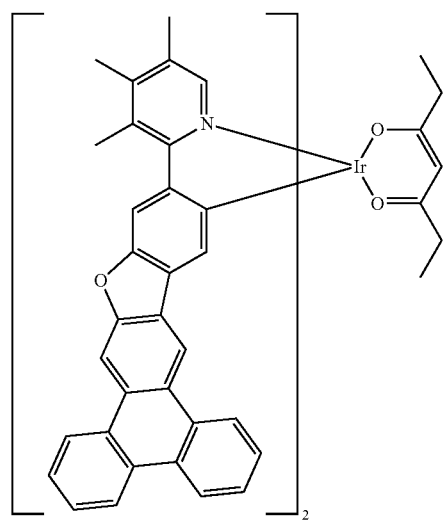
EX42
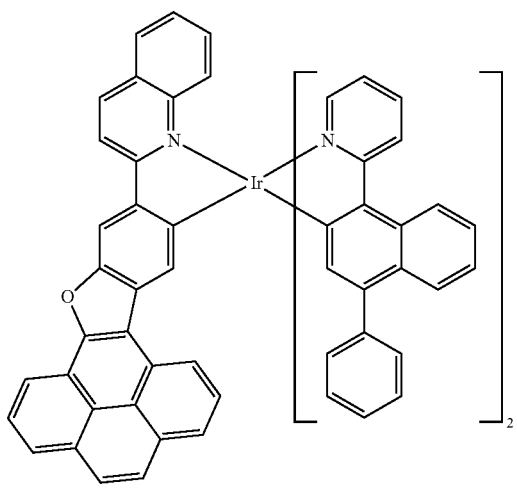

EX43
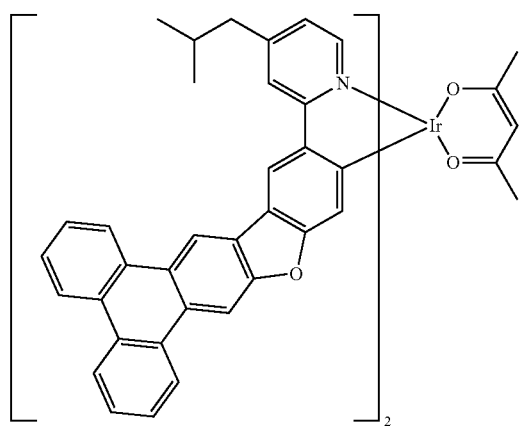
EX44
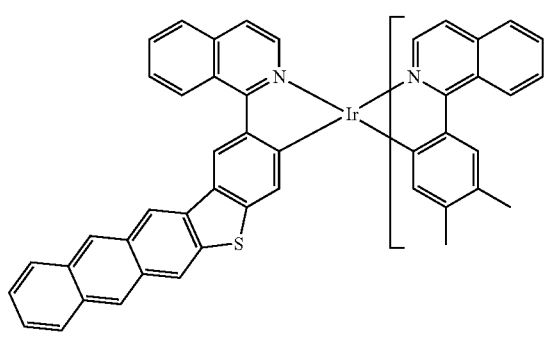
EX45
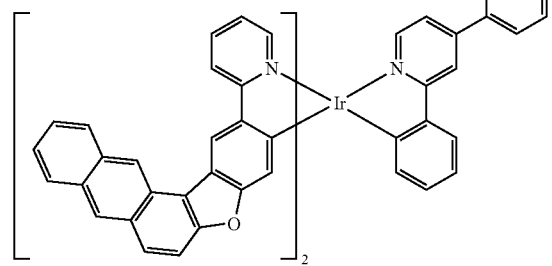
EX46
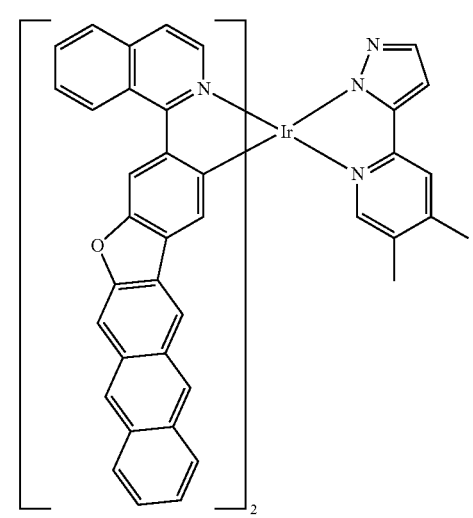
EX47
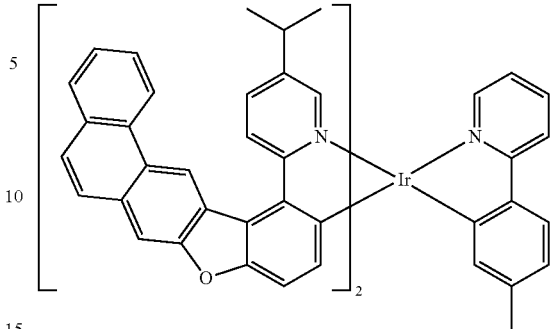
EX48
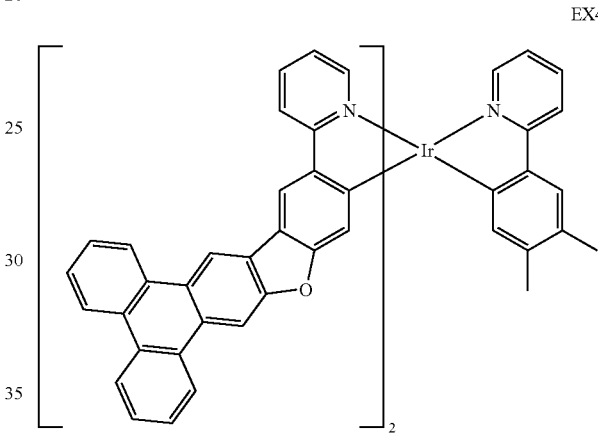
EX49
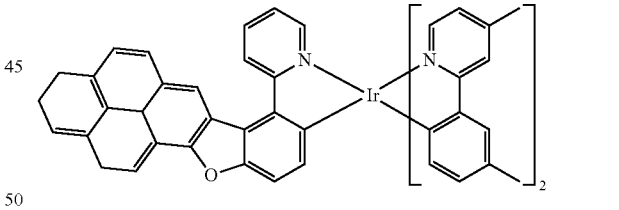
EX50
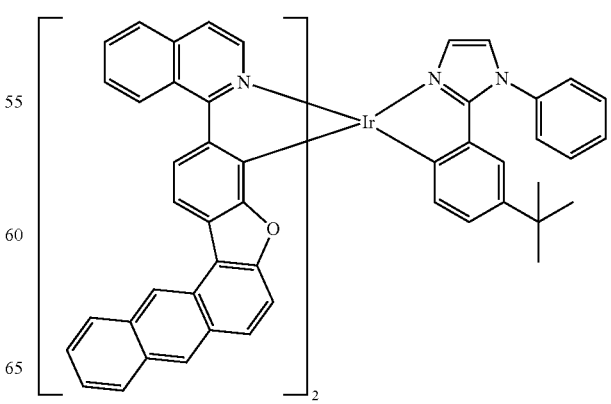

-continued
EX51
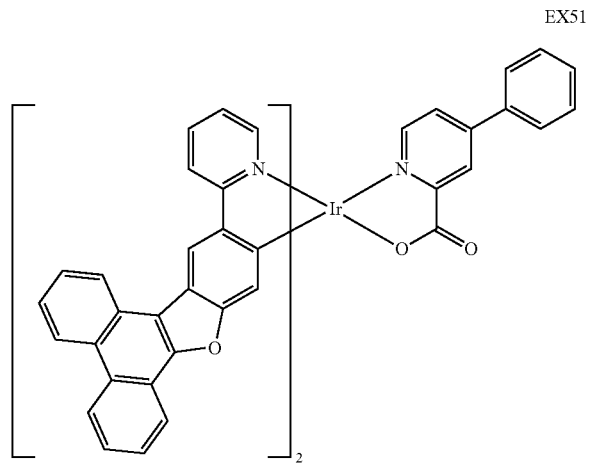
EX52
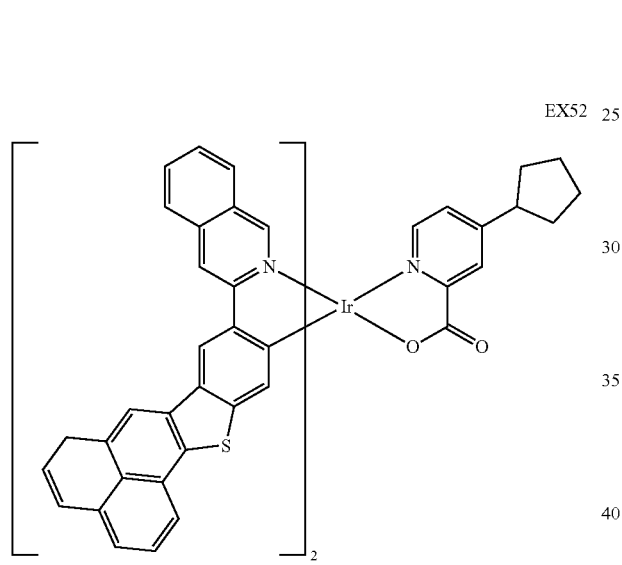
EX53
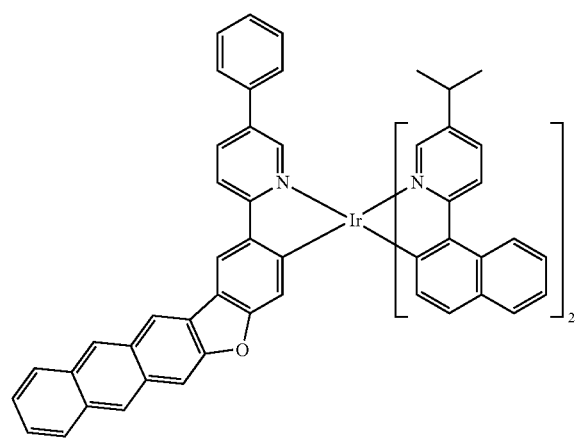
-continued
EX54
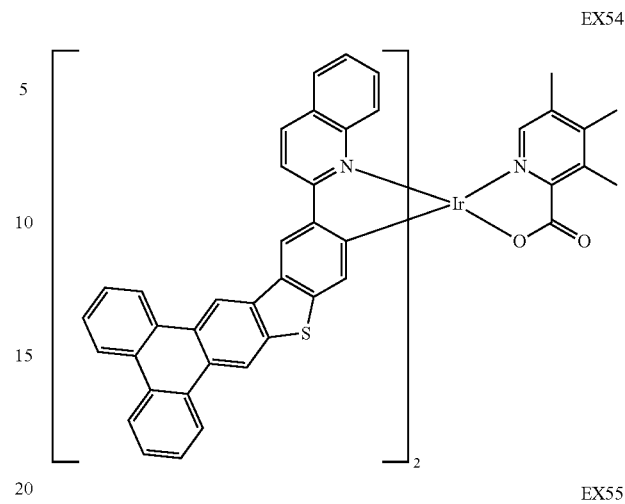
EX55
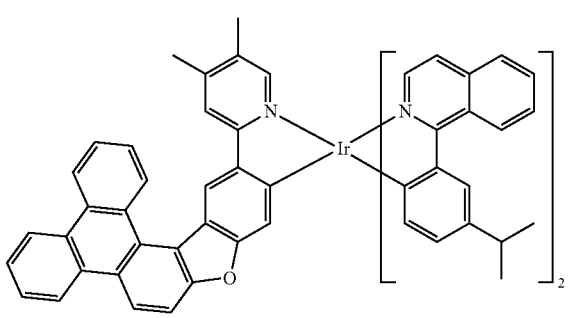
EX56
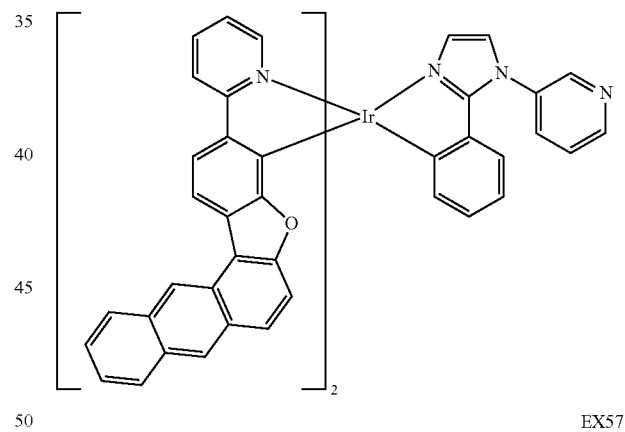
EX57
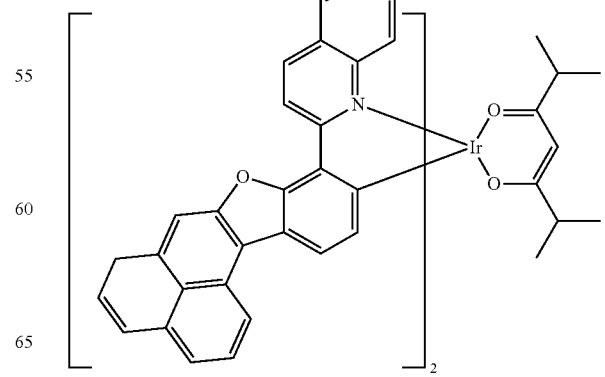

-continued
EX58
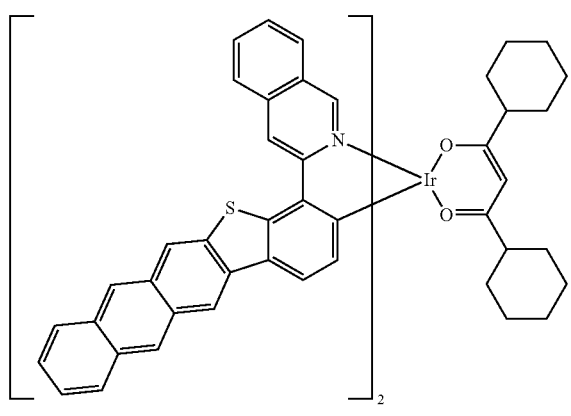
EX59
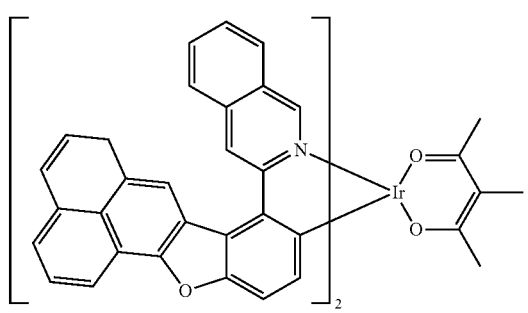
EX60
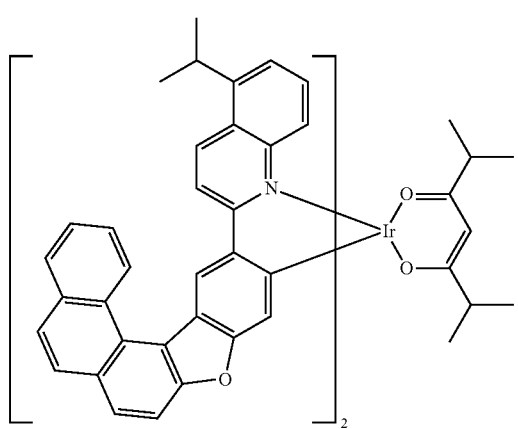
-continued
EX61
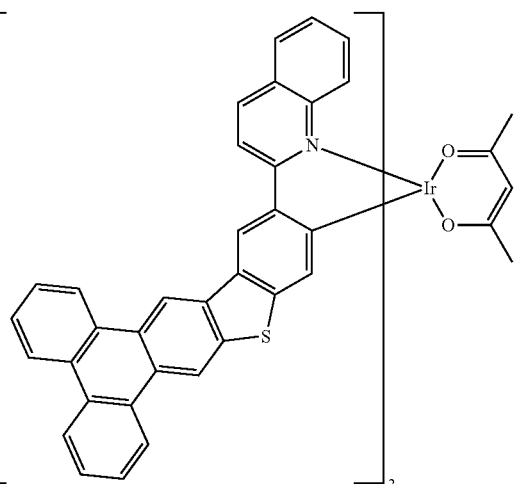
EX62
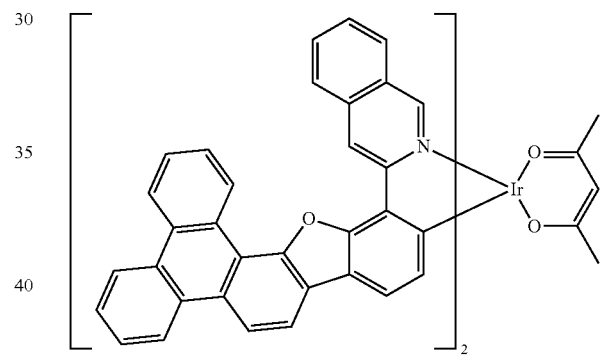
EX63
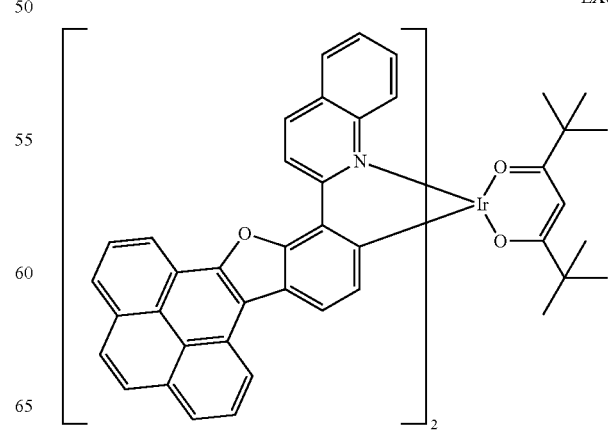

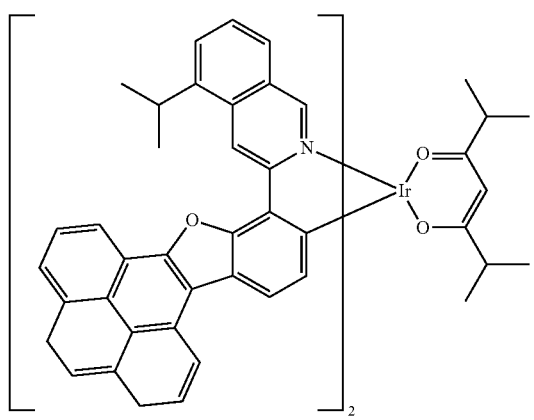
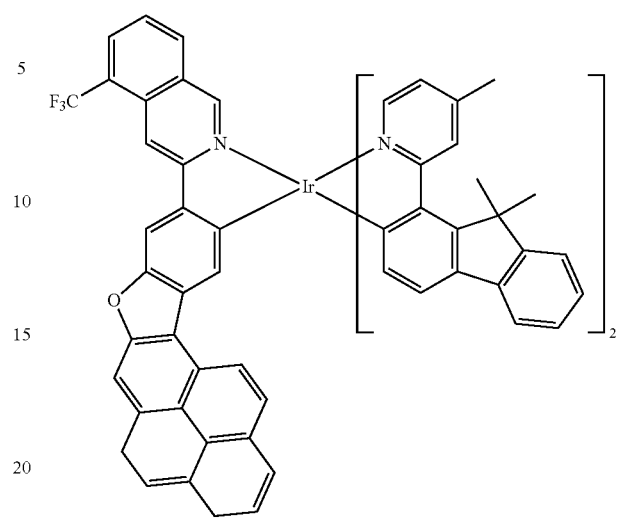

EX71
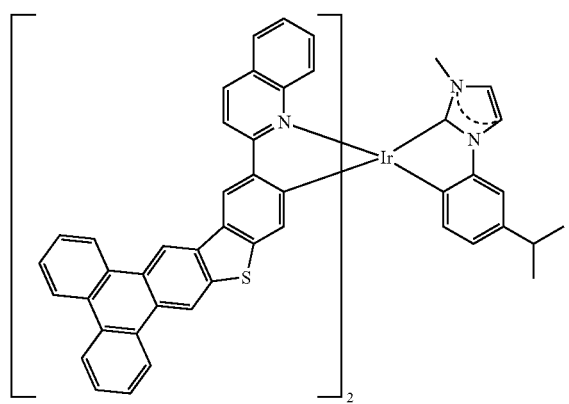
EX72
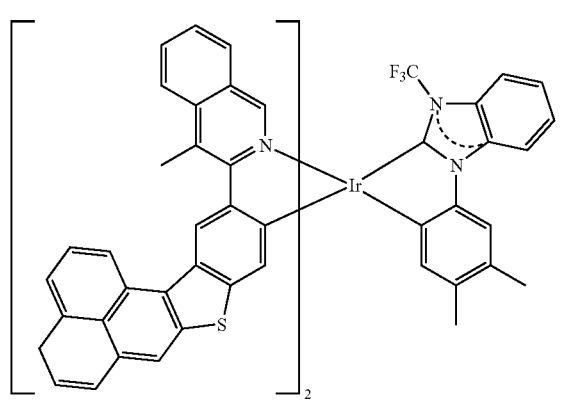
EX73
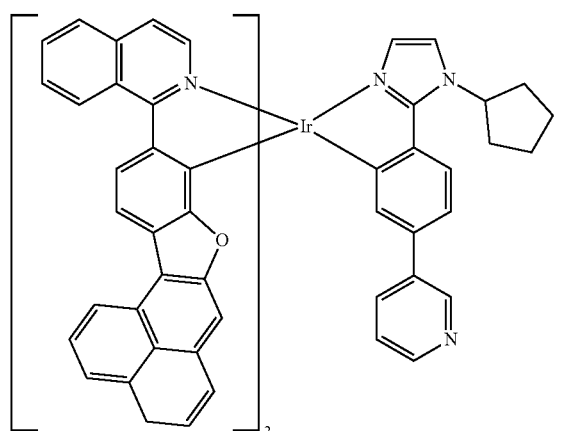
EX74
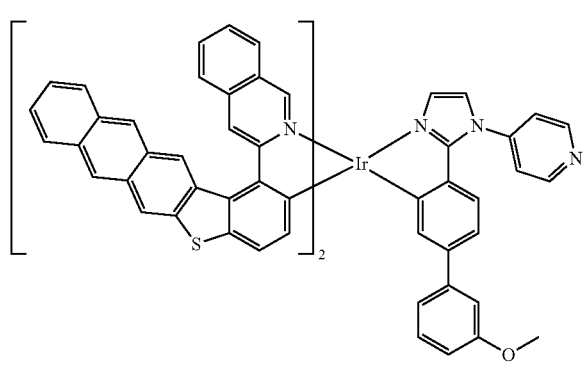
EX75
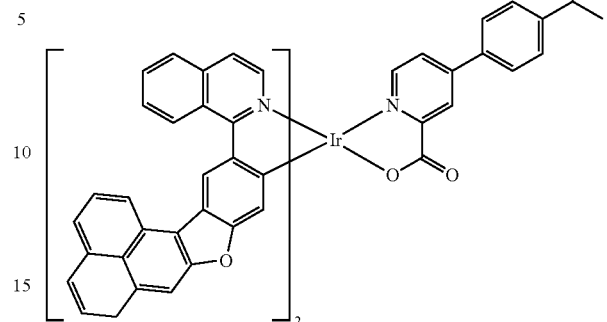
EX76
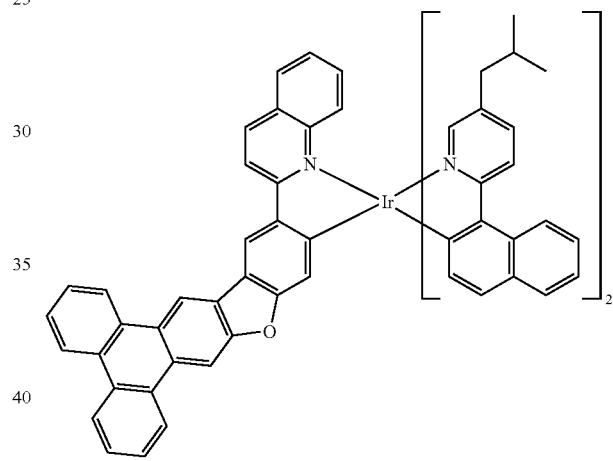
EX77
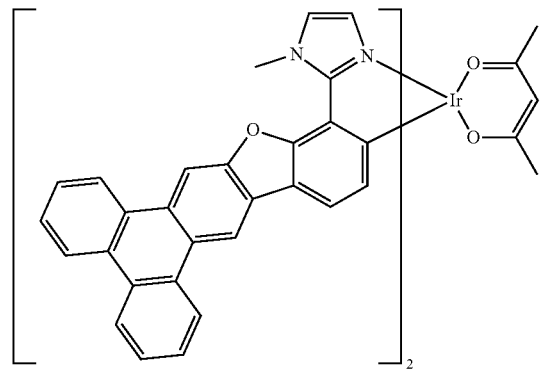

EX78
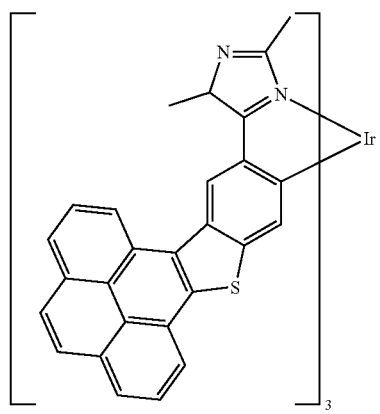
EX79
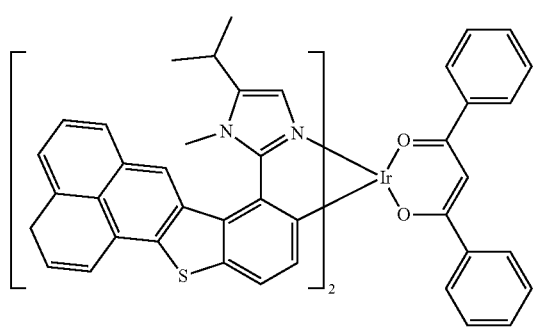
EX80
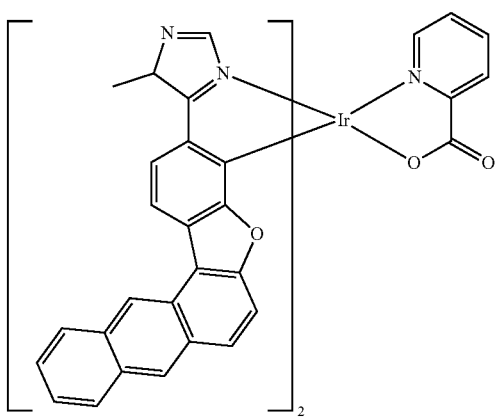
EX81
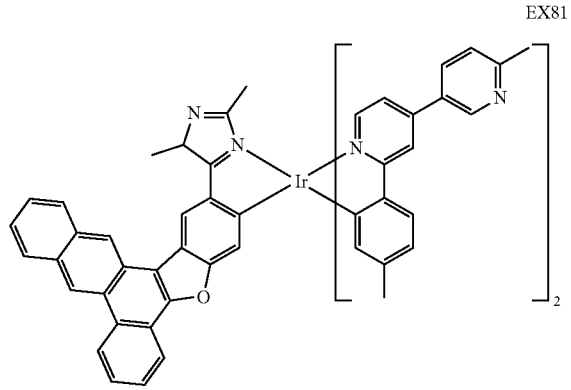
EX82
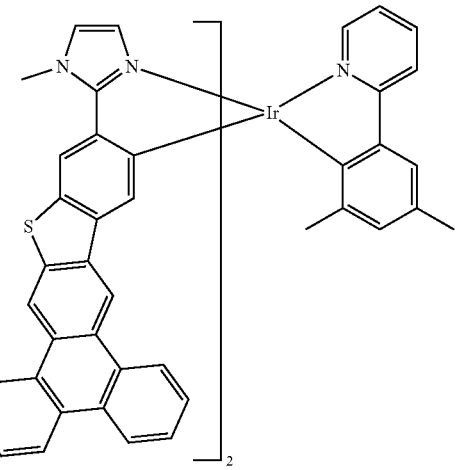
EX83
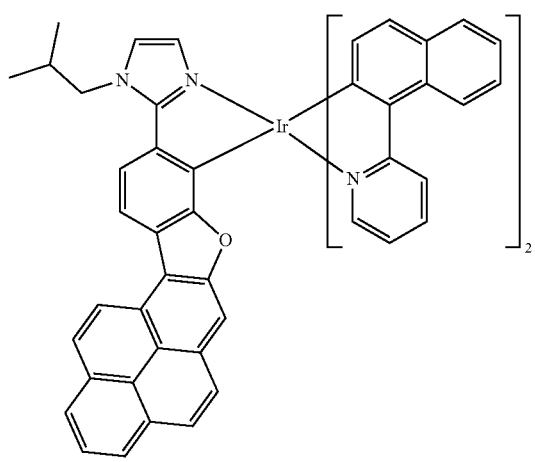
EX84
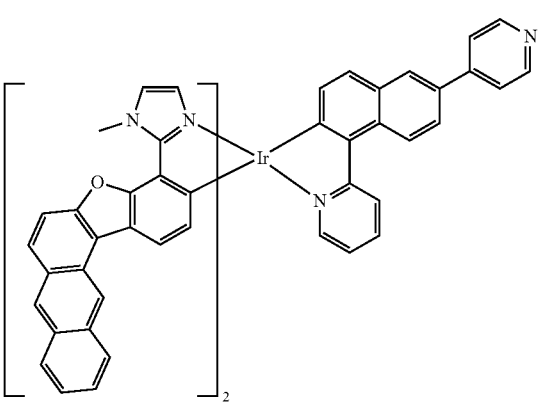

EX85
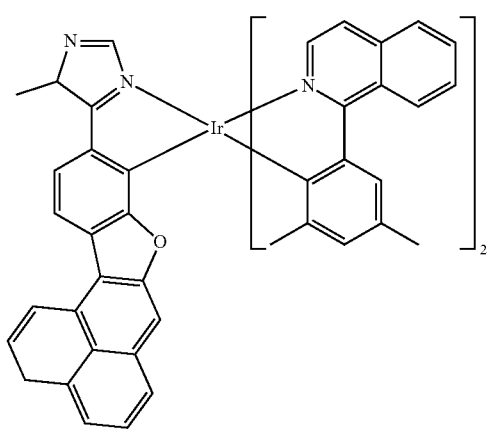
EX86
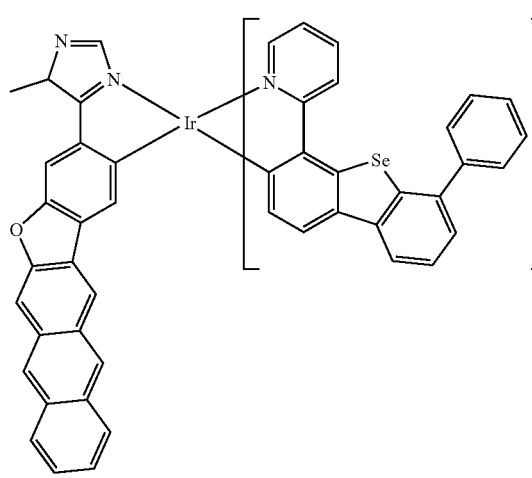
EX87
EX88
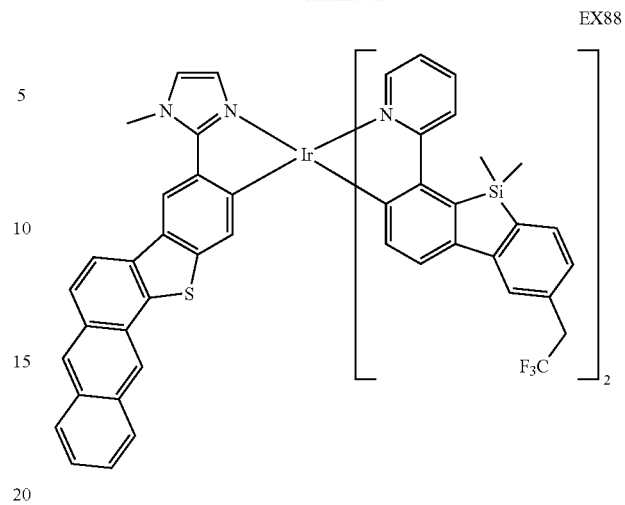
EX89
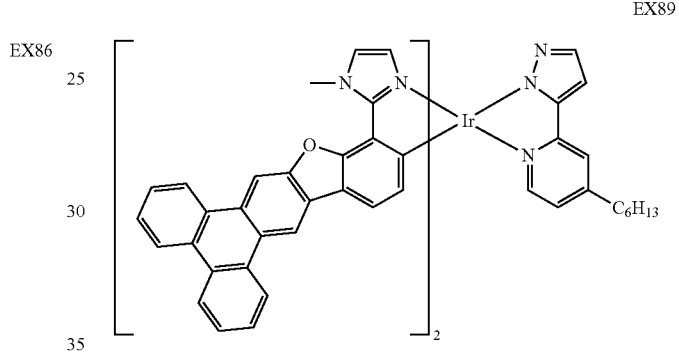
EX90
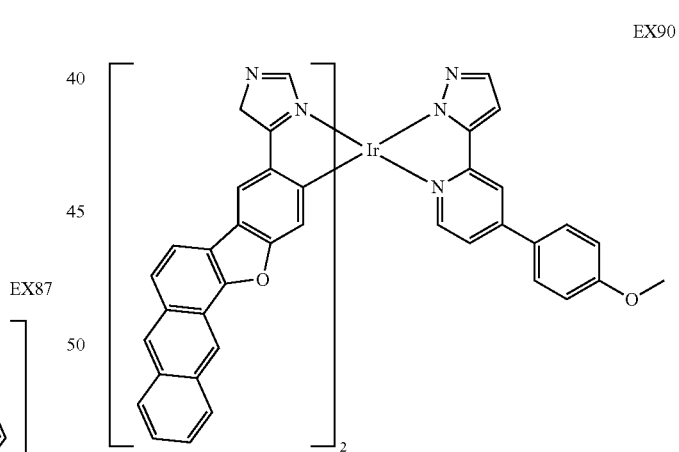
EX91
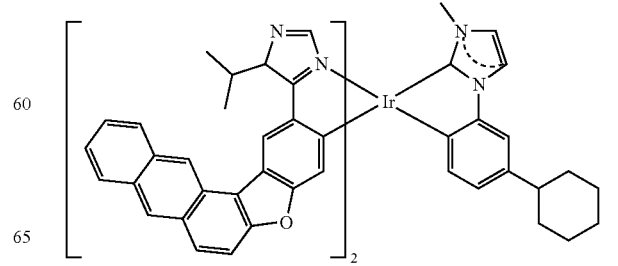

EX92
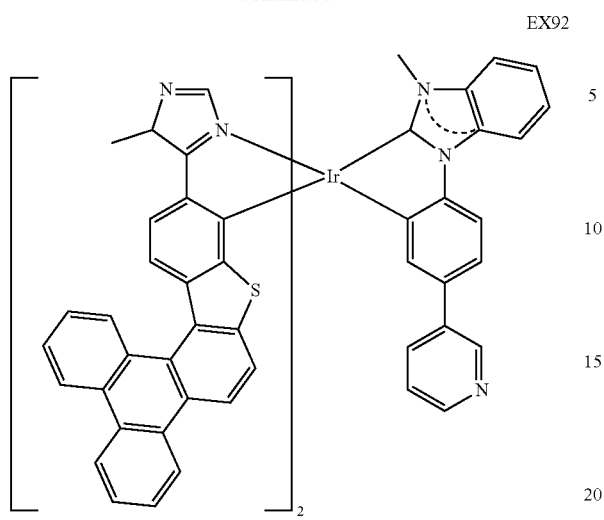
EX95
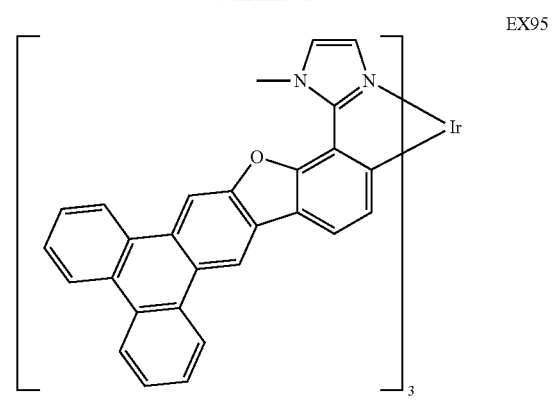
EX93
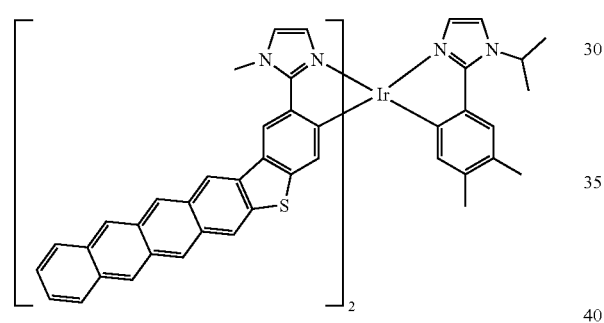
EX96
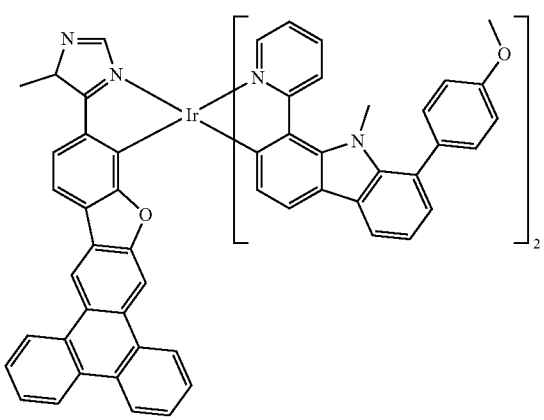
EX94
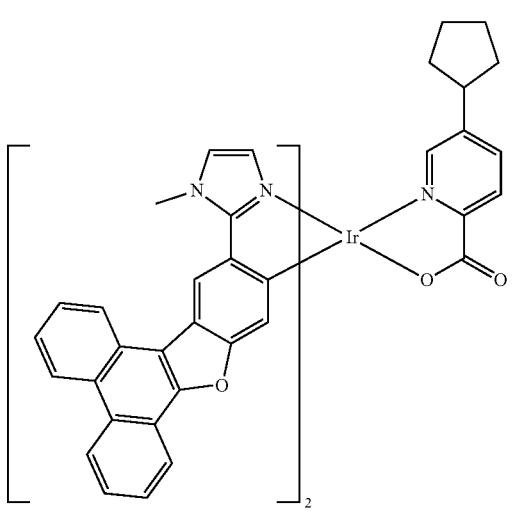
EX97
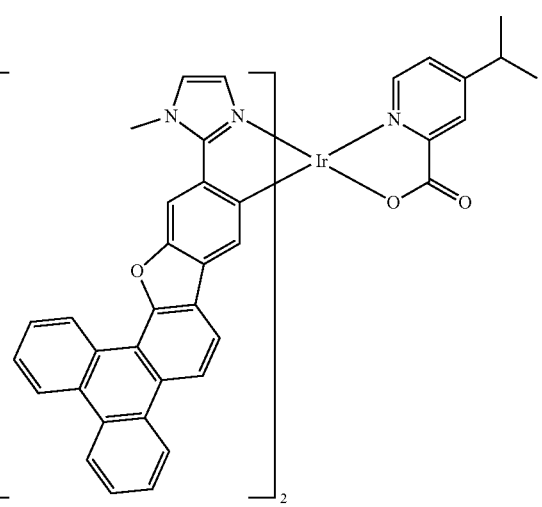

-continued
EX98
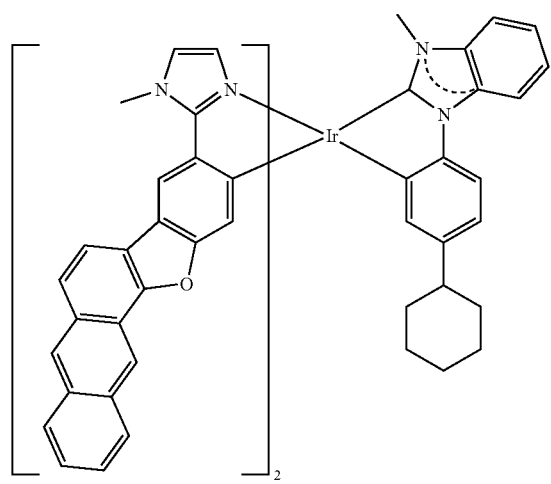
EX99
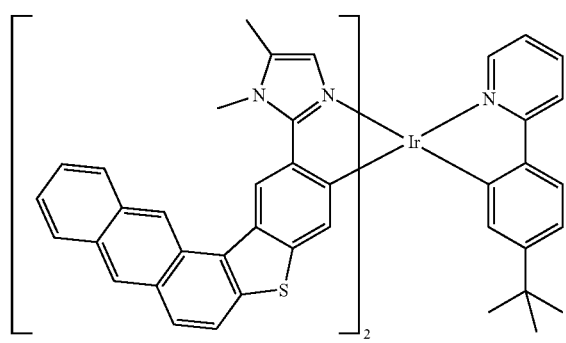
EX100
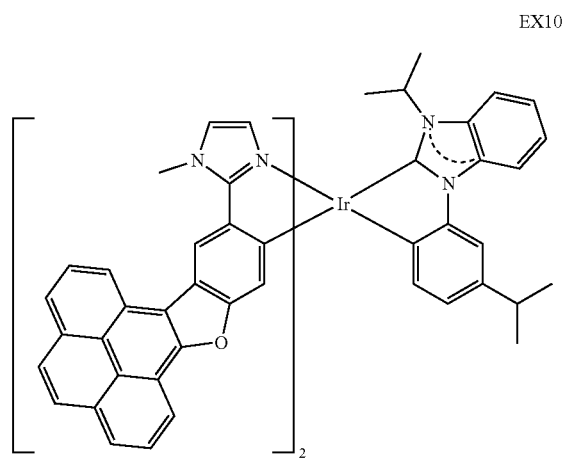
EX101
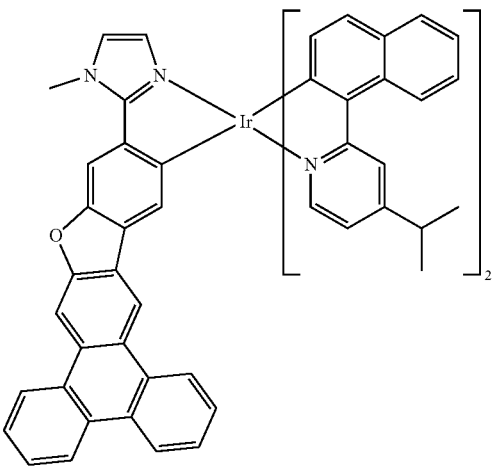
EX102
EX103
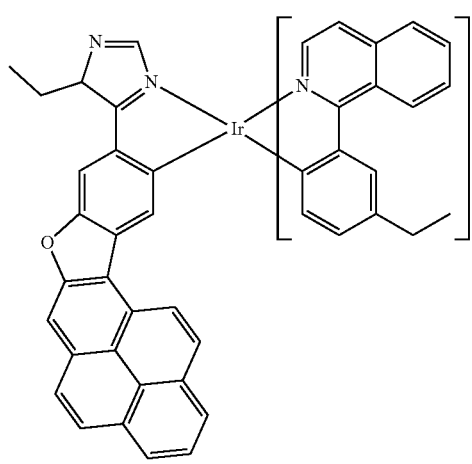
and -continued

EX104

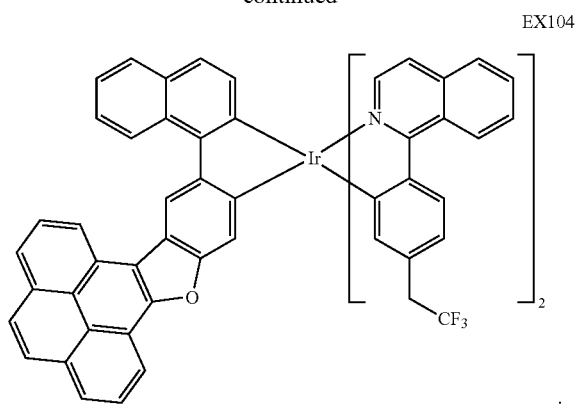

In another embodiment of the present invention, an organic EL device is disclosed. The organic EL device comprises a pair of electrodes consisting of a cathode and an anode, and a light emitting layer between the pair of electrodes. The light emitting layer comprises the iridium complex of formula (1). In particular, the iridium complex of formula (1) may be used as a phosphorescent dopant material. The dopant material may be for lowering a driving voltage, increasing a current efficiency or a half-life of the organic EL device.

In some embodiments, the light emitting layer emits a phosphorescence red, yellow, or green light. In yet another embodiment of the present invention, the organic electroluminescent device is a lighting panel. In a further embodiment of the present invention, the organic electroluminescent device is a backlight panel.

Detailed preparation of the iridium complex of the present invention will be clarified by exemplary embodiments below, but the present invention is not limited thereto. EXAMPLES 1 to 10 show the preparation of the iridium complex of the present invention, and EXAMPLE 11 shows the fabrication and the testing report of the organic EL devices.

Example 1

Synthesis of EX3
Synthesis of Intermediate A

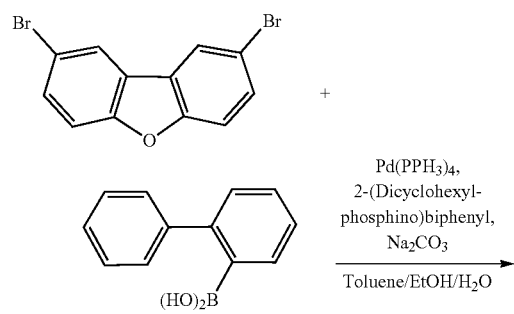

-continued

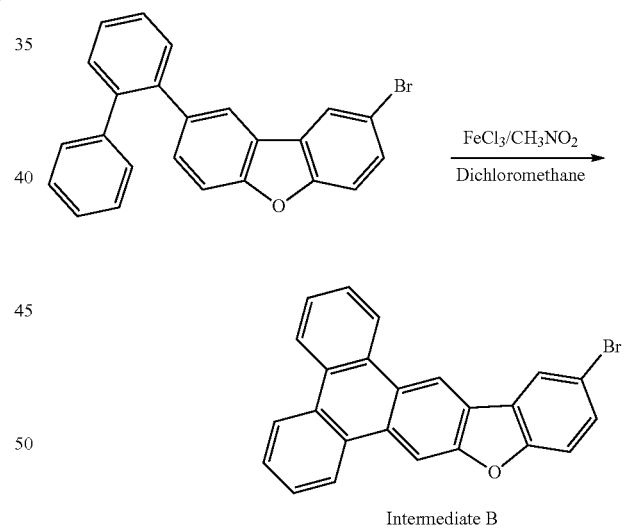

Intermediate A

A mixture of 2,8-dibromodibenzo[b,d]furan (20 g, 61.3 mmol), biphenyl-2-ylboronicacid (12.2 g, 61.3 mmol), sodium carbonate (13 g, 122.6 mmol), water (60 ml), ethanol (60 ml), and toluene (120 ml) was degassed by bubbling nitrogen gas for 15 minutes followed by addition of palladium tetrakis (1.4 g, 1.22 mmol) and 2-(dicyclohexylphosphino)biphenyl (0.9 g, 2.44 mmol). The mixture was heated to reflux overnight. Upon cooling to room temperature, the mixture was extracted with ethyl acetate (3 times) and washed with water. The organic layer was dried with anhydrous magnesium sulfate and evaporated under reduced pressure. The residue was purified by column chromatography on silica, yielding 10.9 g of Intermediate A as yellow solid (45%).

Synthesis of Intermediate B

A mixture of Intermediate A (30 g, 75.1 mmol) and dichlromethane (1500 ml) was cooled to −30° C. and followed by addition of iron chloride (60.9 g, 375.5 mmol) dissolving in nitromethane (75 ml). After the reaction was finished, the mixture quenched with methanol and washed with water. The organic layer was dried with anhydrous magnesium sulfate and evaporated under reduced pressure. The residue was purified by column chromatography on silica, yielding 9.8 g of Intermediate B as dark-green solid (33%).

Synthesis of Intermediate C

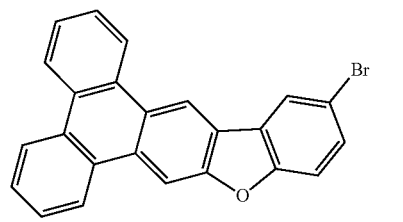

+

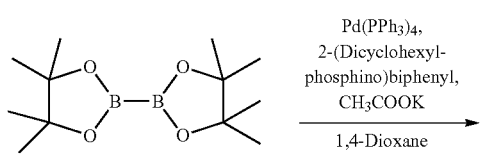

Pd(PPh₃)₄,
2-(Dicyclohexyl-
phosphino)biphenyl,
CH₃COOK
―――――――――――→
1,4-Dioxane

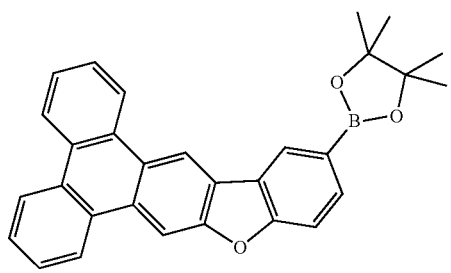

Intermediate C

A mixture of intermediate B (9.8 g, 24.6 mmol), bis(pinacolato)diboron (11.2 g, 44.4 mmol), potassium acetate (7.3 g, 73.8 mmol), and 1,4-dioxane (61 ml) was degassed by bubbling nitrogen gas for 15 minutes followed by addition of palladium tetrakis (0.6 g, 0.5 mmol) and 2-(dicyclohexylphosphino)biphenyl (0.4 g, 1 mmol). The mixture was heated to reflux for 4 hr. Upon cooling to room temperature, the mixture was filtered with Celite. The filtrate was evaporated under reduced pressure and added with ethyl acetate and hexane to obtain solid. The precipitated solid was filtered with suction, yielding 6.7 g of Intermediate C as pale yellow solid (62%).

Synthesis of Intermediate D

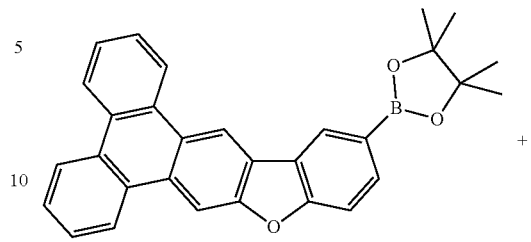

+

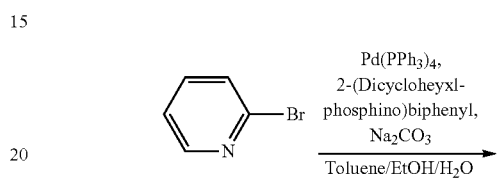

Pd(PPh₃)₄,
2-(Dicycloheyxl-
phosphino)biphenyl,
Na₂CO₃
―――――――――――→
Toluene/EtOH/H₂O

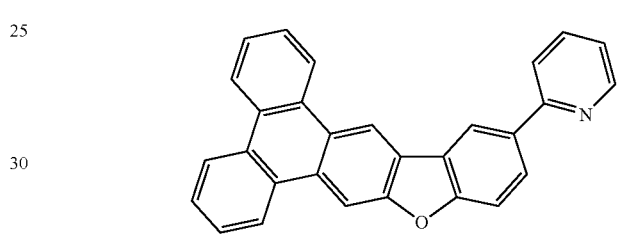

Intermediate D

A mixture of intermediate C (6.7 g, 15 mmol), 2-bromopyridine (2.8 g, 18 mmol), sodium carbonate (3.2 g, 30 mmol), water(15 ml), ethanol(15 ml), and toluene (30 ml) was degassed by bubbling nitrogen gas for 15 minutes followed by addition of palladium tetrakis (0.3 g, 0.3 mmol) and 2-(dicyclohexylphosphino)biphenyl (0.2 g, 0.6 mmol). The mixture was heated to reflux overnight. Upon the cooling to room temperature, the mixture was extracted with ethyl acetate (3 times) and washed with water. The organic layer was dried with anhydrous magnesium sulfate and evaporated under reduced pressure. The residue was purified by column chromatography on silica, yielding 3.7 g of Intermediate D as yellow solid (62%).

Synthesis of Intermediate E

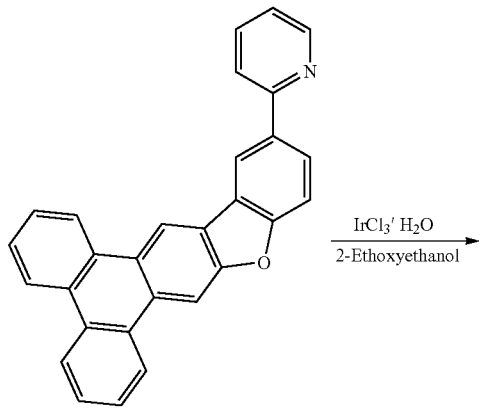

IrCl₃·H₂O
―――――――→
2-Ethoxyethanol

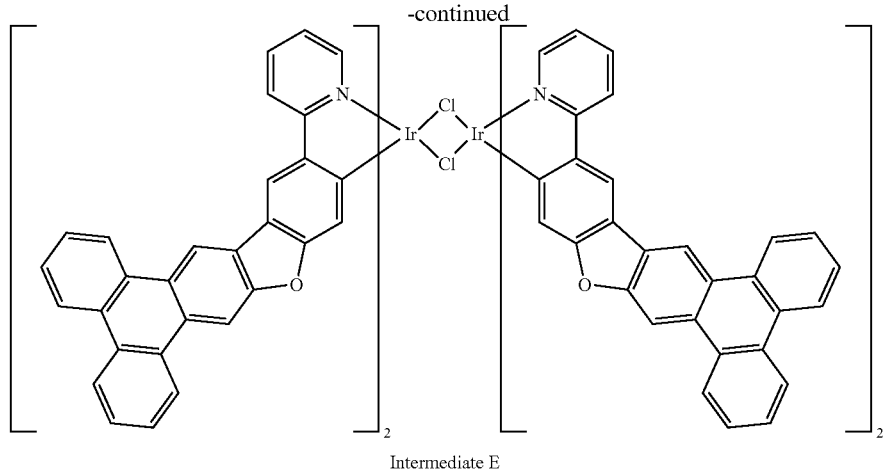

Intermediate E

A mixture of intermediate D (2 g, 5.1 mmol), 2-ethxoyethanol (5 ml) and water (15 ml) was degassed by bubbling nitrogen for 15 minutes and followed by addition of Iridium (III) chloride hydrate (4.1 g, 11.3 mmol). The mixture was heated to reflux overnight. After the reaction was finished, the mixture was cooled to room temperature and filtered. The solid was washed with water and methanol, yielding 1.2 g of brown powder (49%).

Synthesis of EX3

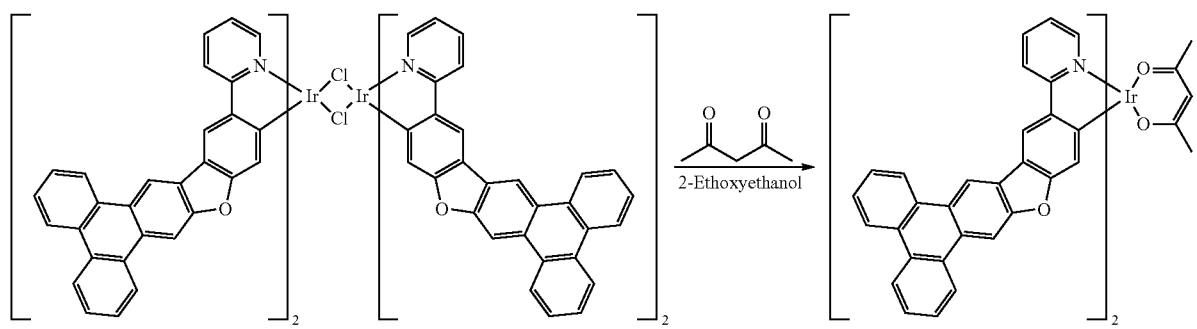

A mixture Intermediate E (2.4 g, 1.2 mmol), acetylacetone (1.2 g, 12.0 mmol), sodium carbonate (1.2 g, 12.0 mmol), and 2-Ethoxyethanol (12 ml) was degassed was degassed by bubbling nitrogen for 15 minutes and then heated at 120° C. overnight under nitrogen. After the reaction finished, the mixture was allowed to cool to room temperature, filtered with suction, washed with water and methanol. The product was filtered off with suction, yielding 1.4 g of red solid as EX3 (56%). MS (m/z, EI$^+$):1080.2

Example 2

Synthesis of EX8

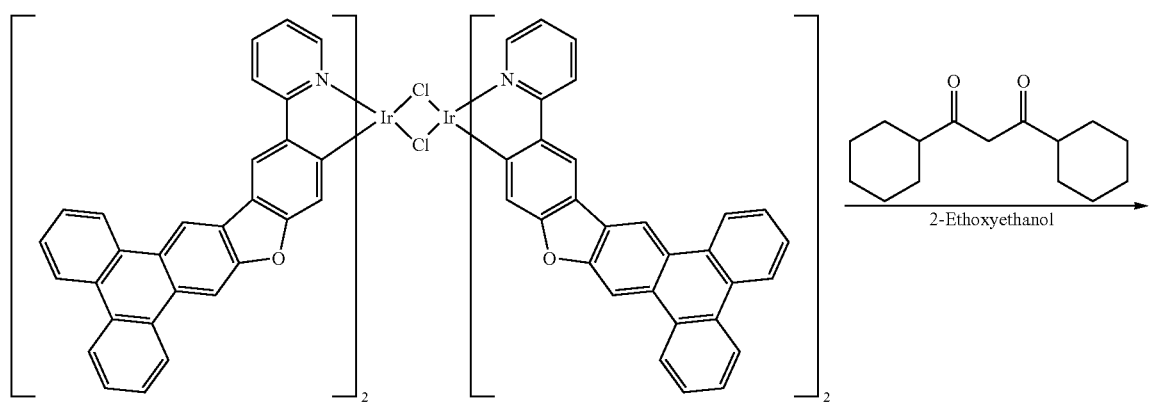

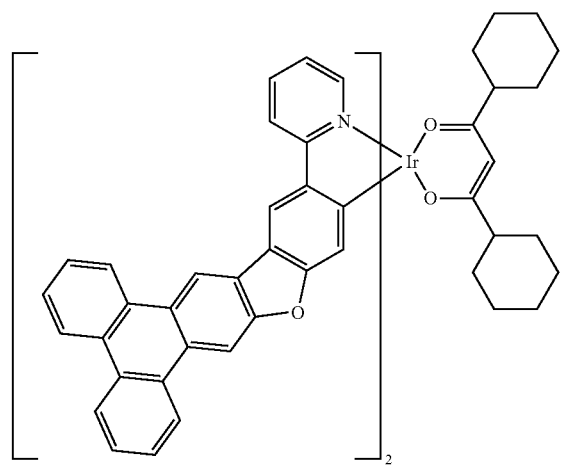

A mixture Intermediate E (5.4 g, 2.7 mmol), 1,3-dicyclohexylpropane-1,3-dione (6.5 g, 27.6 mmol), sodium carbonate (3 g, 28.3 mmol) and 2-ethoxyethanol (28 ml) was degassed by bubbling nitrogen for 15 minutes and then heated to reflux overnight. After the reaction finished, the mixture was allowed to cool to room temperature, filtered with suction, washed with water and methanol. The product was filtered off with suction, yielding 3.3 g of EX8 as red solid (51%). MS (m/z, EI$^+$):1215.4

45

Example 3

Synthesis of EX22

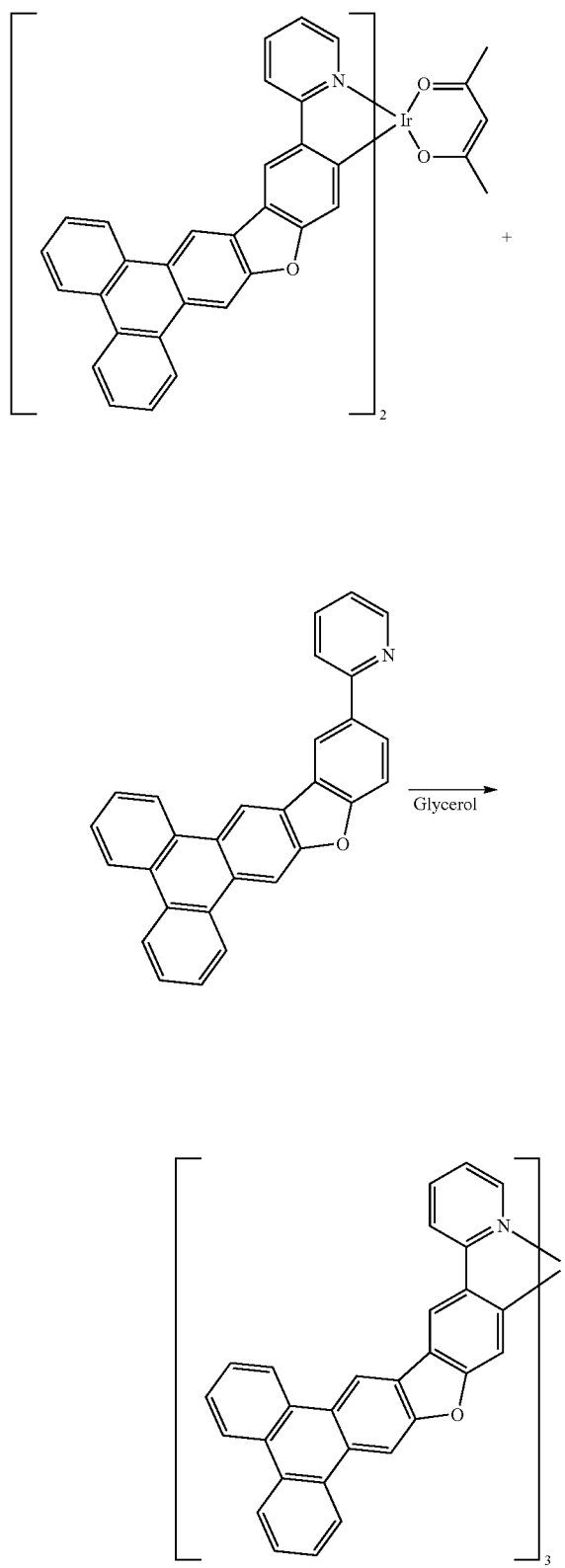

46

A mixture of EX3 (4.9 g, 4.6 mmol), Intermediate D (5.5 g, 13.8 mmol), and glycerol (250 ml) was by bubbling nitrogen for 15 minutes and then heated at 200° C. overnight under nitrogen. After the reaction finished, the mixture was allowed to cool to room temperature. Afterwards, water (500 ml) was added and stirred for 1 hr, and then the precipitated product was filtered off with suction. The residue was purified by column chromatography on silica, yielding 3.3 g of dark-red solid as EX22 (52%). MS (m/z, EI$^+$):1376.5

Example 4

Synthesis of EX25
Synthesis of Intermediate F

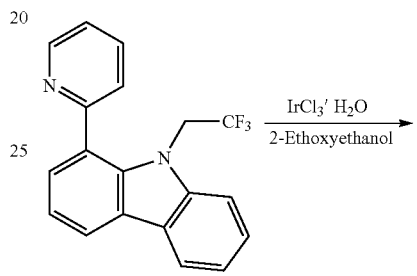

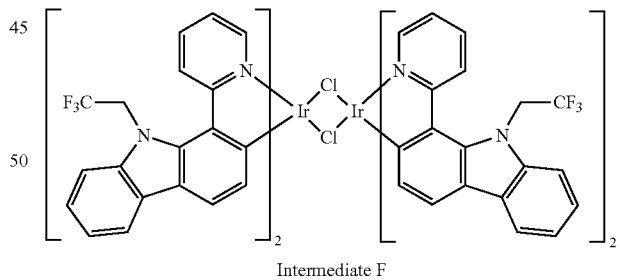

Intermediate F

A mixture of 2-ethxoyethanol (10 ml), water (30 ml) and 1-(pyridin-2-yl)-9-(2,2,2-trifluoroethyl)-9H-carbazole (3.3 g, 10.2 mmol) was degassed by bubbling nitrogen for 15 minutes and followed by addition of Iridium(III) chloride hydrate (8.2 g, 22.6 mmol). The mixture was heated to reflux overnight. After the reaction was finished, the mixture was cooled to room temperature and filtered. The solid was washed with water and methanol, yielding 2.7 g of yellow powder (62%)

Synthesis of Intermediate G

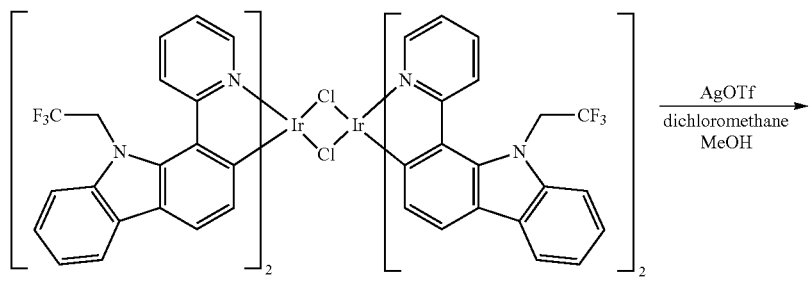

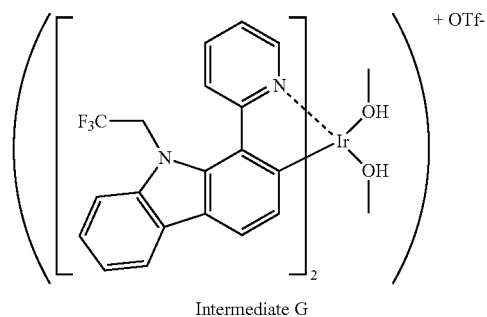

Intermediate G

A mixture of Intermediate F (15.9 g, 9.1 mmol), silver triflate (5.3 g, 20.9 mmol), dichloromethane (460 ml) and methanol (25 ml) was placed under nitrogen and stirred at room temperature overnight. After the reaction finished, the silver chloride was filtered with Celite and the filtrate was evaporated to obtain 13.4 g of iridium triflate precursor without further purification.

Synthesis of EX25

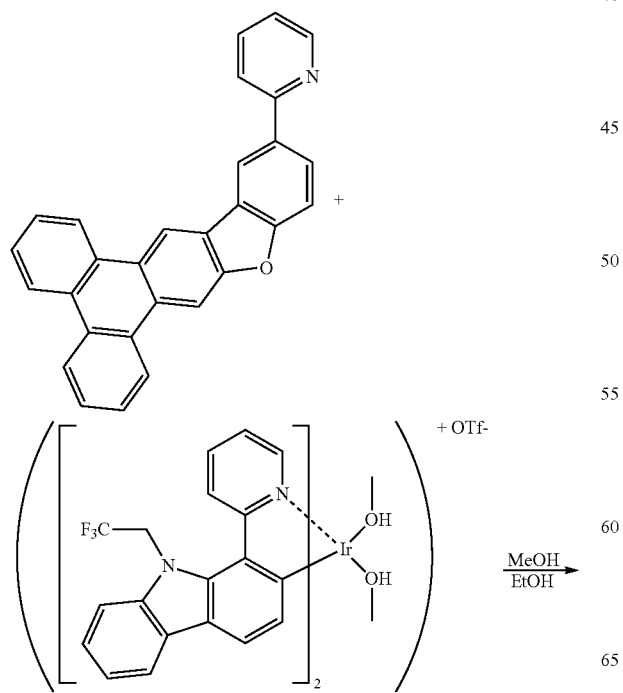

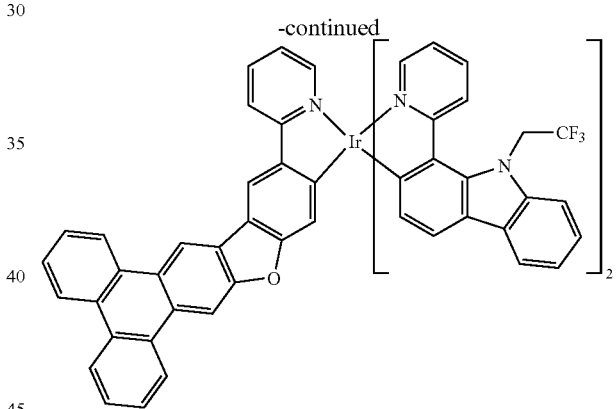

A mixture of Intermediate D (5.9 g, 15 mmol), Intermediate G (5.2 g, 5 mmol), EtOH (90 ml) and MeOH (90 ml) was placed under nitrogen, and then heated to reflux overnight. After the reaction finished, the mixture was allowed to cool to room temperature. The red precipitate formed was filtered with suction, washed with ethanol and hexane, and then purified by vacuum sublimation to give 3.1 g of yellow product as EX25 (51%). MS (m/z, EI$^+$):1236.31

Example 5

Synthesis of EX48
Synthesis of Intermediate H

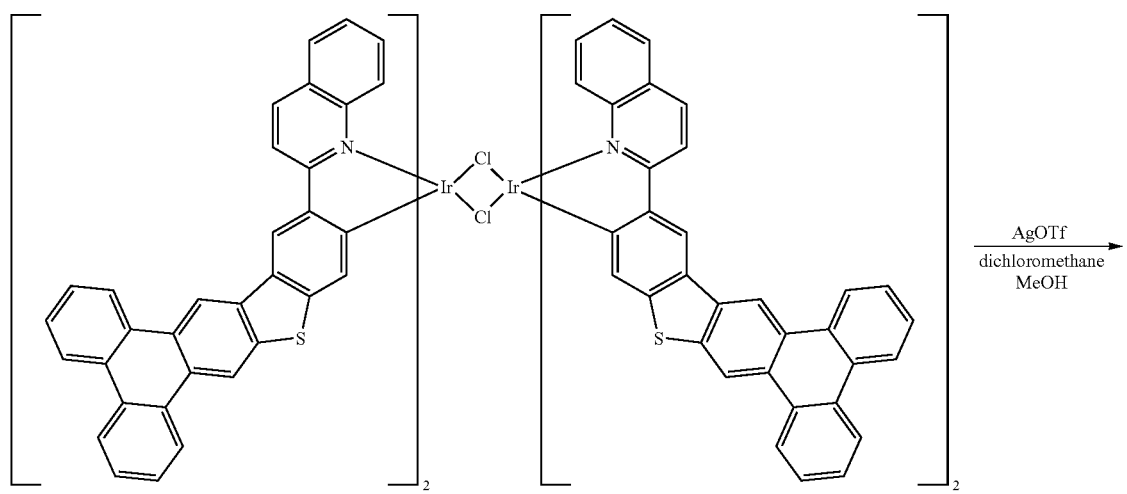

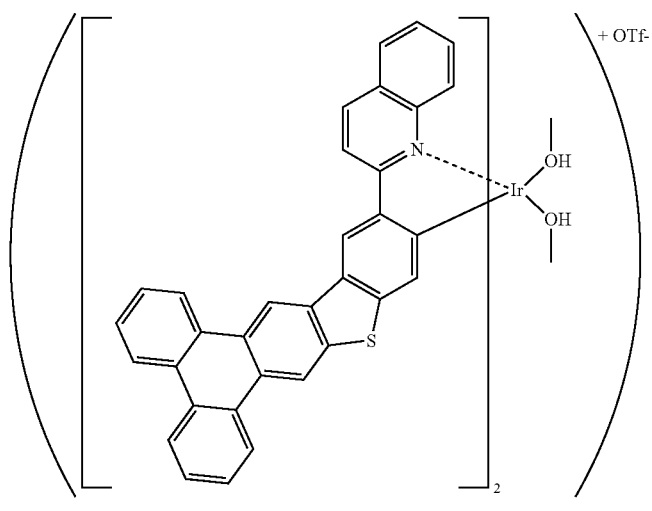

Intermediate N

A mixture of Intermediate E (18.5 g, 9.1 mmol), silver triflate (5.3 g, 20.9 mmol), dichloromethane (460 ml) and methanol (25 ml) was placed under nitrogen and stirred at room temperature overnight. After the reaction finished, the silver chloride was filtered with Celite and the filtrate was evaporated to obtain 20 g of iridium triflate precursor without further purification.

Synthesis of EX48

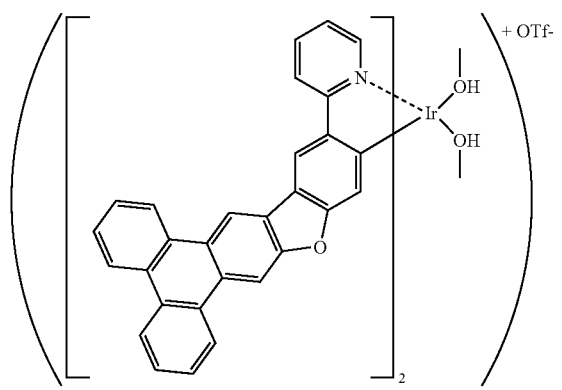

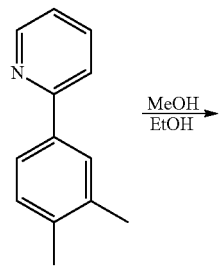

$\xrightarrow{\text{MeOH} \atop \text{EtOH}}$

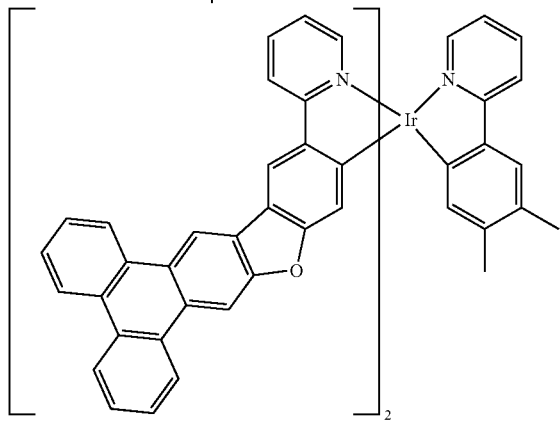

A mixture of Intermediate H (5 g, 4.1 mmol), 2-(3,4-dimethylphenyl)pyridine (2.3 g, 12.5 mmol), EtOH (75 ml) and MeOH (75 ml) was placed under nitrogen, and then heated to reflux overnight. After the reaction finished, the mixture was allowed to cool to room temperature. The red precipitate formed was filtered with suction, washed with ethanol and hexane, and then purified by vacuum sublimation to give 2.3 g of red product as EX48 (49%). MS (m/z, EI$^+$):1162.2

Example 6

Synthesis of EX54
Synthesis of Intermediate I

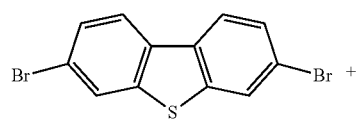

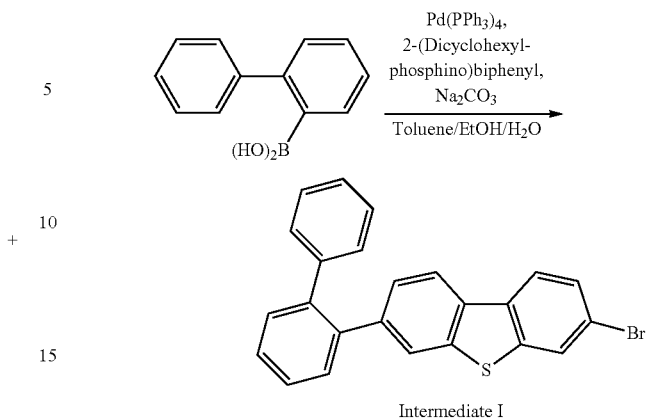

A mixture of 3,7-dibromodibenzo[b,d]thiophene (20.9 g, 61.3 mmol), biphenyl-2-ylboronic acid (12.2 g, 61.3 mmol), sodium carbonate (13 g, 122.6 mmol), water(60 ml), ethanol (60 ml) and toluene (120 ml) was degassed by bubbling nitrogen gas for 15 minutes followed by addition of palladium tetrakis (1.4 g, 1.22 mmol) and 2-(dicyclohexylphosphino)biphenyl (0.9 g, 2.44 mmol). The mixture was heated to reflux overnight. Upon cooling to room temperature, the mixture was extracted with ethyl acetate (3 times) and washed with water. The organic layer was dried with anhydrous magnesium sulfate and evaporated under reduced pressure. The residue was purified by column chromatography on silica, yielding 12.4 g of yellow solid (43%).

Synthesis of Intermediate J

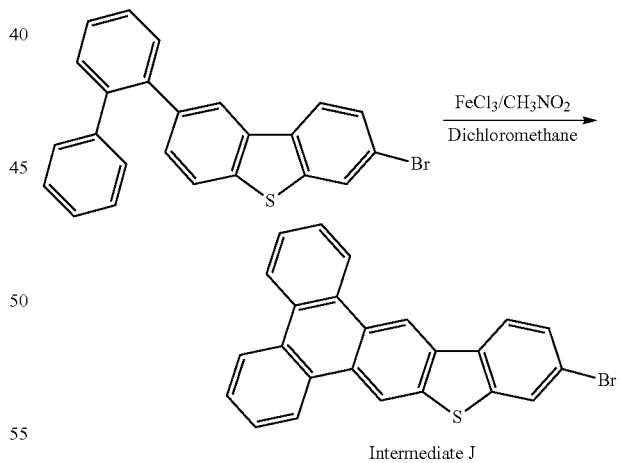

A mixture of Intermediate I (12.4 g, 26.3 mmol) and dichloromethane (525 ml) was cooled to −30° C. and followed by addition of iron chloride (21.3 g, 131.5 mmol) dissolving in nitromethane (26 ml). After the reaction was finished, the mixture quenched with methanol and washed with water. The organic layer was dried with anhydrous magnesium sulfate and evaporated under reduced pressure. The residue was purified by column chromatography on silica, yielding 3.1 g of dark-green solid (29%).

Synthesis of Intermediate K

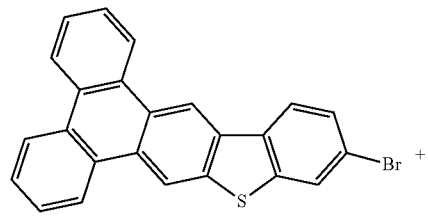

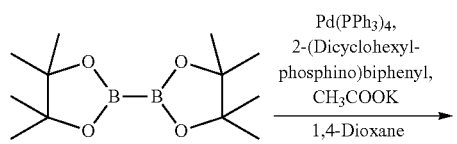

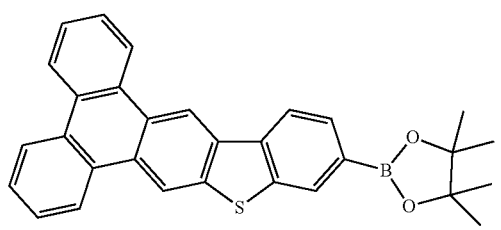

Intermediate K

A mixture of Intermediate J (3.1 g, 7.5 mmol), bis(pinacolato)diboron (3.4 g, 13.5 mmol), potassium acetate (2.2 g, 22.5 mmol), and 1,4-dioxane (18 ml) was degassed by bubbling nitrogen gas for 15 minutes followed by addition of palladium tetrakis (0.3 g, 0.3 mmol) and 2-(dicyclohexylphosphino)biphenyl (0.05 g, 0.15 mmol). The mixture was heated to reflux for 4 hr. Upon cooling to room temperature, the mixture was filtered with Celite. The filtrate was evaporated under reduced pressure and added with ethyl acetate and hexane to obtain solid. The precipitated solid was filtered with suction, yielding 2 g of pale yellow solid (59%).

Synthesis of Intermediate L

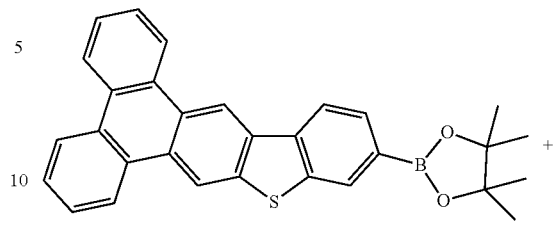

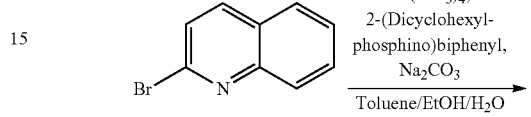

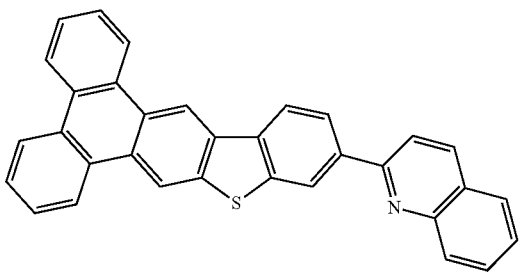

Intermediate L

A mixture of intermediate K (4 g, 8.8 mmol), 2-bromoquinoline (2.1 g, 10.5 mmol), sodium carbonate (1.8 g, 17.6 mmol), water (8 ml), ethanol(8 ml), and toluene (16 ml) was degassed by bubbling nitrogen gas for 15 minutes followed by addition of palladium tetrakis (0.2 g, 0.17 mmol) and 2-(dicyclohexylphosphino)biphenyl (0.1 g, 0.34 mmol). The mixture was heated to reflux overnight. Upon the cooling to room temperature, the mixture was extracted with ethyl acetate (3 times) and washed with water. The organic layer was dried with anhydrous magnesium sulfate and evaporated under reduced pressure. The residue was purified by column chromatography on silica, yielding 2.4 g of yellow solid (59%)

Synthesis of Intermediate M

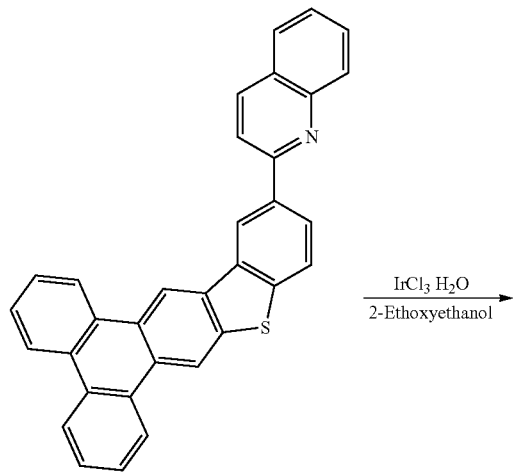

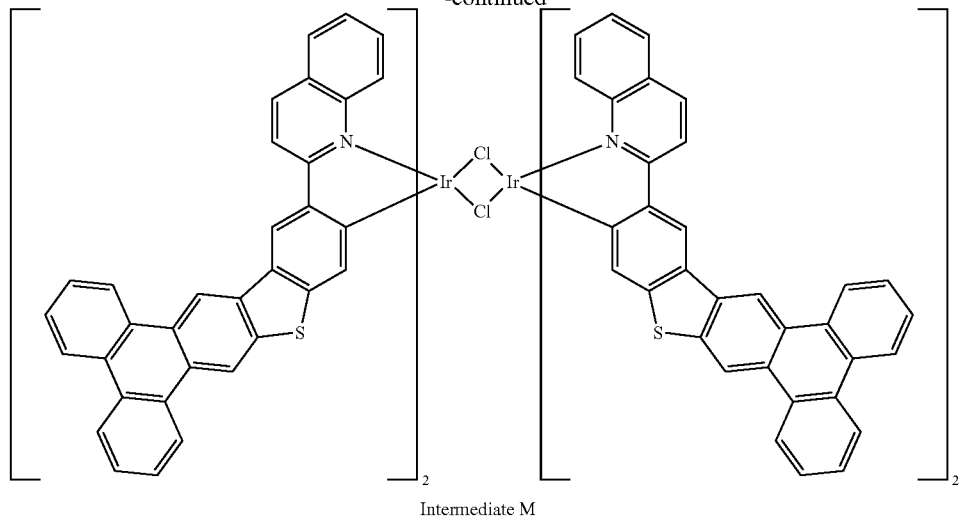

Intermediate M

A mixture of intermediate L (2.3 g, 5.1 mmol), 2-ethxoy-ethanol (5 ml) and water (15 ml) was degassed by bubbling nitrogen for 15 minutes and followed by addition of Iridium (III) chloride hydrate (4.1 g, 11.3 mmol). The mixture was heated to reflux overnight. After the reaction was finished, the mixture was cooled to room temperature and filtered. The solid was washed with water and methanol, yielding 1.3 g of brown powder (47%).

Synthesis of Intermediate N

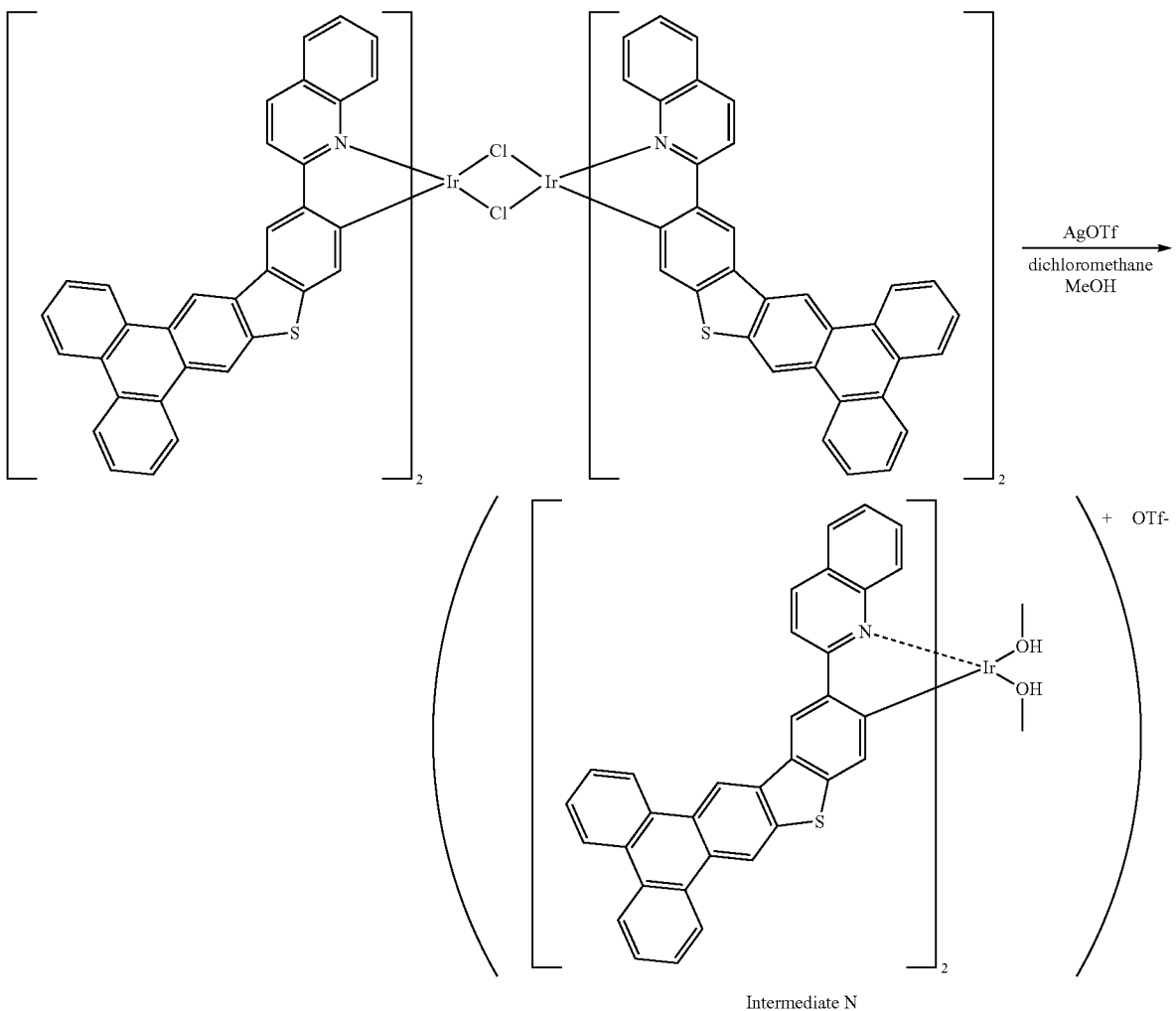

Intermediate N

A mixture of Intermediate M (20.8 g, 9.1 mmol), silver triflate (5.3 g, 20.9 mmol), dichloromethane (460 ml) and methanol (25 ml) was placed under nitrogen and stirred at room temperature overnight. After the reaction finished, the silver chloride was filtered with Celite and the filtrate was evaporated to obtain 15 g of iridium triflate precursor without further purification.

Synthesis of EX54

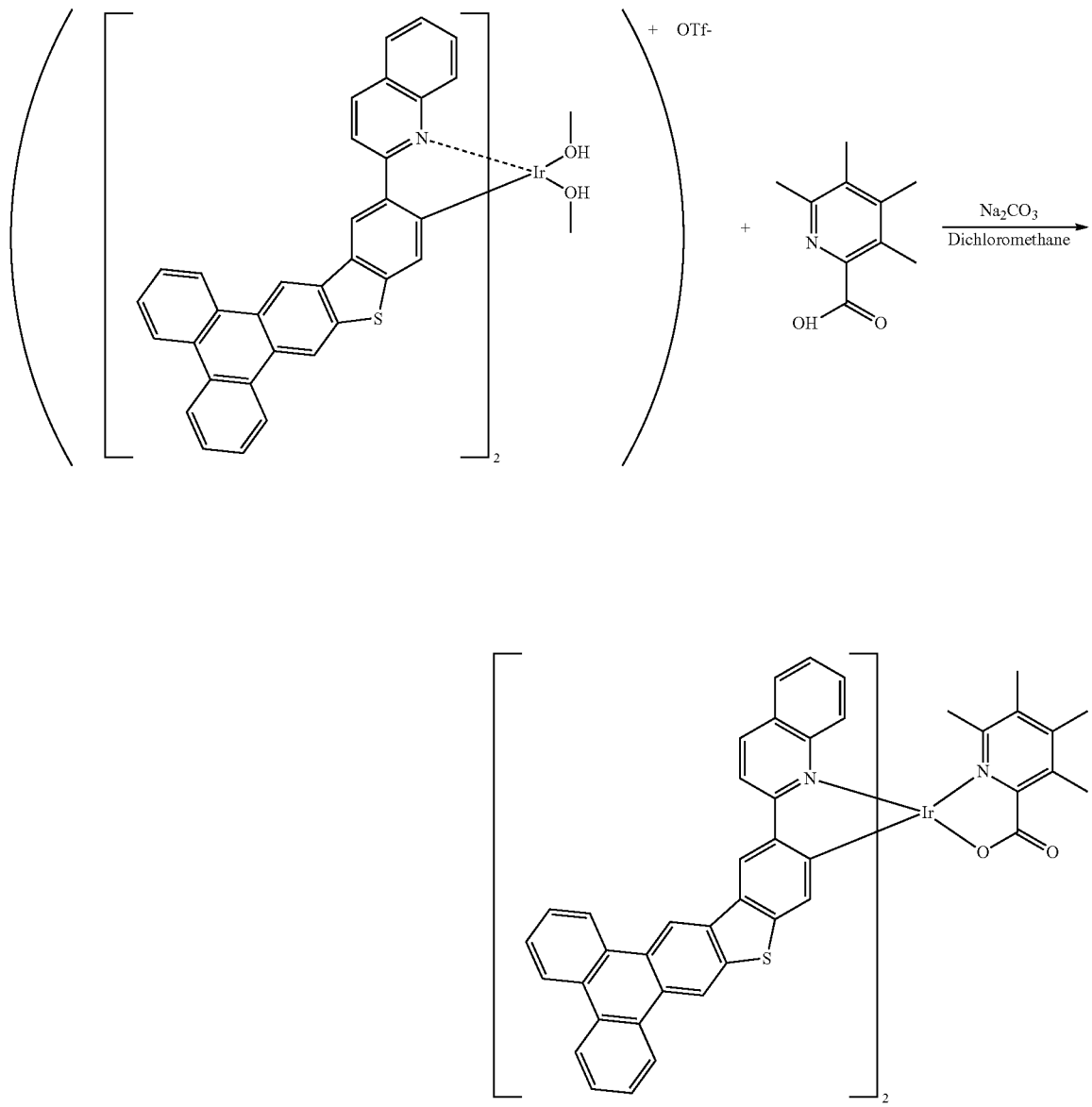

A mixture of Intermediate N (7.5 g, 5.7 mmol), 3,4,5,6-Tetramethylpicolinic acid (2.8 g, 15.7 mmol), sodium carbonate (2.4 g, 22.8 mmol), and dry dichloromethane (200 ml) was placed under nitrogen and heated to reflux for 48 hours. After the reaction finished, the mixture was allowed to cool to room temperature. The solution was extracted with dichloromethane and water. The organic layer was dried with anhydrous magnesium sulfate and evaporated under reduced pressure. The residue was purified by column chromatography on silica, yielding 4.5 g of yellow-orange solid as EX54 (61%). MS (m/z, EI$^+$):1290.63

Example 6

Synthesis of EX71

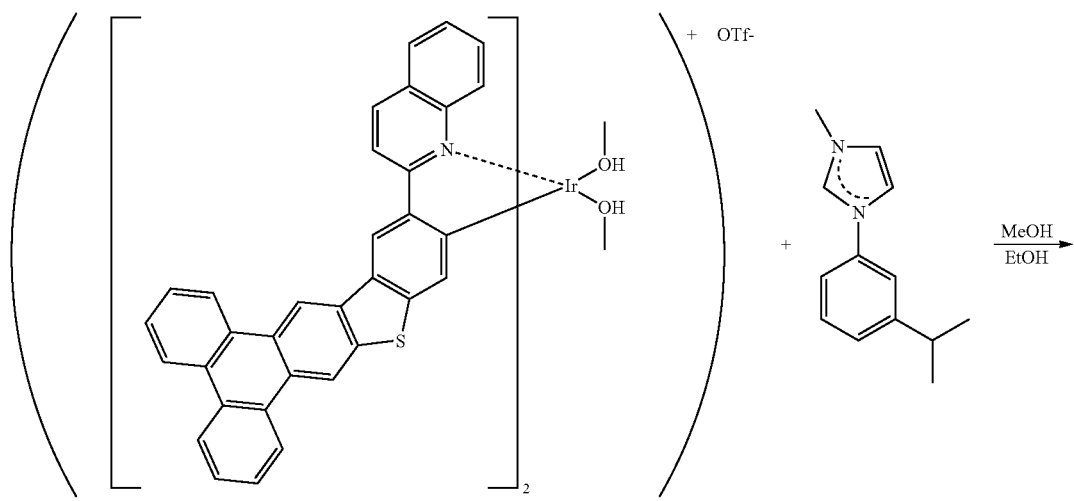

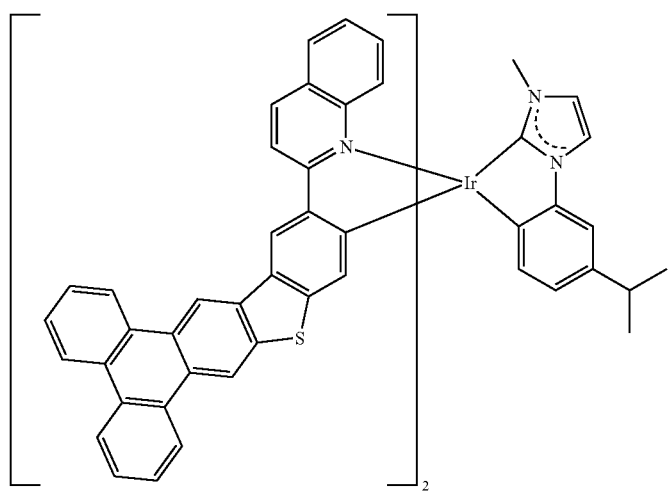

A mixture of Intermediate N (8.2 g, 6.2 mmol), 1-(3-isopropylphenyl)-3-methyl-2,3-dihydro-1H-imidazole (3.7 g, 18.6 mmol), EtOH (60 ml) and MeOH (60 ml) was placed under nitrogen, and then heated to reflux overnight. After the reaction was finished, the mixture was allowed to cool to room temperature. The red precipitate formed was filtered under vacuum, washed with ethanol and hexane, and then purified by vacuum sublimation to give 3.8 g of red solid as EX71(55%). MS (m/z, EI$^+$):1120.46

Example 7

Synthesis of EX76
Synthesis of Intermediate O

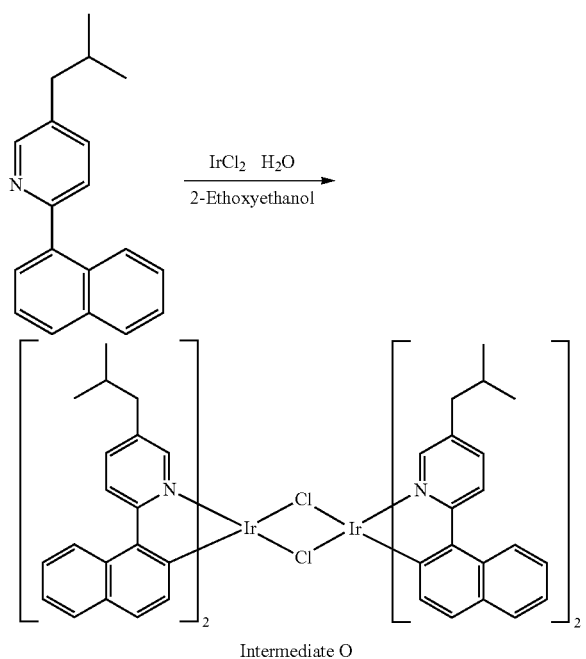

Intermediate O

A mixture of 5-isobutyl-2-(naphthalen-1-yl)pyridine (1.3 g, 5.1 mmol), 2-ethxoyethanol (5 ml) and water (15 ml) was degassed by bubbling nitrogen for 15 minutes and followed by addition of Iridium(III) chloride hydrate (4.1 g, 11.3 mmol). The mixture was heated to reflux overnight. After the reaction was finished, the mixture was cooled to room temperature and filtered. The solid was washed with water and methanol, yielding 1 g of yellow powder (53%)

Synthesis of Intermediate P

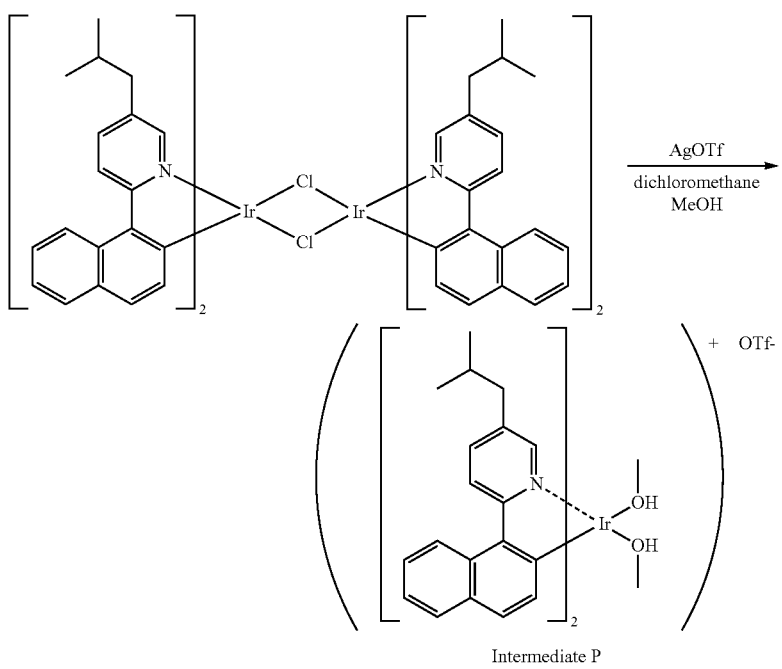

Intermediate P

A mixture of Intermediate O (13.6 g, 9.1 mmol), silver triflate (5.3 g, 20.9 mmol), dichloromethane (460 ml) and methanol (25 ml) was placed under nitrogen and stirred at room temperature overnight. After the reaction finished, the silver chloride was filtered with Celite and the filtrate was evaporated to obtain 13.1 g of iridium triflate precursor without further purification.

Synthesis of EX76

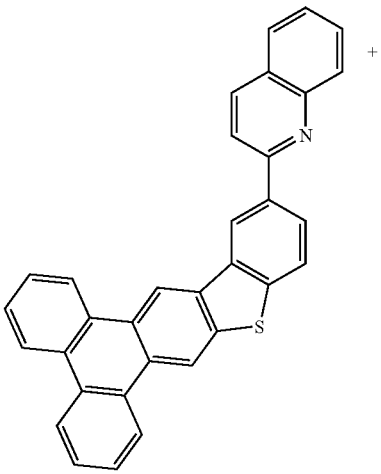

-continued

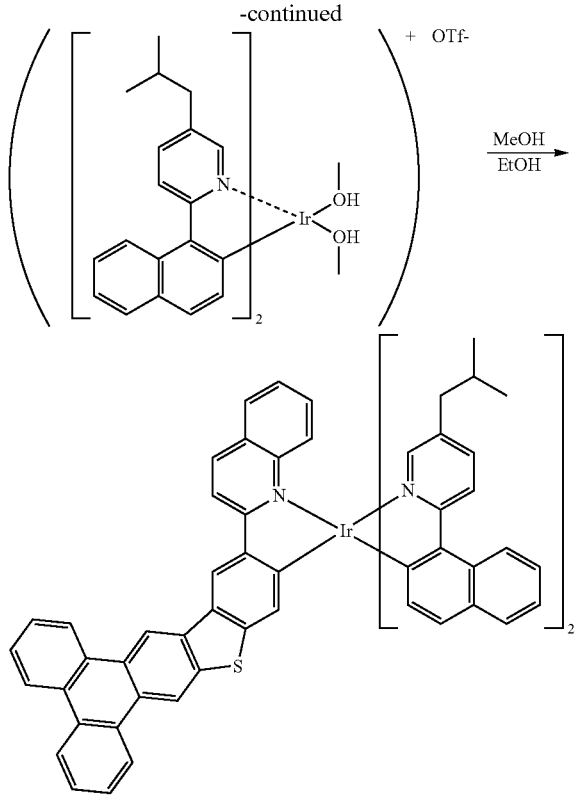

A mixture of Intermediate L (5.7 g, 12.5 mmol), Intermediate P (3.7 g, 4.1 mmol), EtOH (75 ml) and MeOH (7 5 ml) was placed under nitrogen, and then heated to reflux overnight. After the reaction finished, the mixture was allowed to cool to room temperature. The red precipitate formed was filtered with suction, washed with ethanol and hexane, and then purified by vacuum sublimation to give 2.1 g of yellow product as EX76 (45%). MS (m/z, EI⁺):1172.52

Example 8

Synthesis of EX77
Synthesis of Intermediate Q

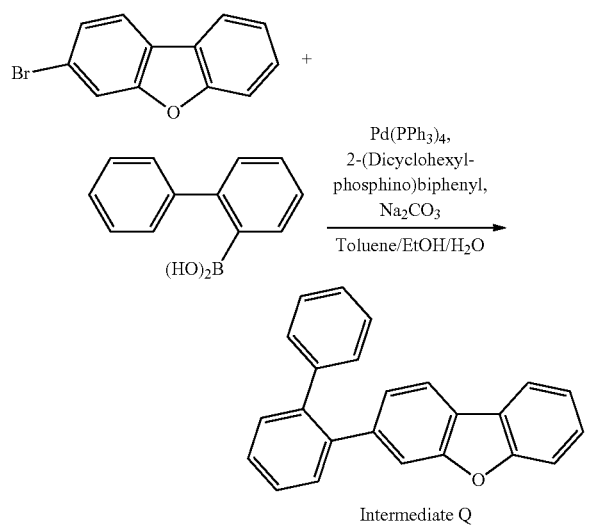

A mixture of 3-bromodibenzo[b,d]furan (20 g, 80.9 mmol), biphenyl-2-ylboronic acid (16 g, 80.9 mmol), sodium carbonate (17.1 g, 161.8 mmol), water (80 ml), ethanol (80 ml) and toluene (160 ml) was degassed by bubbling nitrogen gas for 15 minutes followed by addition of palladium tetrakis (1.8 g, 1.61 mmol) and 2-(dicyclohexylphosphino)biphenyl (1.1 g, 3.22 mmol). The mixture was heated to reflux overnight. Upon cooling to room temperature, the mixture was extracted with ethyl acetate (3 times) and washed with water. The organic layer was dried with anhydrous magnesium sulfate and evaporated under reduced pressure. The residue was purified by column chromatography on silica, yielding 19.6 g of yellow solid (76%)

Synthesis of Intermediate R

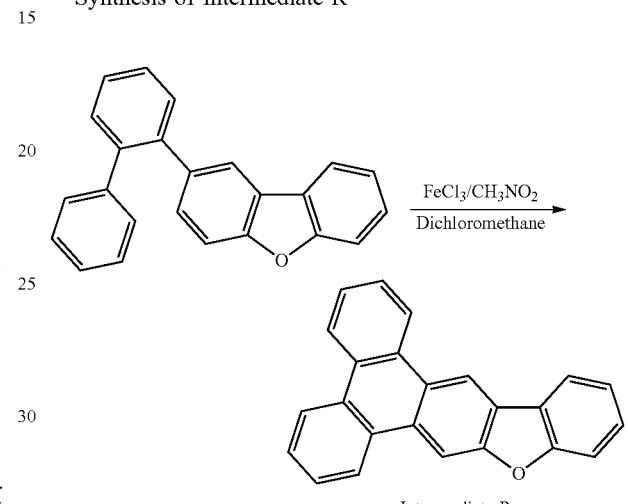

A mixture of Intermediate Q (8 g, 25 mmol) and dichloromethane (50 0 ml) was cooled to –30° C. and followed by addition of iron chloride (20.2 g, 125 mmol) dissolving in nitromethane (25 ml). After the reaction was finished, the mixture quenched with methanol and washed with water. The organic layer was dried with anhydrous magnesium sulfate and evaporated under reduced pressure. The residue was purified by column chromatography on silica, yielding 2.4 g of dark-green solid (35%)

Synthesis of Intermediate S

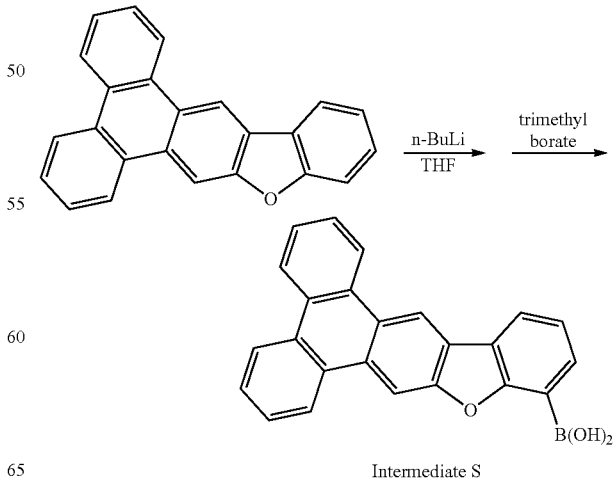

A mixture of Intermediate R (15 g, 47.1 mmol) and dry THF (150 ml) was cooled to −78° C. and followed by addition of 1.6 M n-BuLi (44.1 ml, 70.6 mmol) dropwise slowly. After addition was completed, the mixture kept stirring at −78° C. for 1 hr and followed by addition of trimethyl borate (8.3 g, 79.9 mmol) dropwise then heated to room temperature stir overnight. Upon the completion of reaction, the mixture quenched with 10% HCl aqueous solution and extracted with ethyl acetate. The organic layer was dried with anhydrous magnesium sulfate and evaporated under reduced pressure. The residue was washed with hexane and filtered to obtain the solid, yielding 7.6 g of off-white solid (45%).

Synthesis of Intermediate T

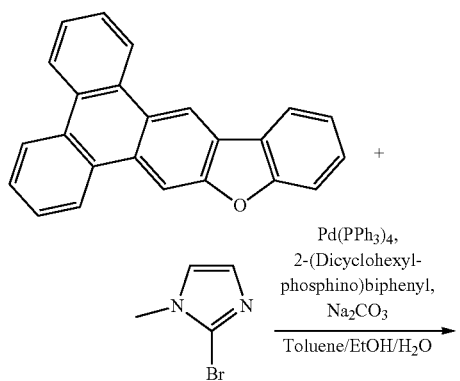

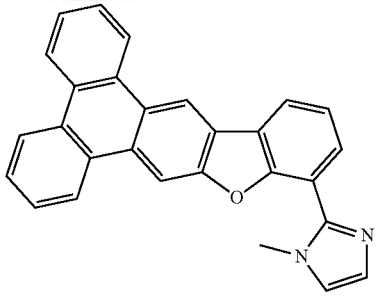

Intermediate T

A mixture of Intermediate S (28.9 g, 80 mmol), 2-bromo-1-methyl-1H-imidazole (13.5 g, 84 mmol), sodium carbonate (17 g, 160 mmol), water (80 ml), ethanol (80 ml) and toluene (160 ml) was degassed by bubbling nitrogen gas for 15 minutes followed by addition of palladium tetrakis (1.8 g, 1.6 mmol) and 2-(dicyclohexylphosphino)biphenyl (1.1 g, 3.2 mmol). The mixture was heated to reflux overnight. Upon cooling to room temperature, the mixture was extracted with ethyl acetate (3 times) and washed with water. The organic layer was dried with anhydrous magnesium sulfate and evaporated under reduced pressure. The residue was purified by column chromatography on silica, yielding 24.8 g of yellow solid (78%)

Synthesis of Intermediate U

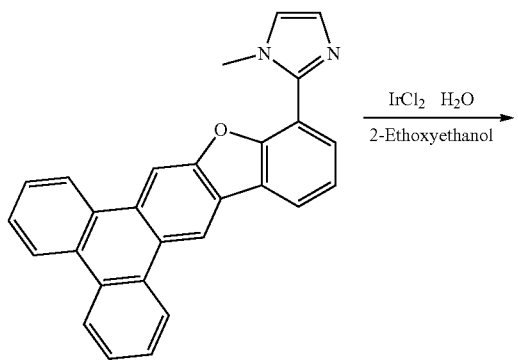

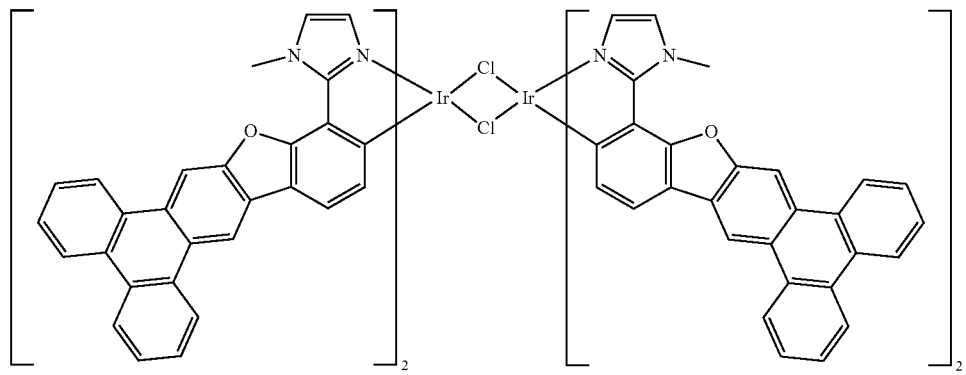

Intermediate U

A mixture of Intermediate T (4 g, 10.2 mmol), 2-ethxoy-ethanol (10 ml) and water (30 ml) was degassed by bubbling nitrogen for 15 minutes and followed by addition of Iridium (III) chloride hydrate (4.1 g, 11.3 mmol). The mixture was heated to reflux overnight. After the reaction was finished, the mixture was cooled to room temperature and filtered. The solid was washed with water and methanol, yielding 2.4 g of dark-yellow powder (46%)

Synthesis of EX77

A mixture Intermediate U (12.8 g, 6.3 mmol), acetylacetone (6.3 g, 63.0 mmol), sodium carbonate (6.6 g, 63.0 mmol), and 2-Ethoxyethanol (60 ml) was degassed was degassed by bubbling nitrogen for 15 minutes and then heated at 120° C. overnight under nitrogen. After the reaction finished, the mixture was allowed to cool to room temperature, filtered with suction, washed with water and methanol. The product was filtered off with suction, yielding 8.3 g of yellow solid as EX77 (61%). MS (m/z, EI$^+$):1085.24

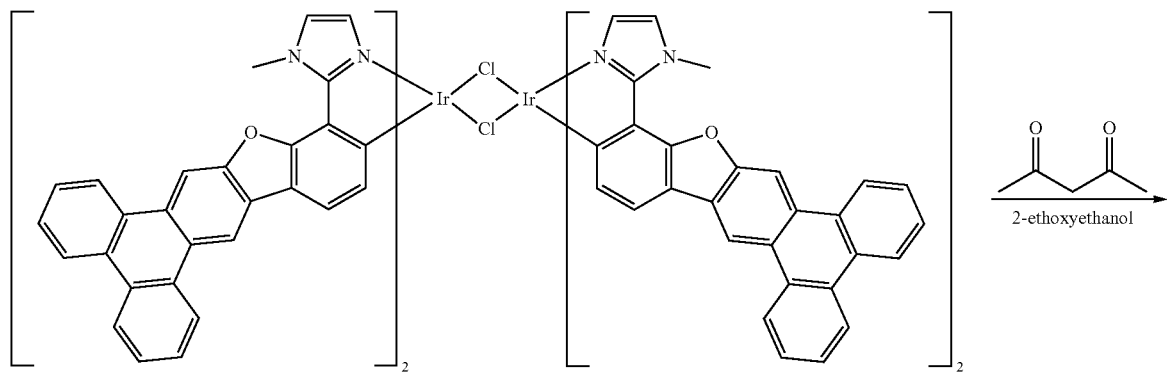

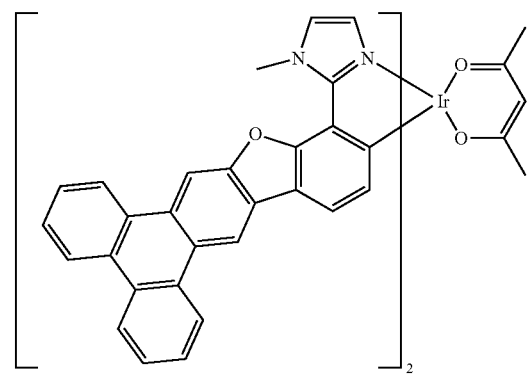

Example 9

Synthesis of EX95

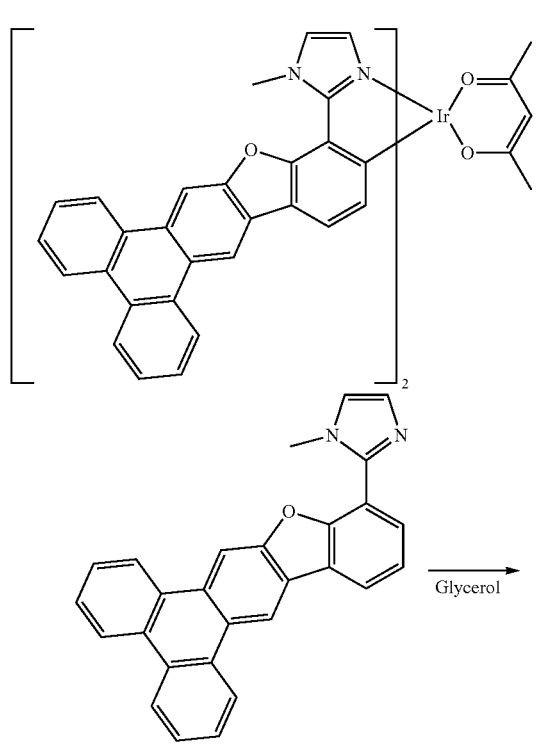

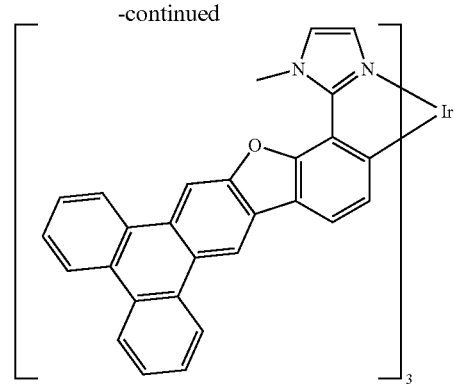

A mixture of EX77 (8.3 g, 7.6 mmol), Intermediate T (9.0 g, 22.8 mmol), and glycerol (400 ml) was by bubbling nitrogen for 15 minutes and then heated at 200° C. overnight under nitrogen. After the reaction finished, the mixture was allowed to cool to room temperature. Afterwards, water (500 ml) was added and stirred for 1 hr, and then the precipitated product was filtered off with suction. The residue was purified by column chromatography on silica, yielding 5.8 g of yellow-orange solid as EX95 (56%). MS (m/z, EI$^+$): 1383.6

Example 10

Synthesis of 89

Synthesis of Intermediate V

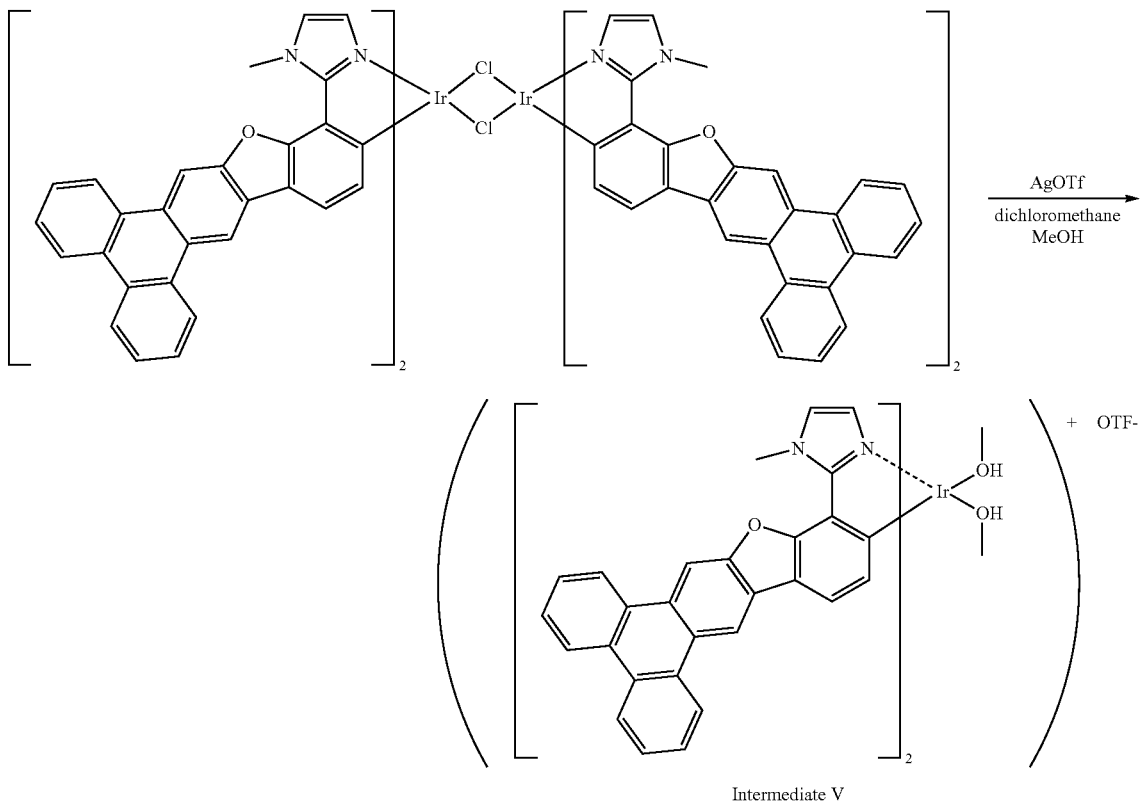

Intermediate V

A mixture of Intermediate U (18.6 g, 9.1 mmol), silver triflate (5.3 g, 20.9 mmol), dichloromethane (460 ml) and methanol (25 ml) was placed under nitrogen and stirred at room temperature overnight. After the reaction finished, the silver chloride was filtered with Celite and the filtrate was evaporated to obtain 18.1 g of iridium triflate precursor without further purification.

Synthesis of EX89

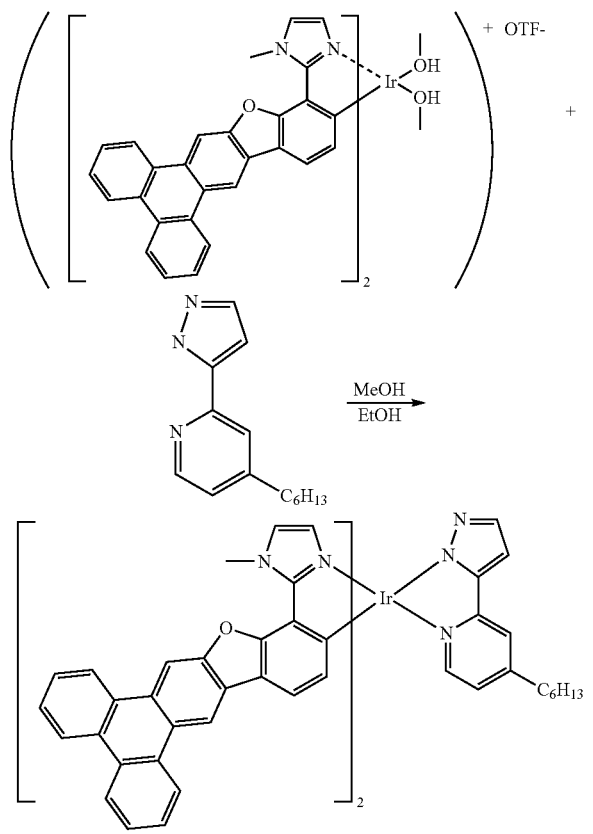

A mixture of Intermediate V (7.4 g, 6.2 mmol), 4-hexyl-2-(1H-pyrazol-5-yl)pyridine (4.2 g, 18.6 mmol), EtOH (60 ml) and MeOH (60 ml) was placed under nitrogen, and then heated to reflux overnight. After the reaction was finished, the mixture was allowed to cool to room temperature. The red precipitate formed was filtered under vacuum, washed with ethanol and hexane, and then purified by vacuum sublimation to give 3 g (58%) of yellow solid as EX89. MS (m/z, EI$^+$):1214.46

General Method of Producing Organic EL Device

ITO-coated glasses with 9-12 ohm/square in resistance and 120~160 nm in thickness are provided (hereinafter ITO substrate) and cleaned in a number of cleaning steps in an ultrasonic bath (e.g. detergent, deionized water). Before vapor deposition of the organic layers, cleaned ITO substrates are further treated by UV and ozone. All pre-treatment processes for ITO substrate are under clean room (class 100)

The organic layers are applied onto the ITO substrate in order by vapor deposition in a high-vacuum unit ($10^{-7}$ Torr), such as: resistively heated quartz boats. The thickness of the respective layer and the vapor deposition rate (0.1~0.3 nm/sec) are precisely monitored or set with the aid of a quartz-crystal monitor. It is also possible, as described above, for individual layers to consist of more than one compound, e.g. a host material doped with a dopant material in the light emitting layer. This is successfully achieved by co-vaporization from two or more sources, which means the iridium complex of the present invention is thermally stable Dipyrazino[2,3-f:2,3-]quinoxaline-2,3,6,7,10,11-hexacarbonitrile (HAT-CN) is used to form the hole injection layer; N,N-bis(naphthalene-1-yl)-N,N-bis(phenyl)-benzidine (NPB) is used to form the hole transporting layer; and N-(biphenyl-4-yl)-9,9-dimethyl-N-(4'-phenyl-biphenyl-4-yl)-9H-fluoren-2-amine (EB2) is used to form the electron blocking layer. The chemical structures of the materials mentioned above are shown below:

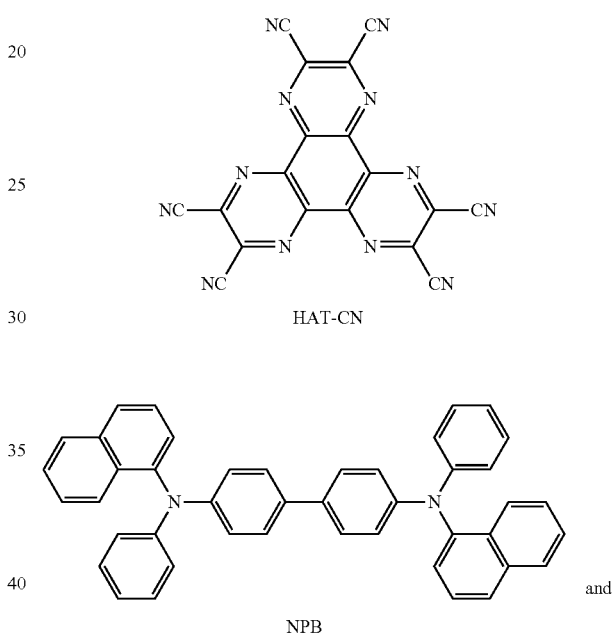

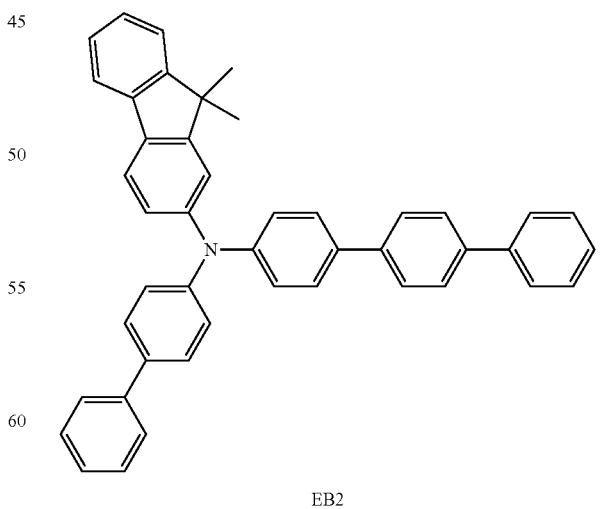

EB2

In the present invention, the host material may be selected from the following compounds and a combination thereof:

H2

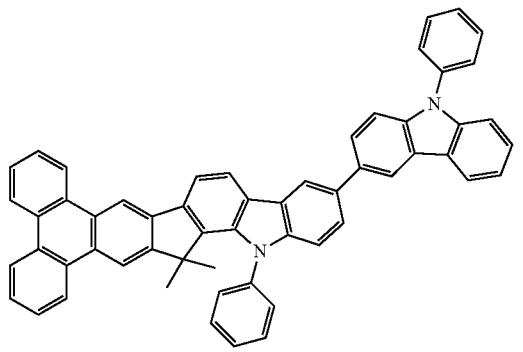

H3

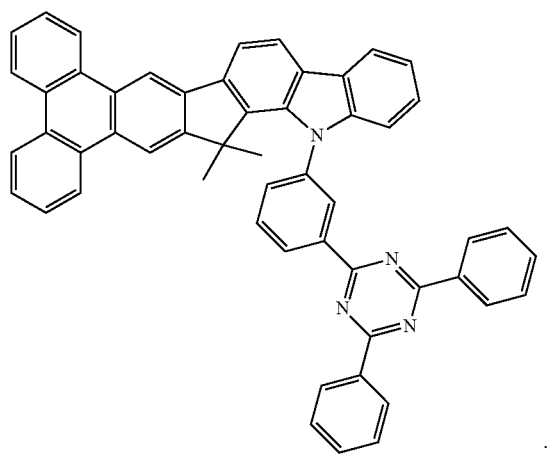

and

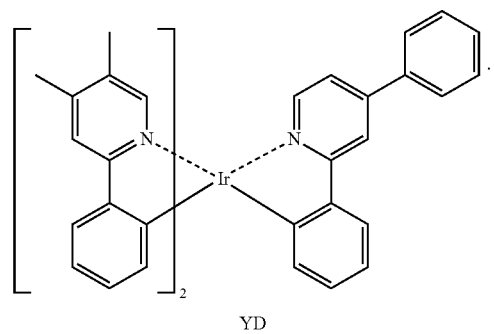

YD

The chemical structures of the exemplary iridium complexes of the present invention for producing exemplary organic EL devices in this invention are shown as follows.

EX1

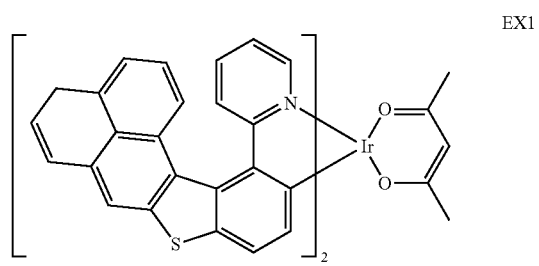

EX2

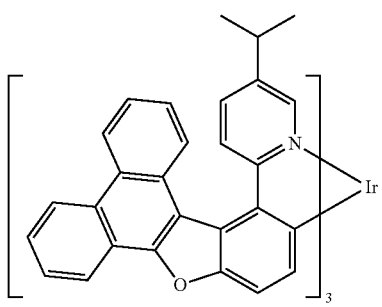

The organic iridium complexes are widely used as phosphorescent dopant for light emitting layer, and Ir(2-phq)$_2$(acac), Ir(ppy)$_3$ and YD as shown below, are used as phosphorescent dopant of light emitting layer for comparison in the device test.

EX3

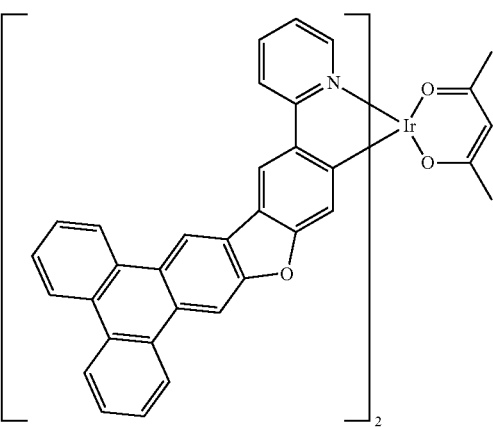

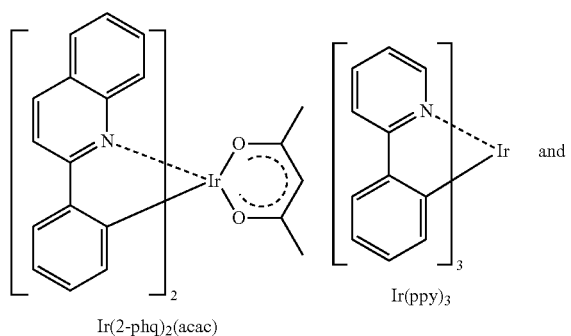

Ir(2-phq)$_2$(acac)    Ir(ppy)$_3$

-continued
EX7
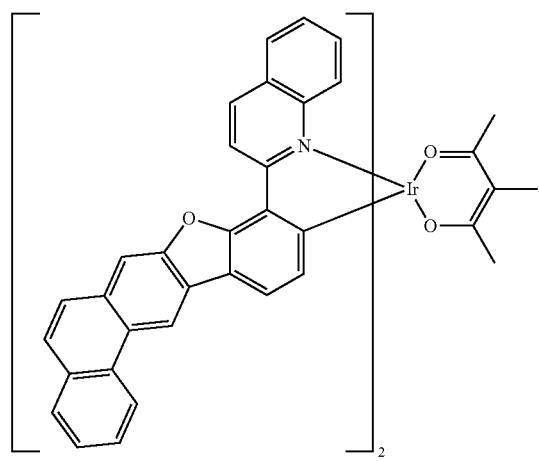
EX8
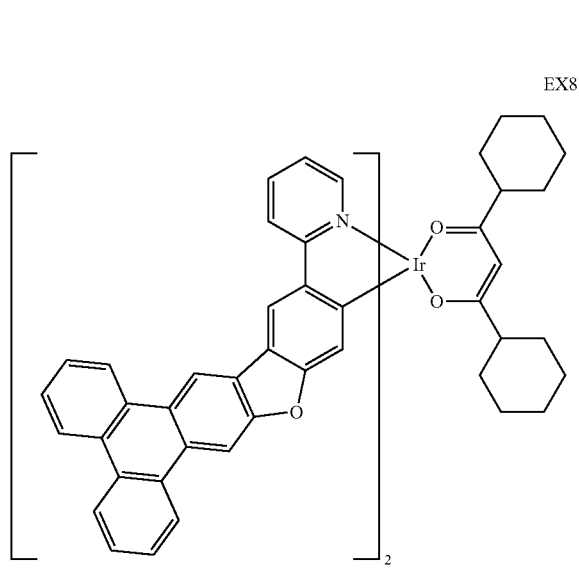
EX10
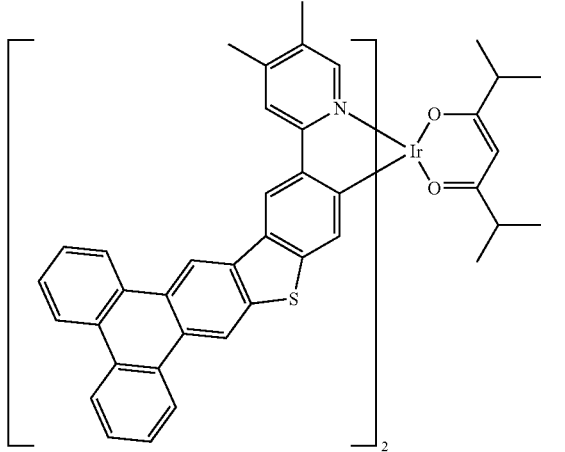
EX14
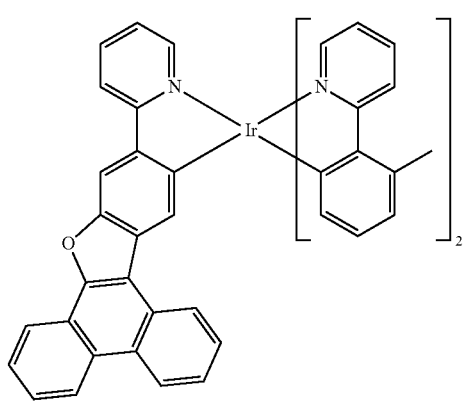
EX18
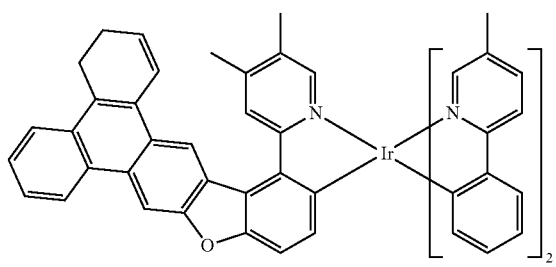
EX22
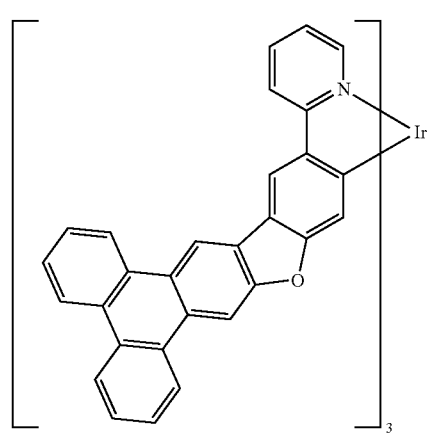
EX23
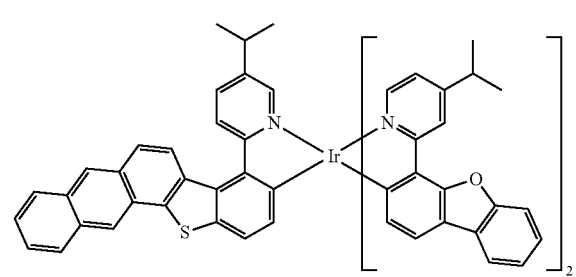

-continued
EX25
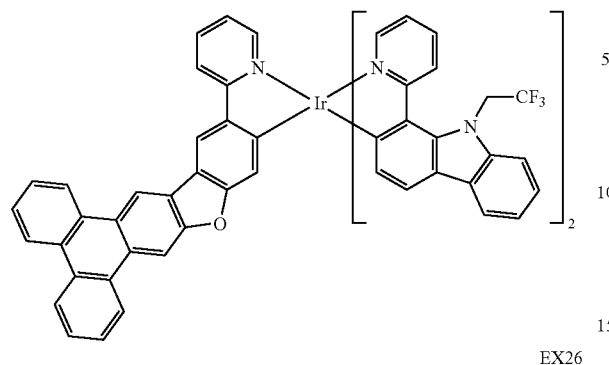
EX26
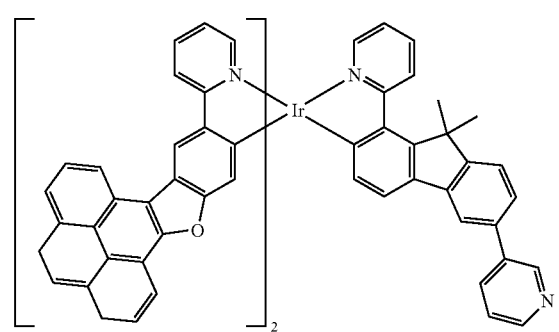
EX29
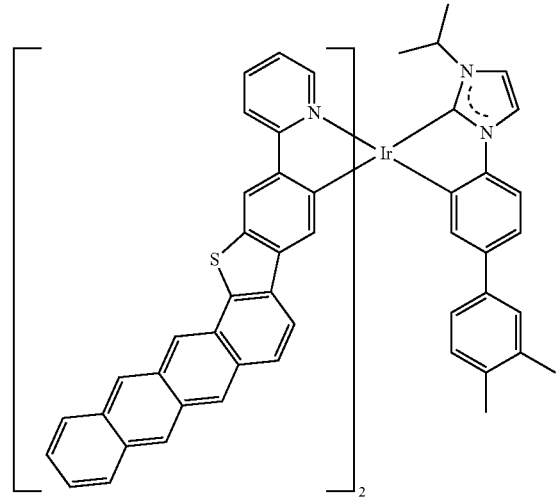
EX43
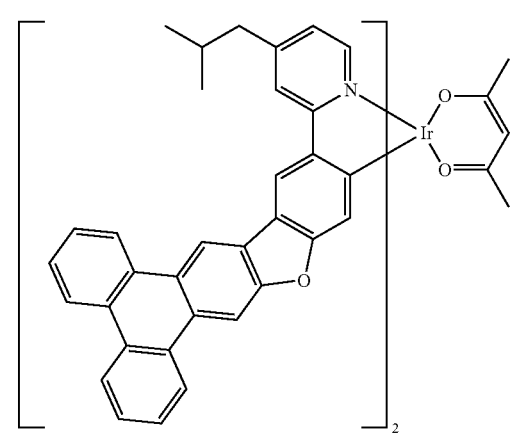
-continued
EX47
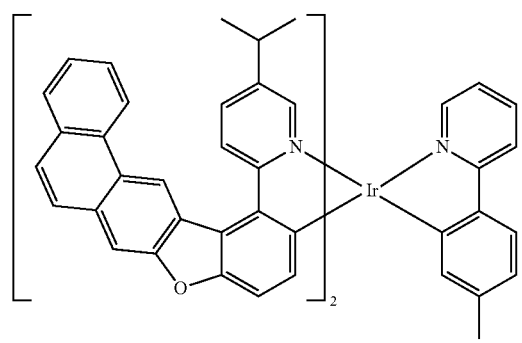
EX48
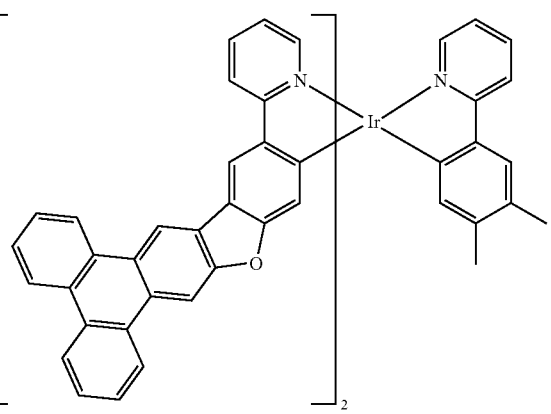
EX54
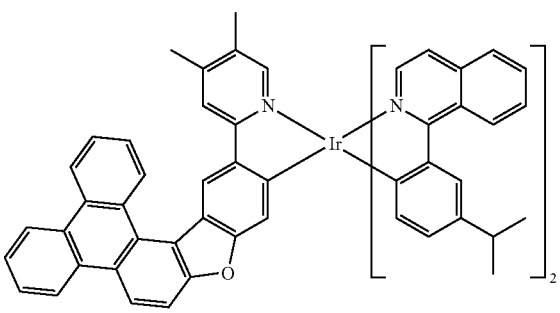
EX55

EX61
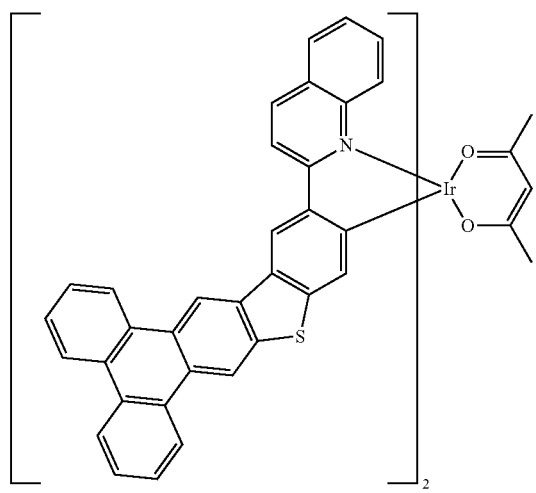
EX76
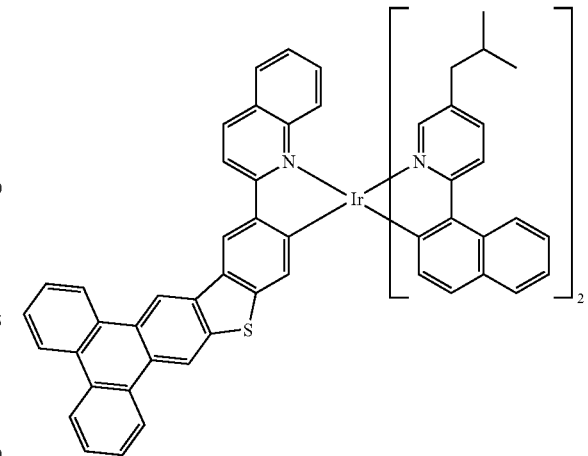
EX68
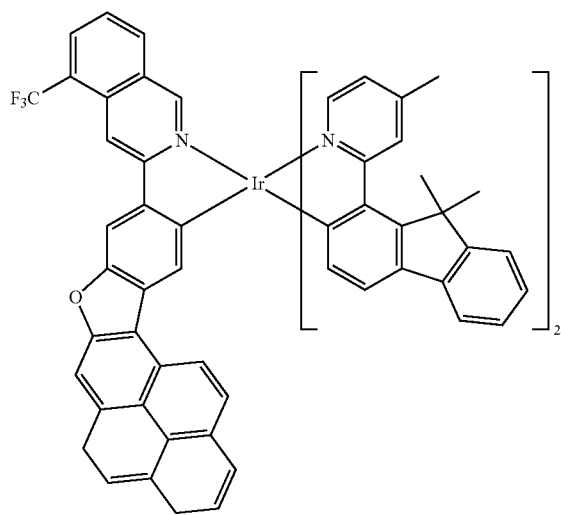
EX77
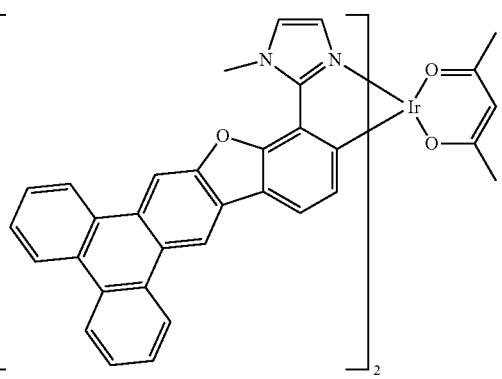
EX70
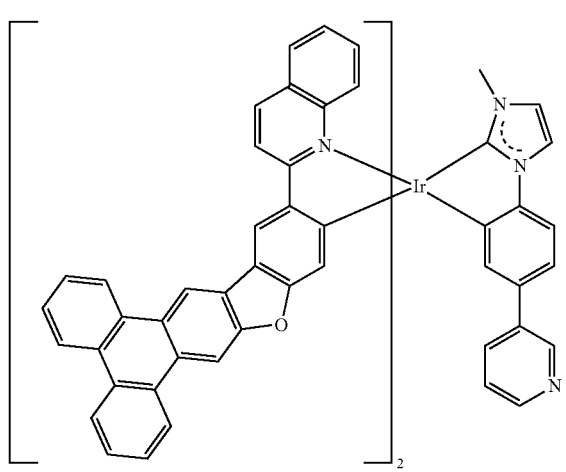
EX80
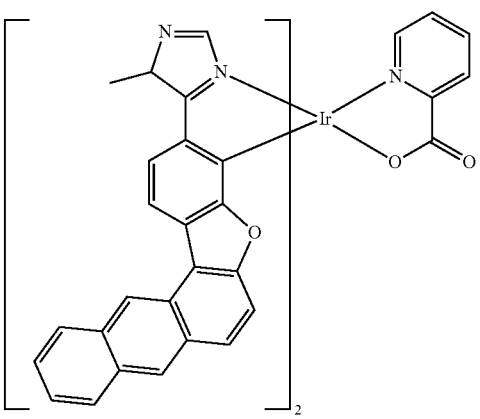

EX85
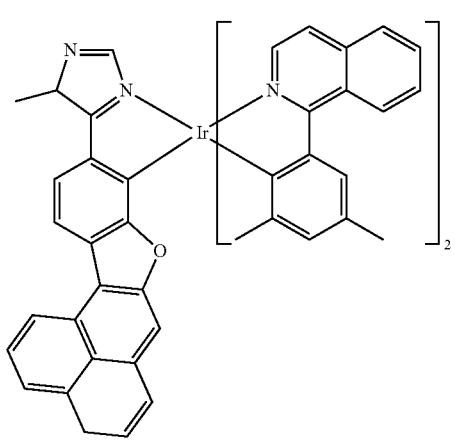
EX89
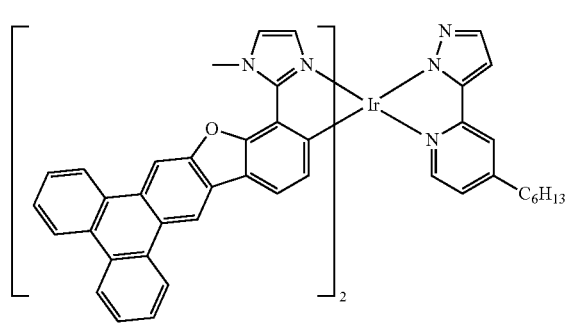
EX92
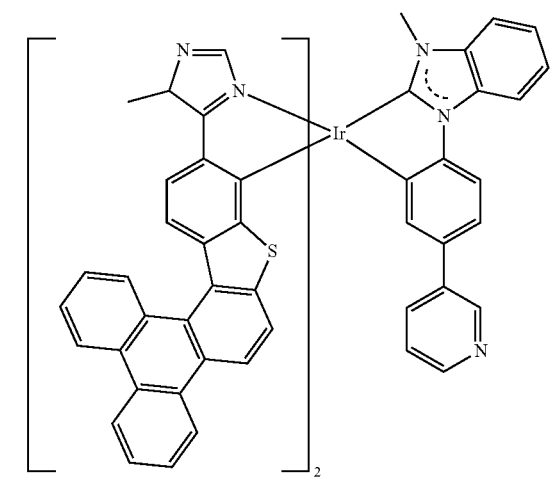
EX93
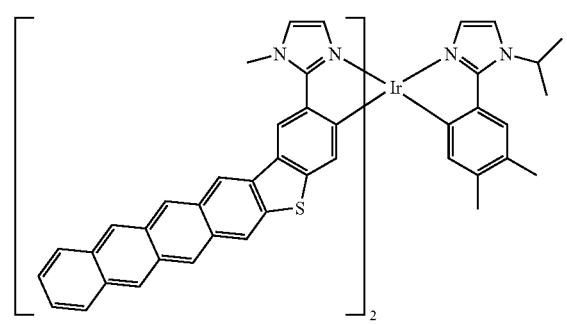
EX94
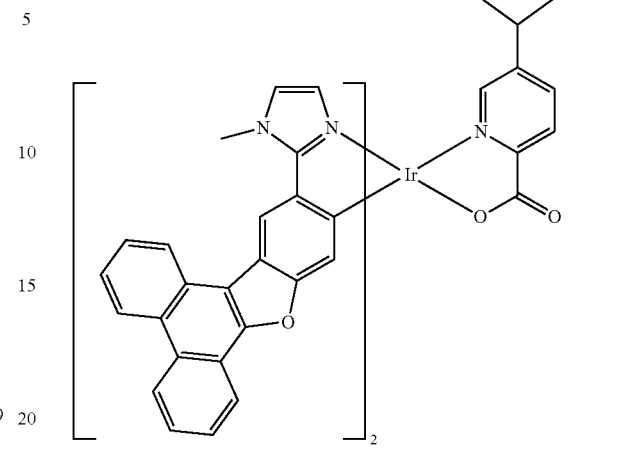
EX95
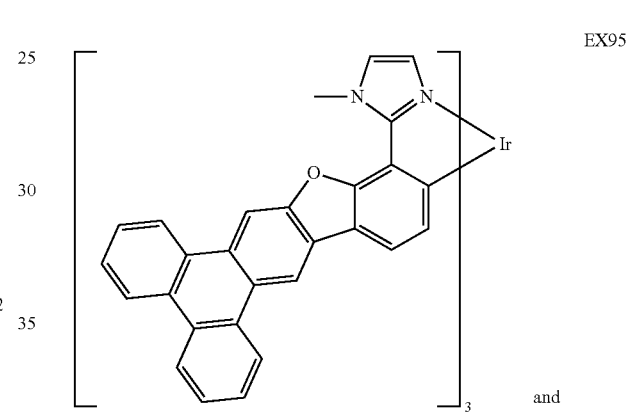
EX96
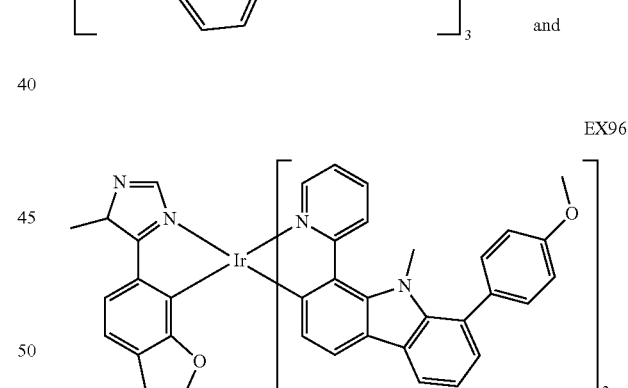
HB3 is used as hole blocking material (HBM), and 2-(10,10-dimethyl-10H-indeno[2,1-b]triphenylen-12-yl)-4,6-diphenyl-1,3,5-triazine (ET2) is used as electron transporting material to co-deposit with 8-hydroxyquinolato-lithium (LiQ) in organic EL devices. The chemical structures of the materials mentioned above are shown below:

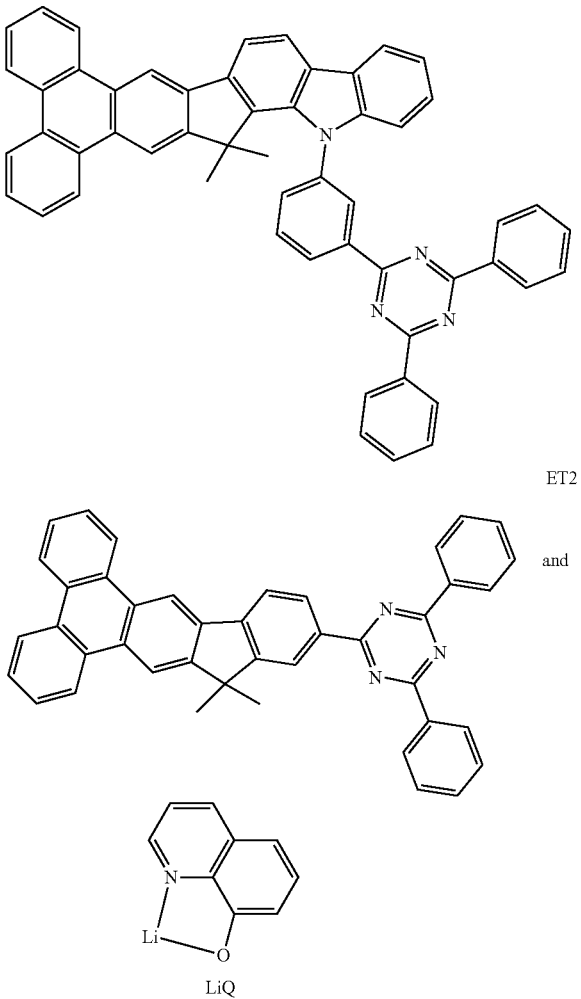

(20 nm)/NPB (110 nm)/EB2 (5 nm)/H2 and H3 doped with 15% phosphorescent dopant (30 nm)/HB3 (10 nm)/ET2 doped with 40% LiQ(35 nm)/LiQ(1 nm)/Al(160 nm). In the device illustrated in the FIGURE, the hole injection layer 20 (HAT-CN) is deposited onto the transparent electrode 10 (ITO). The hole transport layer 30 (NPB) is deposited onto the hole injection layer 20. The electron blocking layer 40 (EB2) is deposited onto the hole transport layer 30. The phosphorescence emitting layer 50 is deposited onto the electron blocking layer 40. The phosphorescence emitting layer 50 may comprise emitting host materials and an emitting guest (dopant) material, as shown in, for example, Table 1. The emitting host materials may be doped with about 15% emitting guest material. The phosphorescence emitting layer 50 may have a thickness of about 30 nm. The hole blocking layer 60 (HB3) is deposited onto the phosphorescence emitting layer 50. The electron transport layer 70 (ET2 doped with 40% LiQ) is deposited onto the hole blocking layer 60. The electron injection layer 80 (LiQ) is deposited onto the electron transport layer 70, and the metal electrode 90 (Al) is deposited onto the electron injection layer 80. The I-V-B (at 1000 nits) and half-life test reports of these organic EL devices are summarized in Table 1 below. The half-life is defined as the time the initial luminance of 1000 cd/m² has dropped to half.

A typical organic EL device consists of low work function metals, such as Al, Mg, Ca, Li and K, as the cathode, and the low work function metals can help electrons injecting the electron transporting layer from cathode. In addition, for reducing the electron injection barrier and improving the organic EL device performance, a thin-film electron injecting layer is introduced between the cathode and the electron transporting layer. The materials of electron injecting layer are metal halide or metal oxide with low work function, such as: LiF, LiQ, MgO, or Li₂O. On the other hand, after the organic EL device fabrication, EL spectra and CIE coordination are measured by using a PR650 spectra scan spectrometer. Furthermore, the current/voltage, luminescence/voltage and yield/voltage characteristics are taken with a Keithley 2400 programmable voltage-current source. The above-mentioned apparatuses are operated at room temperature (about 25° C.) and under atmospheric pressure.

Example 11

Using a procedure analogous to the above mentioned general method, organic EL devices emitting phosphorescence and having the following device structure (as shown in the FIGURE). From the bottom layer 10 to the top layer 90, the following component were produced: ITO/HAT-CN

TABLE 1

| Host | Dopant Material | Driving Voltage (V) | Current Efficiency (cd/A) | Color | Half-life (hours) |
|---|---|---|---|---|---|
| H2 + H3 | Ir(2-phq)₂(acac) | 4.6 | 17 | Red | 440 |
| H2 + H3 | EX3 | 3.7 | 23 | Red | 750 |
| H2 + H3 | EX8 | 3.8 | 22 | Red | 760 |
| H2 + H3 | EX10 | 4.0 | 19 | Red | 650 |
| H2 + H3 | EX22 | 3.8 | 24 | Red | 770 |
| H2 + H3 | EX26 | 4.3 | 21 | Red | 740 |
| H2 + H3 | EX29 | 4.8 | 18 | Red | 630 |
| H2 + H3 | EX48 | 3.9 | 22 | Red | 770 |
| H2 + H3 | EX68 | 4.4 | 21 | Red | 720 |
| H2 + H3 | EX70 | 3.8 | 22 | Red | 730 |
| H2 + H3 | EX93 | 4.5 | 18 | Red | 690 |
| H2 + H3 | EX96 | 4.1 | 20 | Red | 710 |
| H2 + H3 | YD | 4.9 | 37 | Yellow | 330 |
| H2 + H3 | EX7 | 4.1 | 42 | Yellow | 470 |
| H2 + H3 | EX18 | 4.2 | 45 | Yellow | 450 |
| H2 + H3 | EX25 | 4.5 | 38 | Yellow | 410 |
| H2 + H3 | EX43 | 4.2 | 40 | Yellow | 520 |
| H2 + H3 | EX54 | 4.6 | 40 | Yellow | 410 |
| H2 + H3 | EX55 | 4.2 | 41 | Yellow | 480 |
| H2 + H3 | EX61 | 4.4 | 43 | Yellow | 510 |
| H2 + H3 | EX76 | 4.3 | 40 | Yellow | 440 |
| H2 + H3 | EX77 | 4.0 | 45 | Yellow | 530 |
| H2 + H3 | EX89 | 4.3 | 39 | Yellow | 470 |
| H2 + H3 | EX92 | 4.7 | 38 | Yellow | 410 |
| H2 + H3 | EX95 | 4.0 | 45 | Yellow | 520 |
| H2 + H3 | Ir(ppy)₃ | 4.2 | 44 | Green | 510 |
| H2 + H3 | EX1 | 3.8 | 47 | Green | 720 |
| H2 + H3 | EX2 | 3.6 | 46 | Green | 740 |
| H2 + H3 | EX14 | 4.1 | 45 | Green | 670 |
| H2 + H3 | EX23 | 4.2 | 43 | Green | 490 |
| H2 + H3 | EX47 | 4.3 | 41 | Green | 690 |
| H2 + H3 | EX80 | 4.6 | 42 | Green | 530 |
| H2 + H3 | EX85 | 4.7 | 40 | Green | 480 |
| H2 + H3 | EX94 | 4.1 | 45 | Green | 670 |

In Table 1, the iridium complex of formula (1) used as the dopant material of light emitting layer for organic EL device of the present may exhibit better performance than the prior art organic EL materials. More specifically, the organic EL devices of the present invention use the iridium complex of formula (1) as light emitting dopant material to collocate with the co-host material (i.e. H2 and H3), thereby lowering a driving voltage, increasing a current efficiency, or a half-life.

Referring to Table 1, with a red-light-emitting dopant material of, for example, but not limited to EX3, EX8, EX22, EX26, EX48, EX68, EX70 or EX96, a red light may be emitted for a half-life longer than about 710 hours, at a current efficiency greater than about 19 cd/A, upon application of a driving voltage lower than about 4.4 V. A yellow light may be emitted, for a half-life longer than about 510 hours, at a current efficiency greater than about 40 cd/A, upon application of a driving voltage lower than about 4.5 V, with a yellow-light-emitting dopant material of, for example, but not limited to EX43, EX61, EX77 or EX95. A green light may be emitted, for a half-life longer than about 670 hours, at a current efficiency greater than about 45 cd/A, upon application of a driving voltage lower than about 4.2 V, with a green-light-emitting dopant material of, for example, but not limited to EX1, EX2, EX14 or EX94.

The red-light-emitting dopant material, EX22, for example, may be for lowering the driving voltage to about 3.8 V, increasing the current efficiency to about 24 cd/A, or increasing the half-life to about 770 hours. The yellow-light-emitting dopant material, EX77, for example, may be for lowering the driving voltage to about 4.0 V, increasing the current efficiency to about 45 cd/A, or increasing the half-life to about 530 hours. The green-light-emitting dopant material, EX2, for example, may be for lowering the driving voltage to about 3.6 V, increasing the current efficiency to about 46 cd/A, and increasing the half-life to about 740 hours.

When non-obviousness is evaluated, the technical solution of the invention cannot be required to produce an advantageous technical effect in any situation and in all aspects. Such requirement does not comply with non-obviousness-related provisions of a patent law.

One person having ordinary skill in the art of the present application, in actual use, may select a dopant material of a compound to take advantage of one kind of luminescent data (for example, to emit a specific color of light). In the same art of the present application, however, it is not always necessary for the present invention to take advantage of other kinds of luminescent data such as a driving voltage, a current efficiency or a half-life of the device.

In evaluating non-obviousness of the present application, it shall not be required to take advantage of all kinds of luminescent data. As long as the present invention takes advantage of one kind of luminescent data, such as a lower driving voltage, a higher current efficiency or a longer half-life, the device of the present invention shall be regarded as producing an advantageous luminescent effect. It shall not be required to have a general improvement of all kinds of luminescent data of the compound in any case. Moreover, the present invention shall be considered as a whole. The technical effect brought by the whole technical solution should not be negated, even if some luminescent data of the compound are not good, or one luminescent data is not good for some kinds of color of light or for the application of some kinds of host.

A compound of the present application, as a dopant material, shall not be required to improve all kinds of luminesce data, for all kinds of color of light, in the case of application of all kinds of host. As long as one kind of luminesce data, such as a current efficiency or a half-life of a specific color of light, is improved in the case of a specific host, the present invention shall be regarded as producing an advantageous technical effect. The advantageous technical effect is non-obvious enough to be a prominent substantive feature, so that the corresponding technical solution of the present invention involves an inventive step.

Obviously, many modifications and variations are possible in light of the above teachings. It is therefore to be understood that within the scope of the appended claims the present invention can be practiced otherwise than as specifically described herein. Although specific embodiments have been illustrated and described herein, it is obvious to those skilled in the art that many modifications of the present invention may be made without departing from what is intended to be limited solely by the appended claims.

What is claimed is:

1. An iridium complex represented by the following formula (1) having a naphthalene ring:

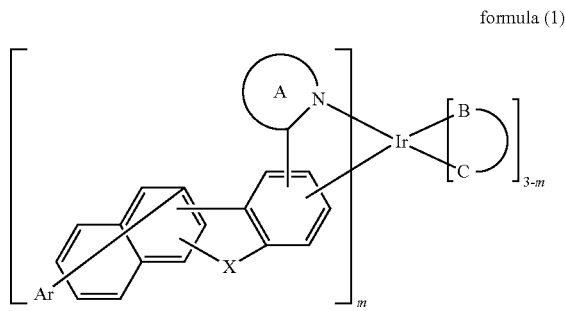

formula (1)

wherein B-C represents a bidentate ligand; Ar represent a substituted or unsubstituted fused ring hydrocarbon unit fused onto the naphthalene ring, A ring represents an imidazole, a pyridine, a quinolone and an isoquinoline; X is O or S; m represents an integer of 1 to 3; n represents an integer of 0 to 4; and $R_1$ is independently a hydrogen atom, a halogen, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

2. The iridium complex according to claim 1, wherein the bidentate ligand has one of the following formulas:

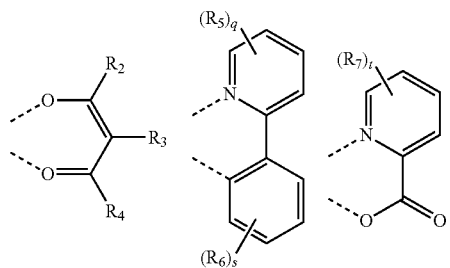

-continued

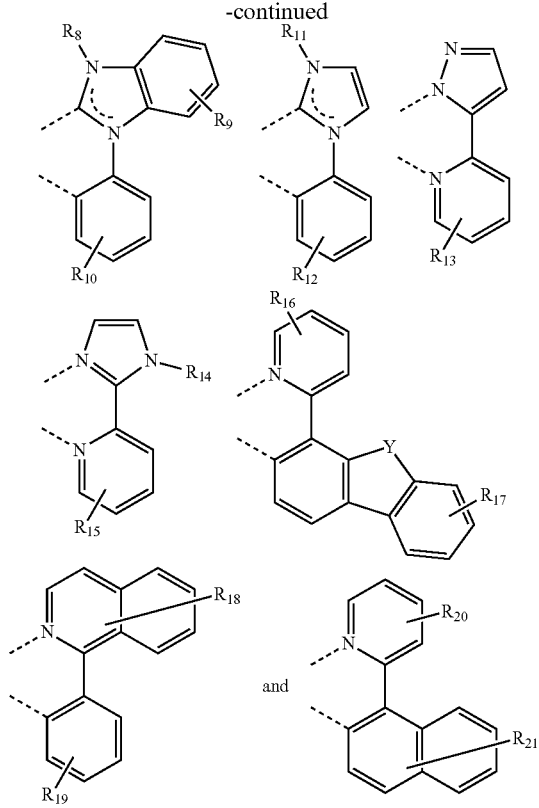

wherein Y is selected from the group consisting of O, S, Se, $CR_{22}R_{23}$, $NR_{24}$ or $SiR_{25}R_{26}$; q, s, and t independently represent an integer of 1 to 4; and $R_2$ to $R_{26}$ are independently a hydrogen atom, a halogen, a substituted or unsubstituted alkyl group having 1 to 30 carbon atoms, a substituted or unsubstituted cycloalkyl group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

3. The iridium complex according to claim 2, wherein $R_2$ to $R_{21}$ are independently a hydrogen atom, a methyl group, an isopropyl group, an isobutyl group, a cyclopentyl group, a hexyl group, a cyclohexyl group, or a phenyl group.

4. The iridium complex according to claim 1, wherein the fused ring hydrocarbons unit is a naphthyl group, an anthracenyl group, a phenanthrenyl group, a triphenylenyl group, a pyrenyl group, a tetracenyl group or one of the following substituents:

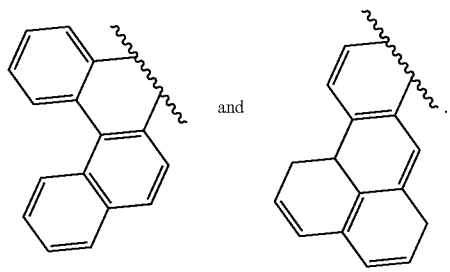

5. The iridium complex according to claim 1, wherein the iridium complex is one of the following compounds:

EX1
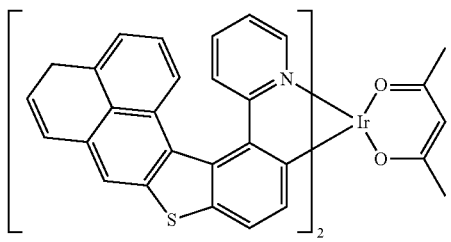

EX2
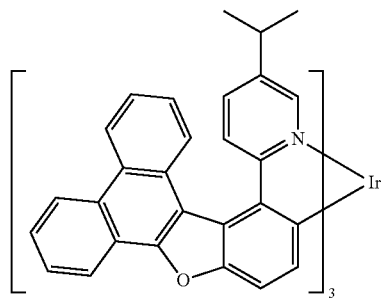

EX3
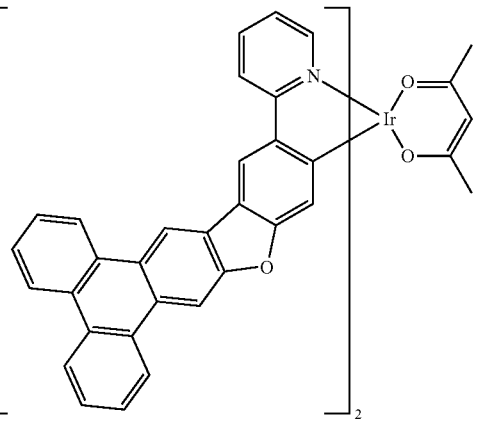

EX4
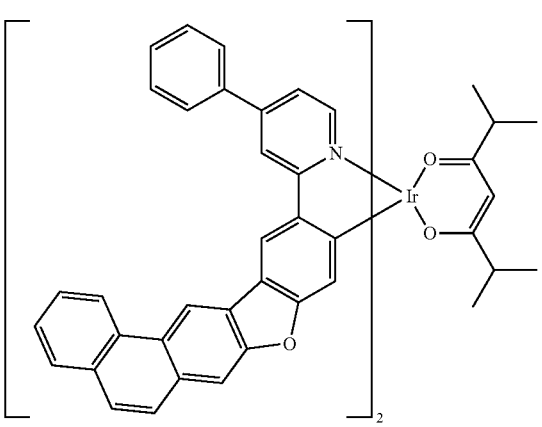

-continued
EX5
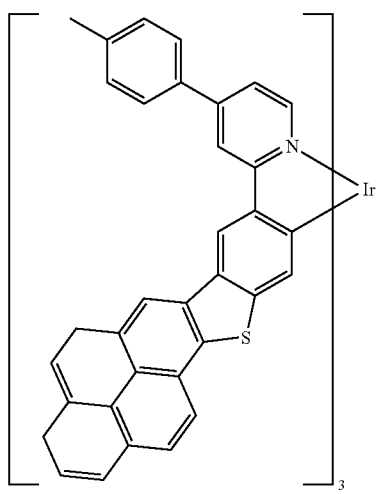
EX6
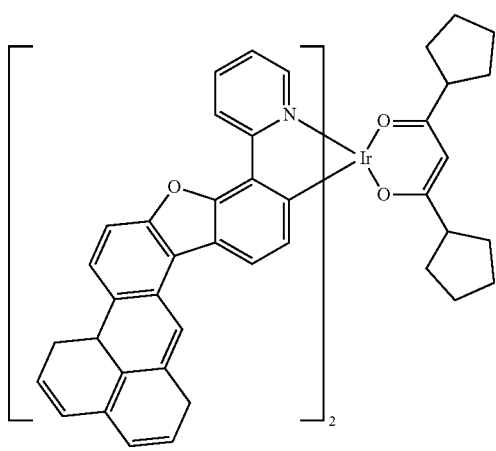
EX7
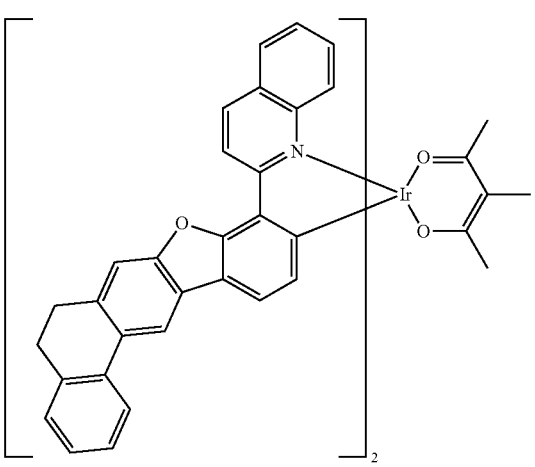
EX8
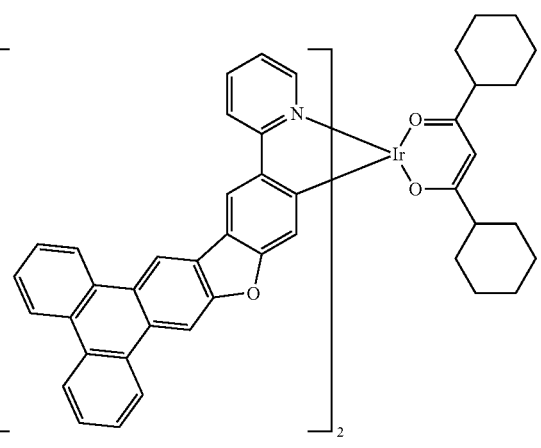
EX9
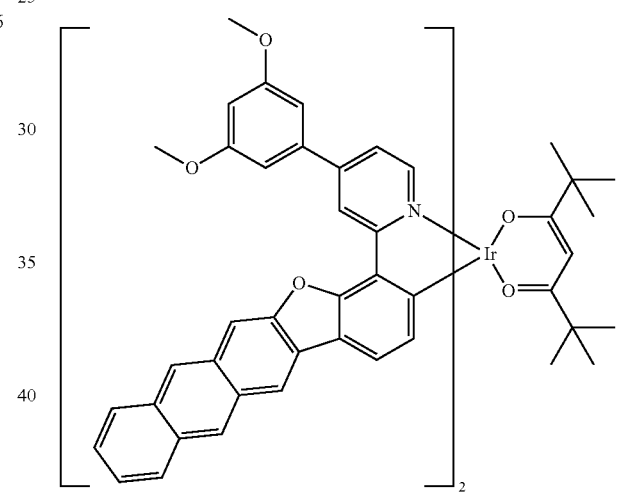
EX10
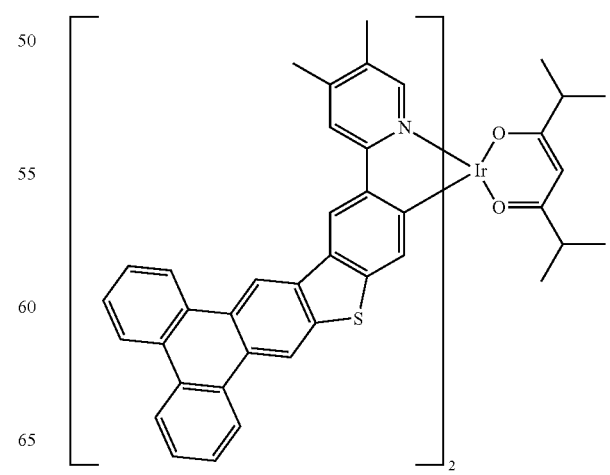

EX11
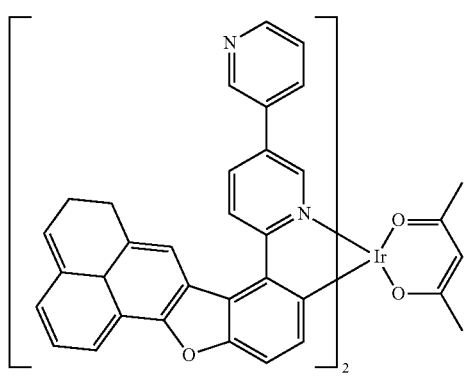
EX15
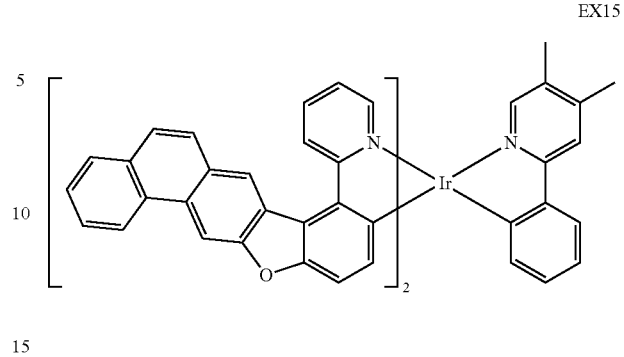
EX12
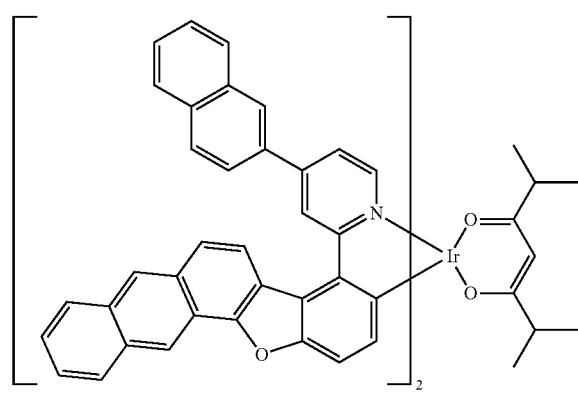
EX16
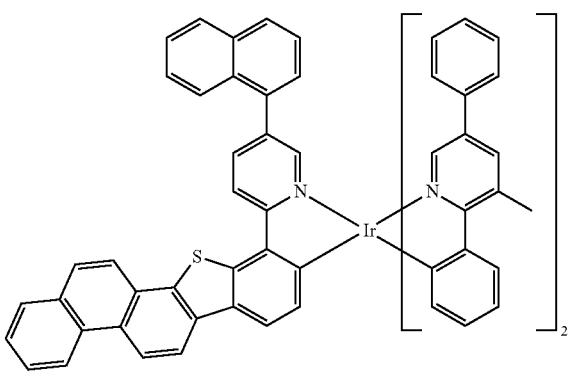
EX13
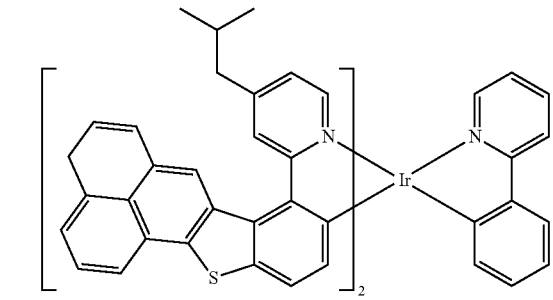
EX17
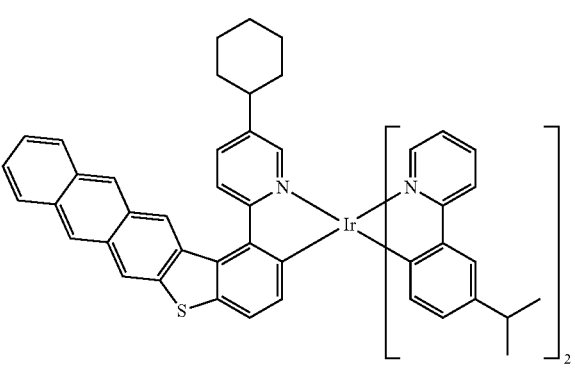
EX14
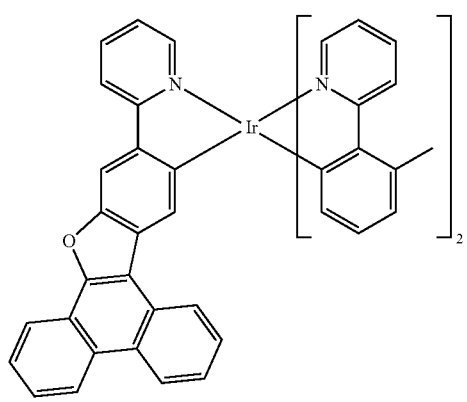
EX18
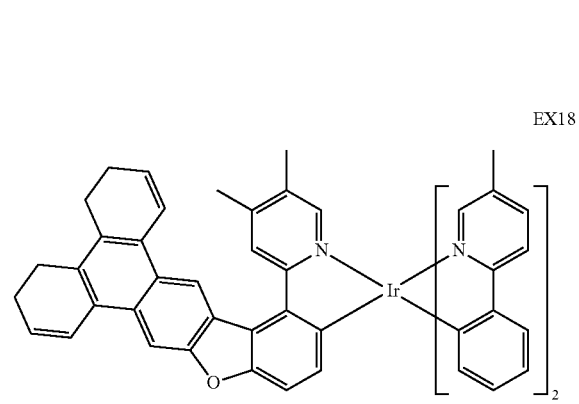

-continued
EX19
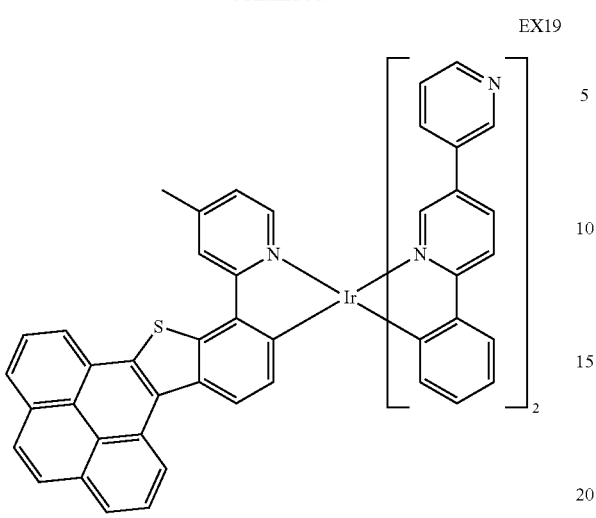
EX20
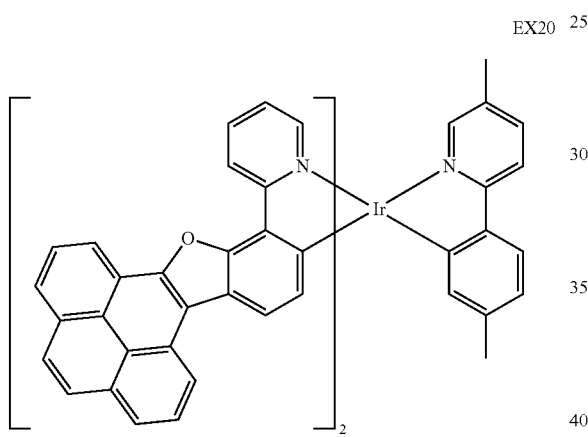
EX21
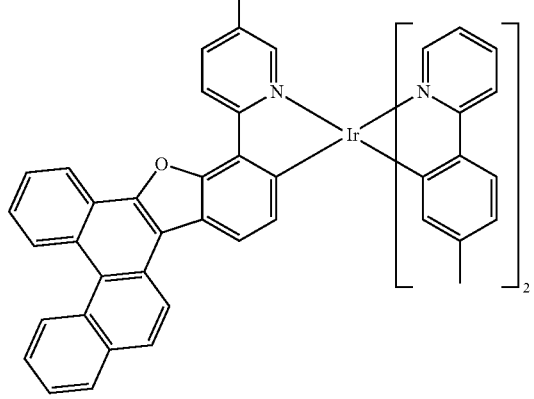
-continued
EX22
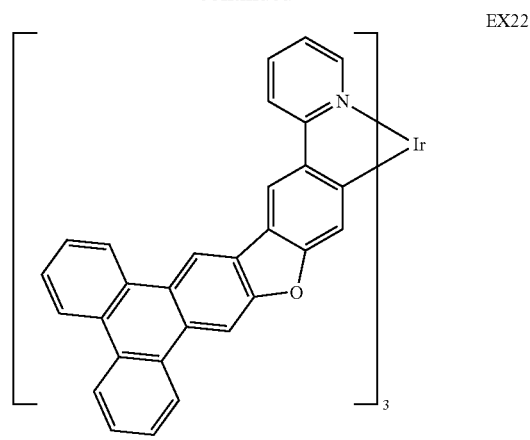
EX23
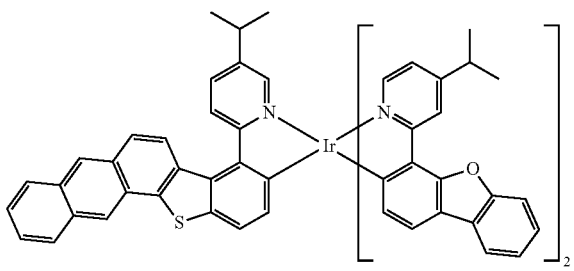
EX24
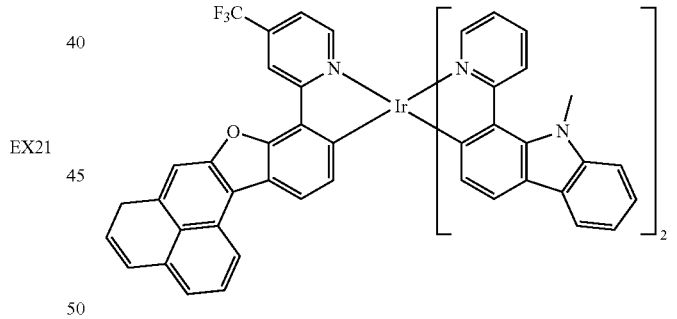
EX25
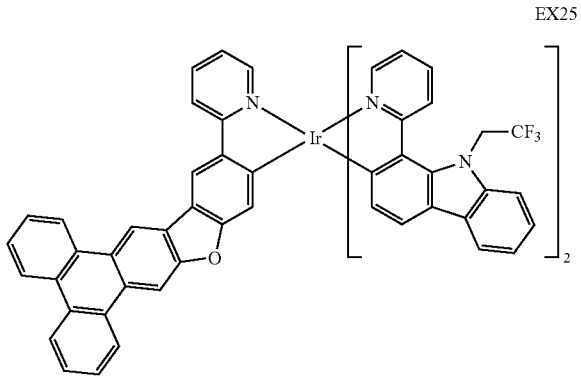

-continued
EX26
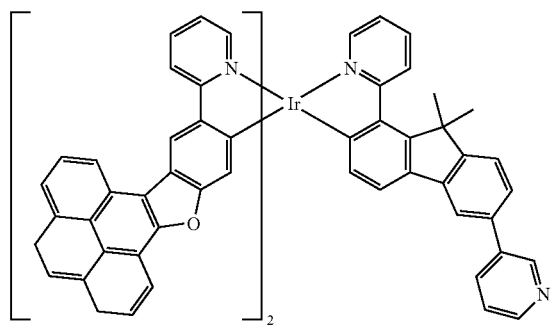
EX30
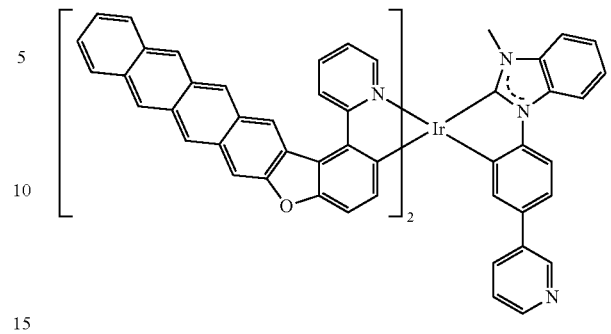
EX27
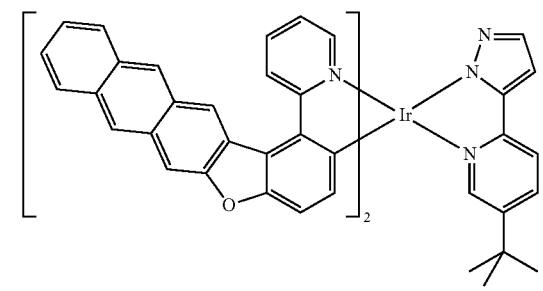
EX31
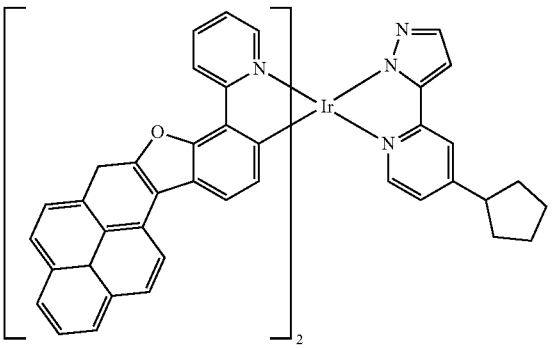
EX28
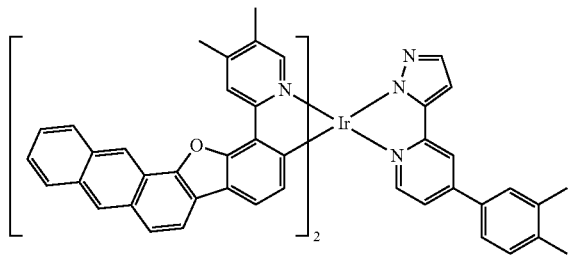
EX32
EX29
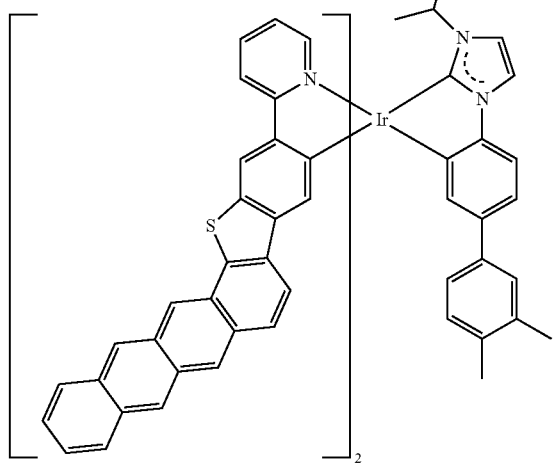
EX33

EX34
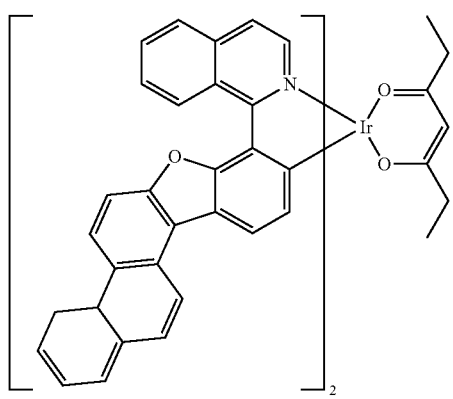
EX35
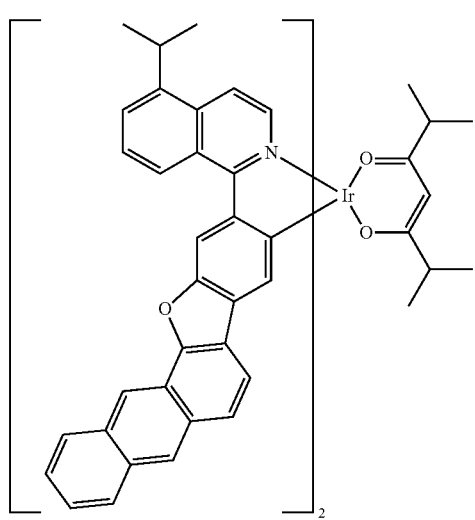
EX36
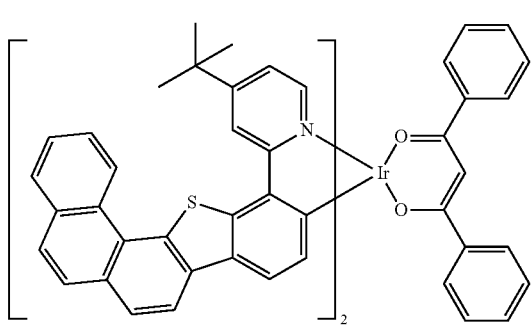
EX37
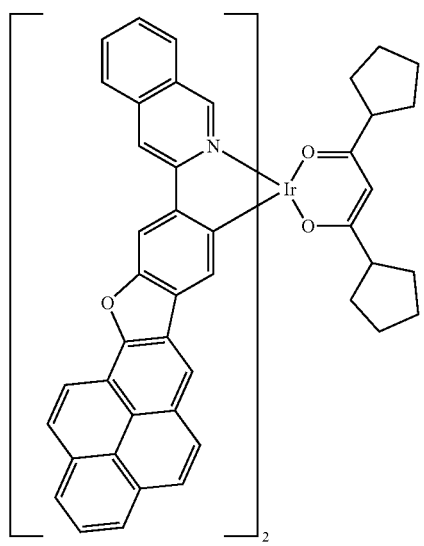
EX38
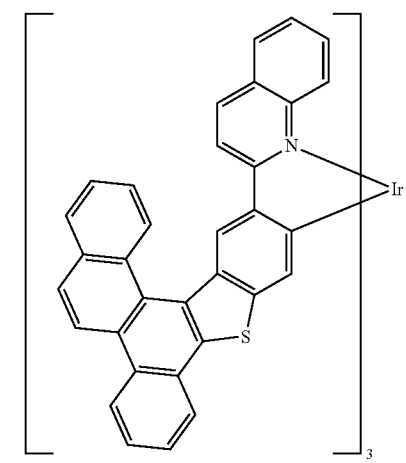
EX39
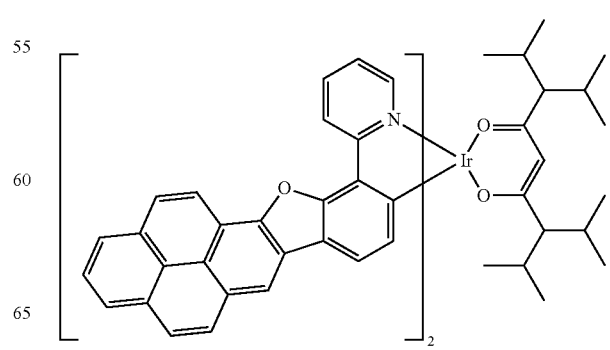

EX40
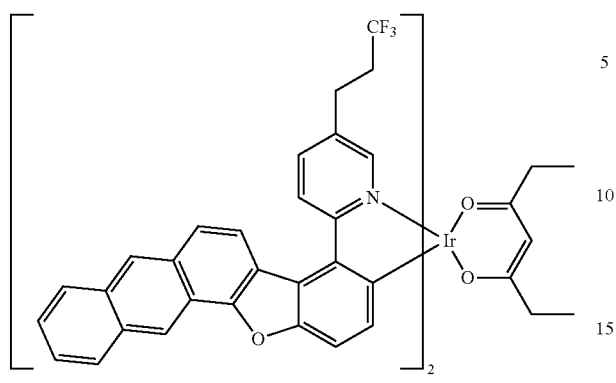
EX43
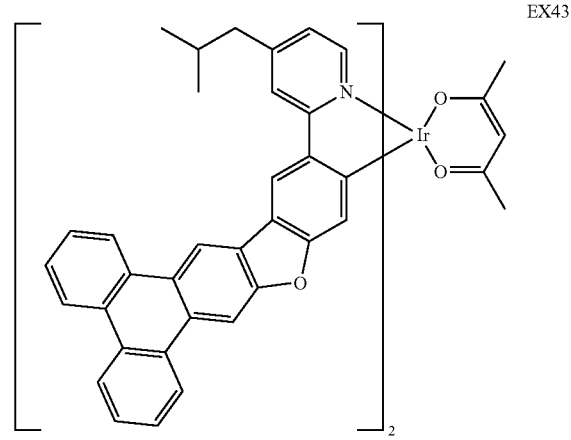
EX41
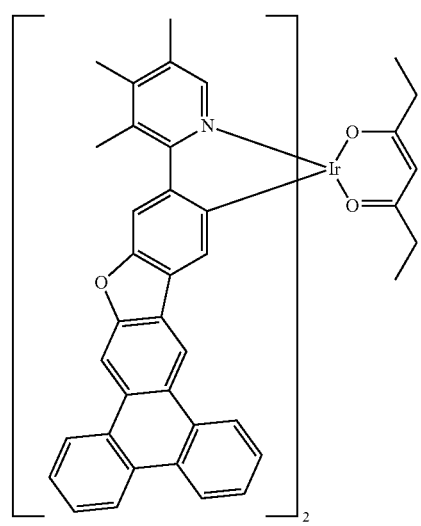
EX44
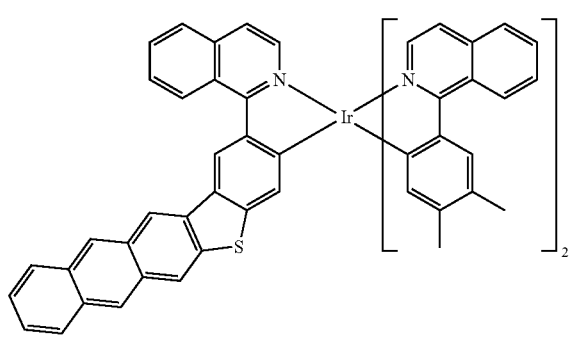
EX45
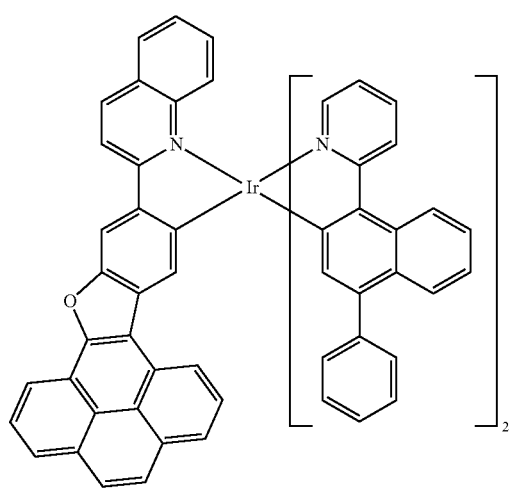
EX42
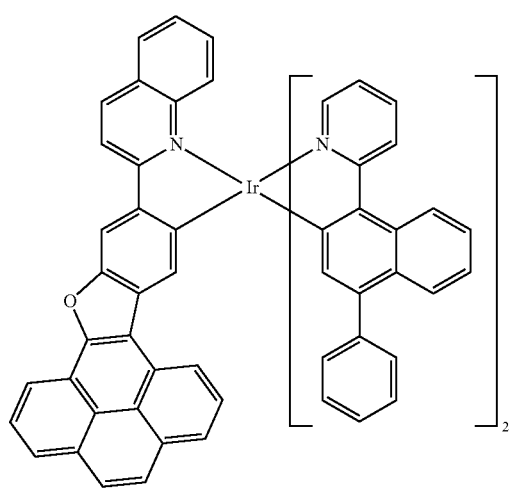
EX46
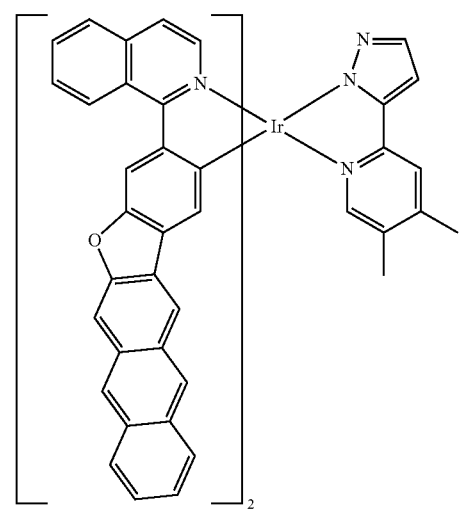

-continued
EX47
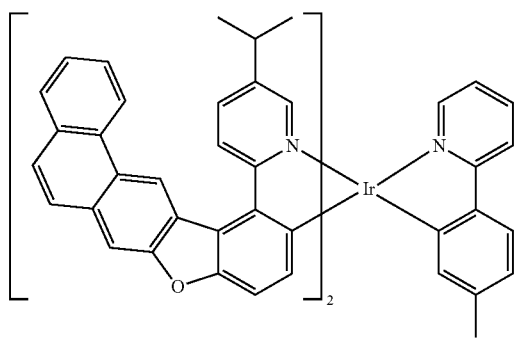
EX48
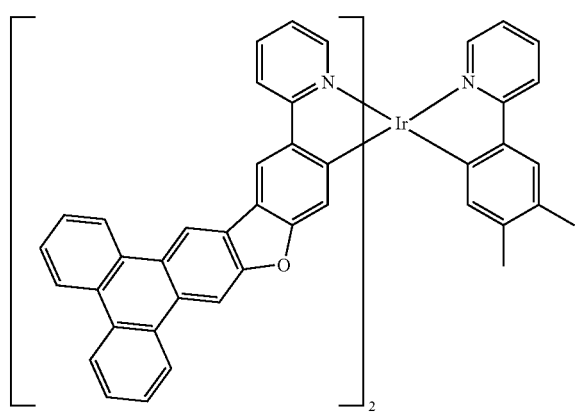
EX49
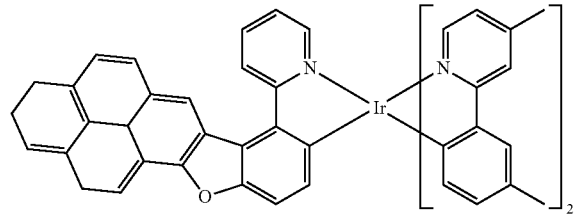
EX50
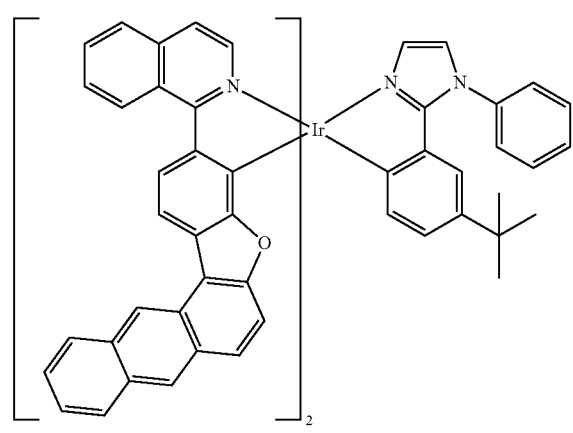
-continued
EX51
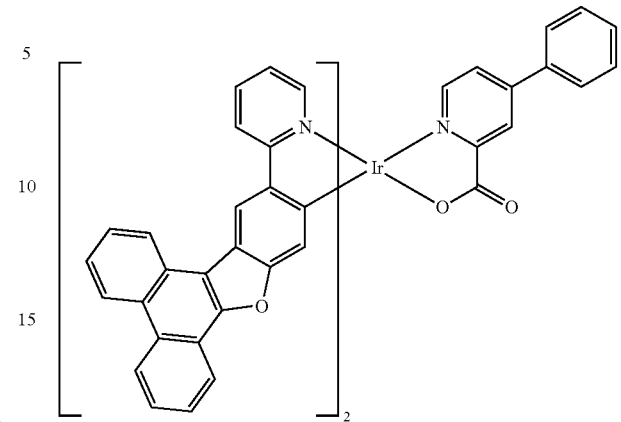
EX52
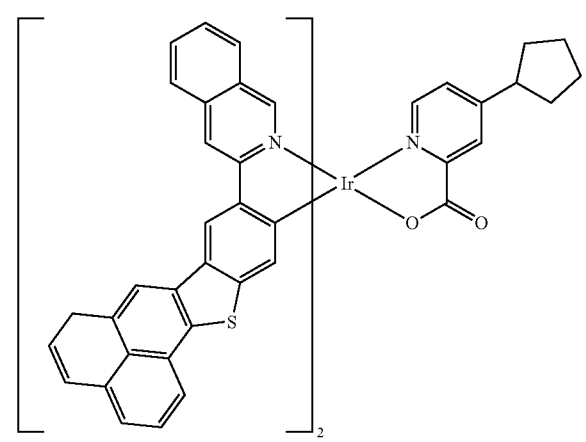
EX53
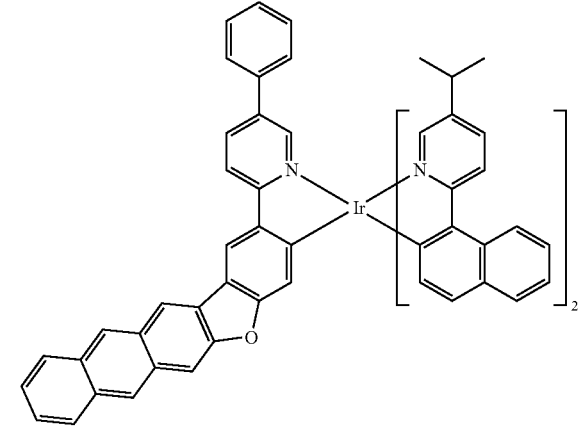

EX54
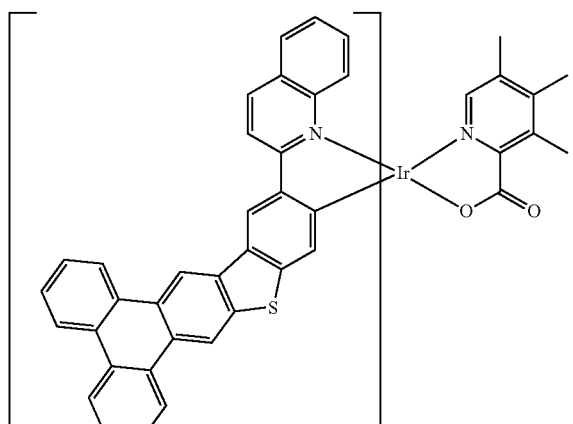
EX55
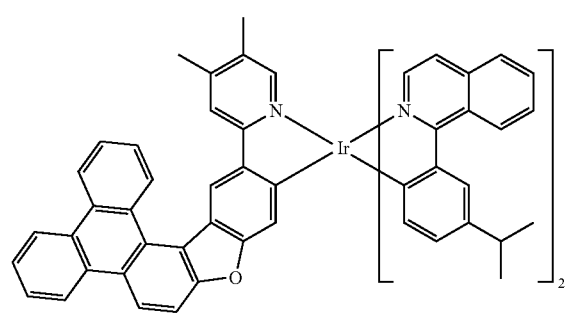
EX56
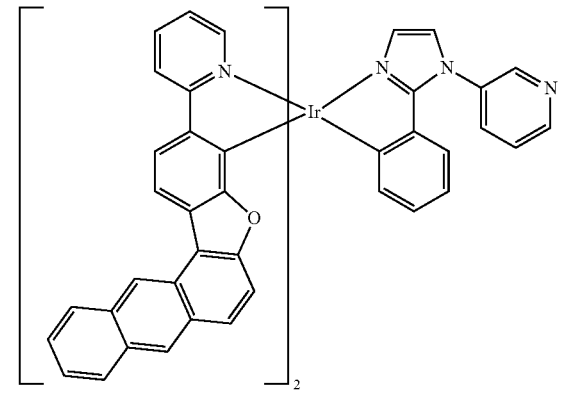
EX57
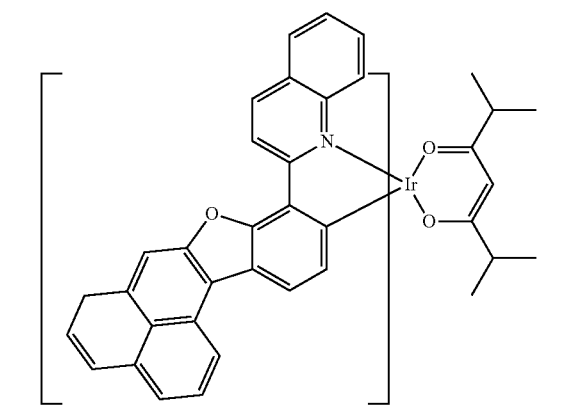
EX58
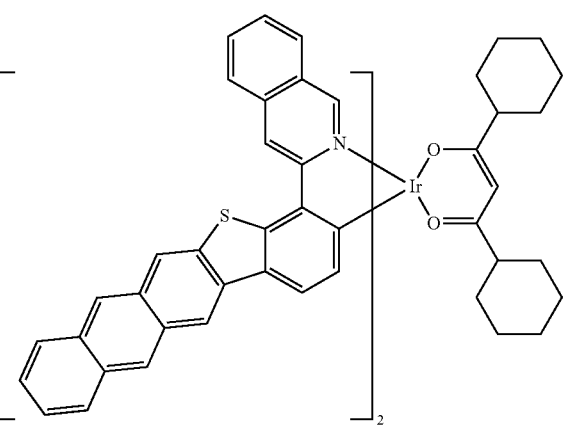
EX59
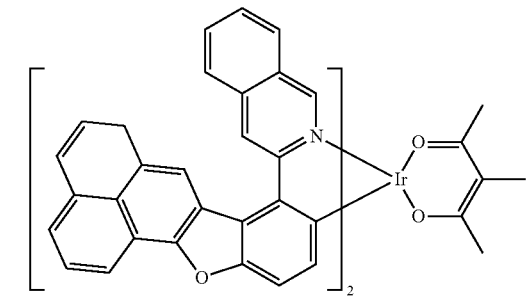
EX60
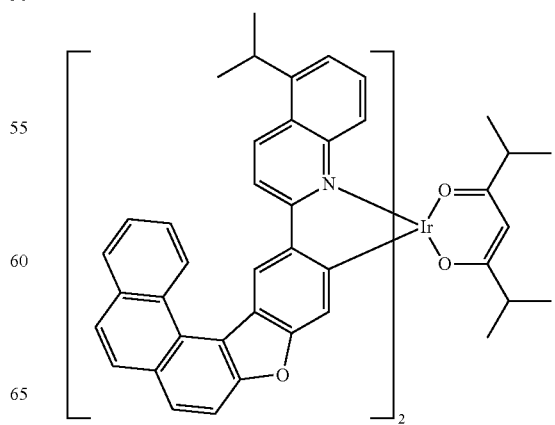

-continued
EX61
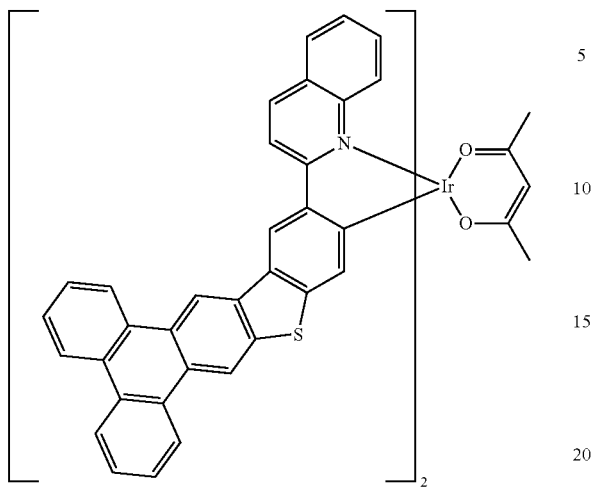
EX62
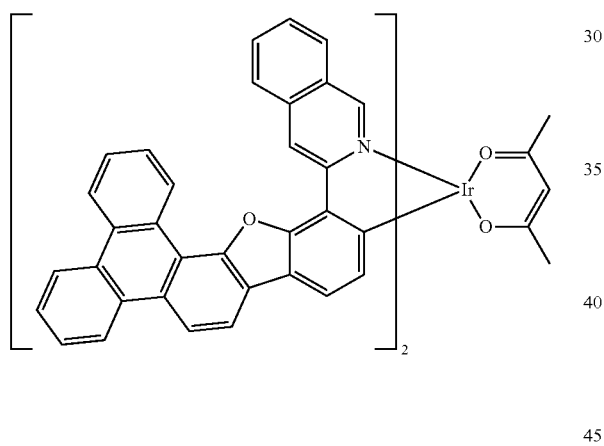
EX63
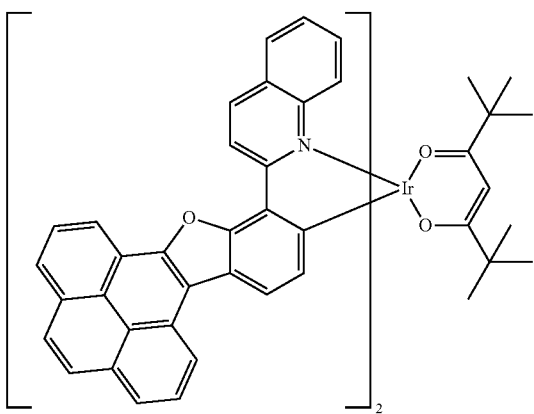
-continued
EX64
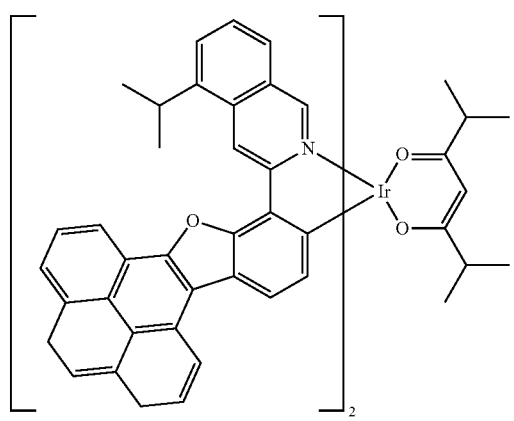
EX65
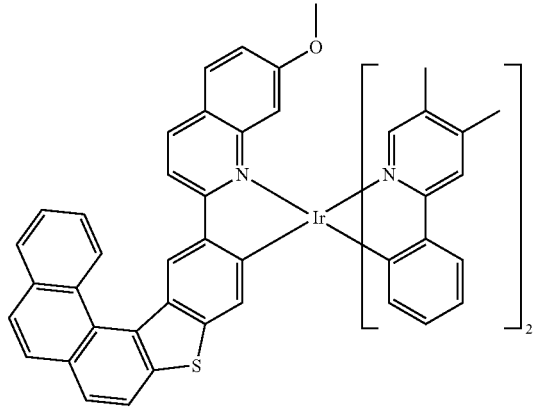
EX66
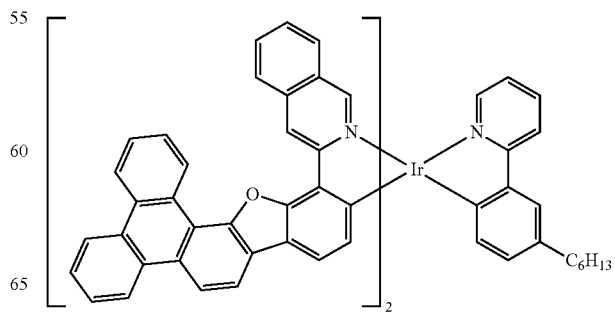

EX67
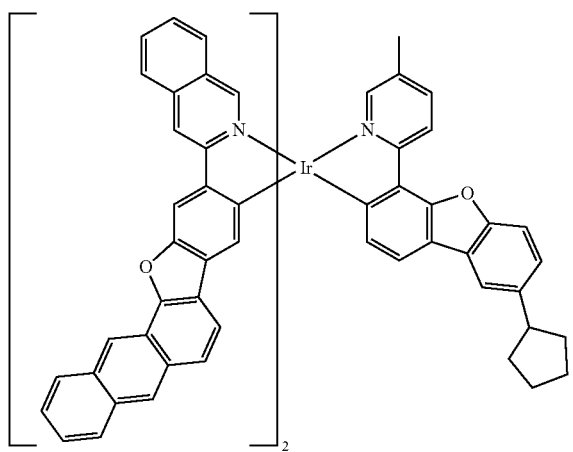
EX68
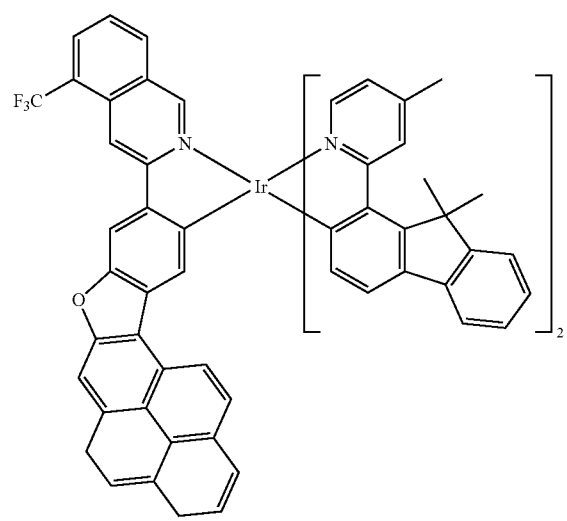
EX69
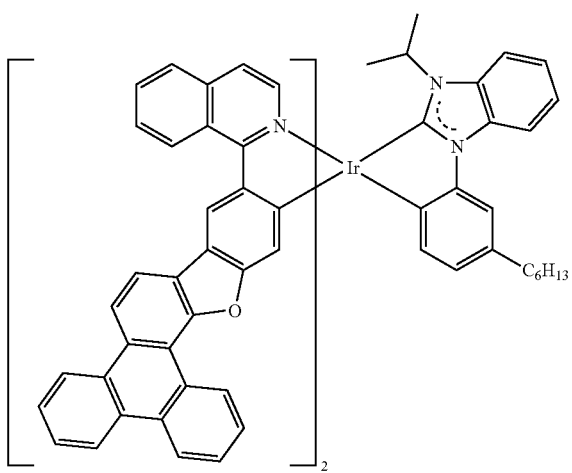
EX70
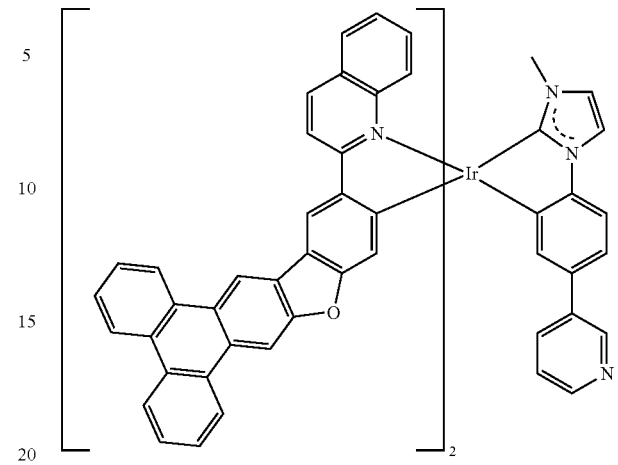
EX71
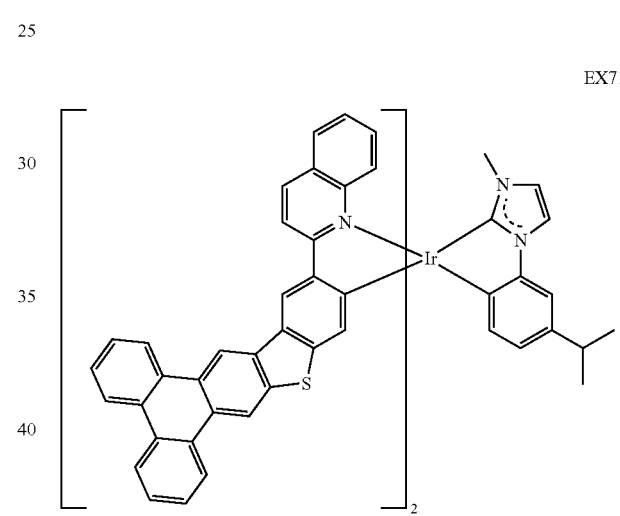
EX72
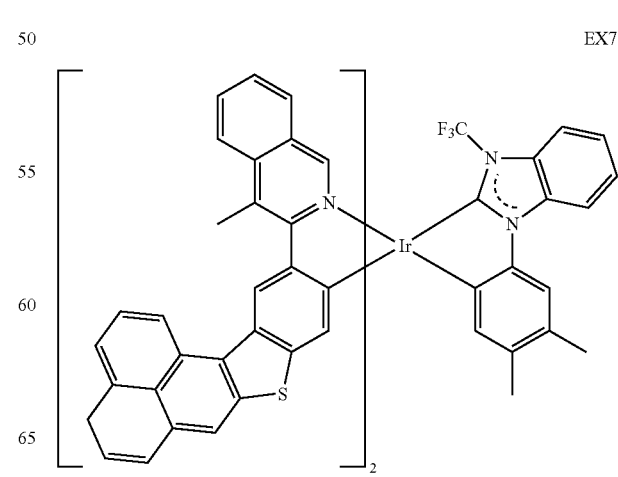

EX73
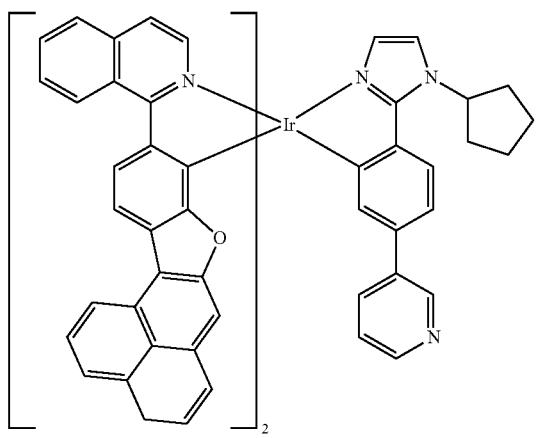
EX76
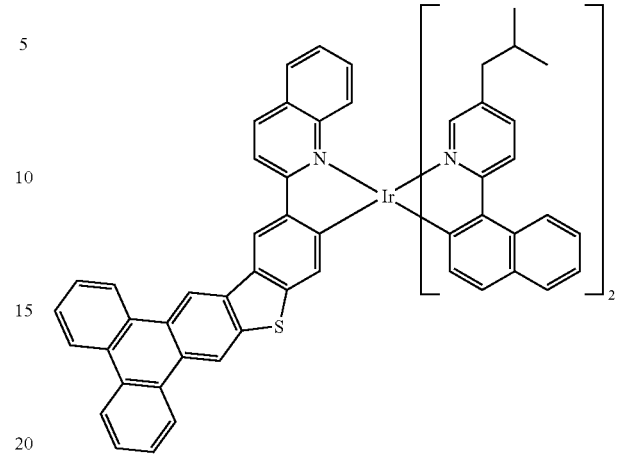
EX74
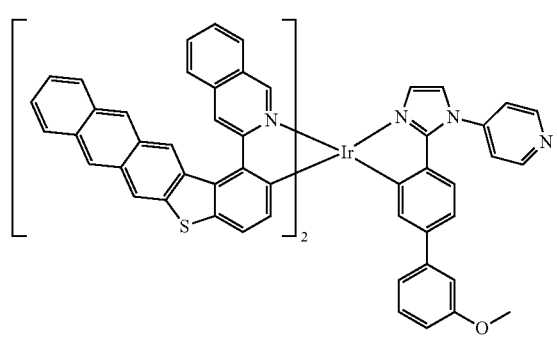
EX77
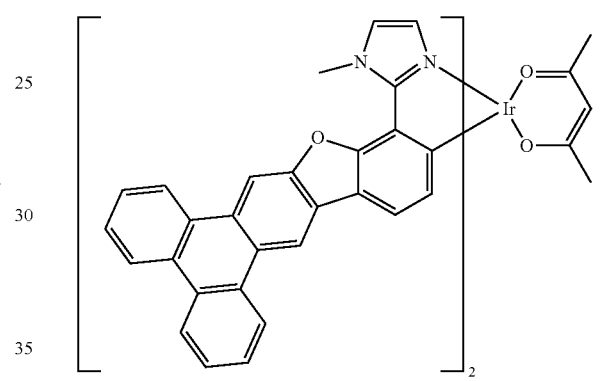
EX78
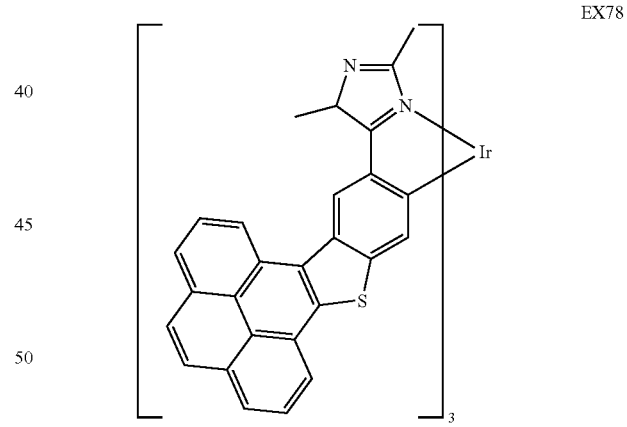
EX75
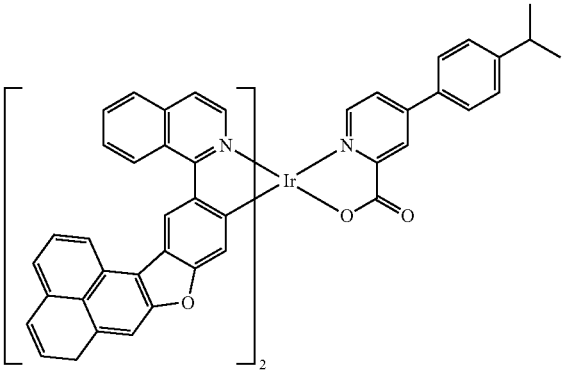
EX79
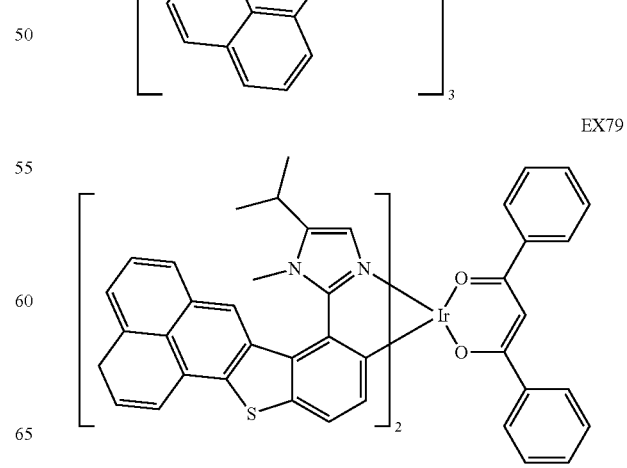

EX80
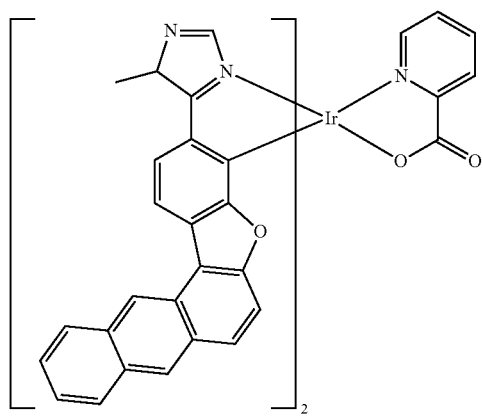
EX81
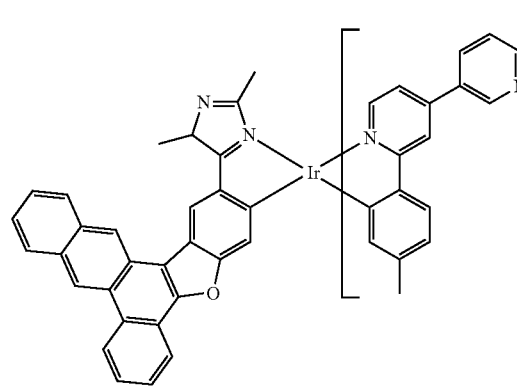
EX82
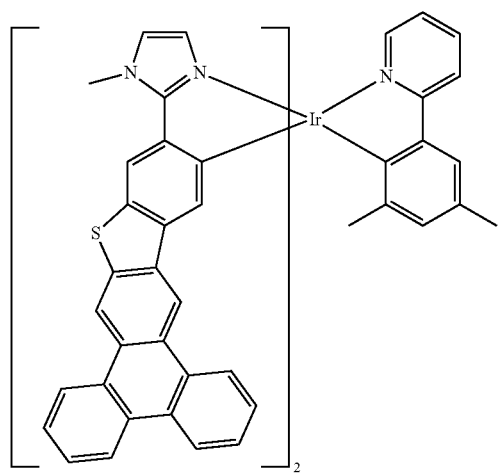
EX83
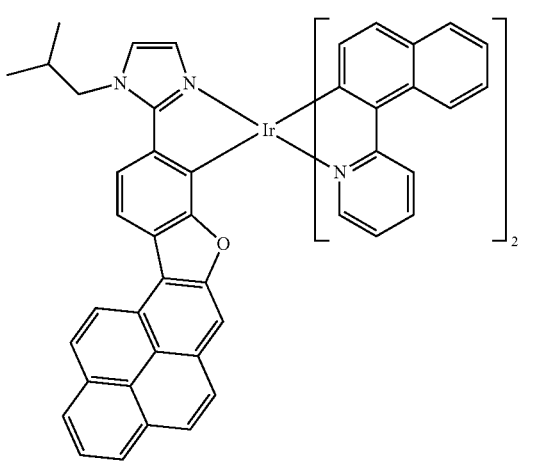
EX84
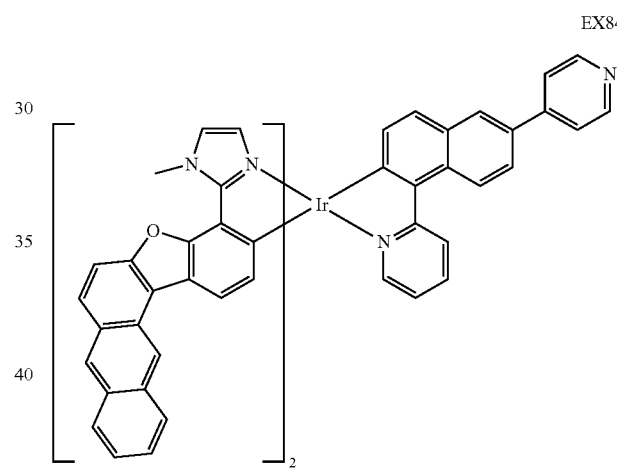
EX85
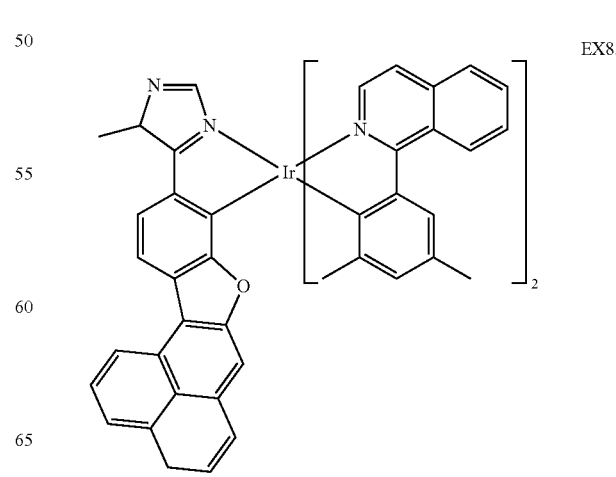

EX86
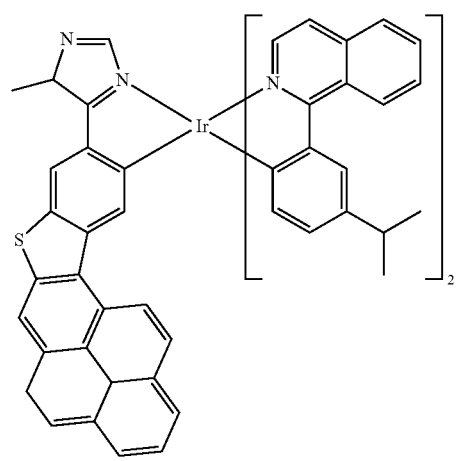
EX87
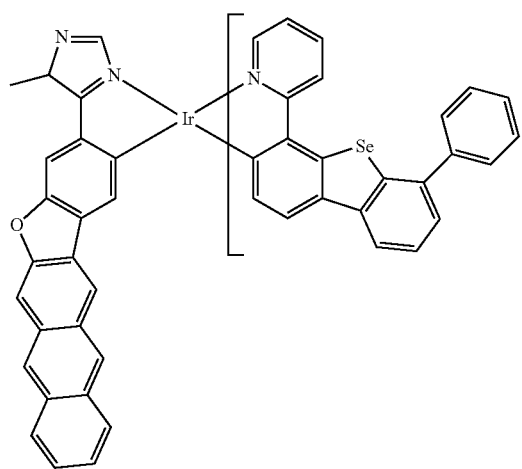
EX88
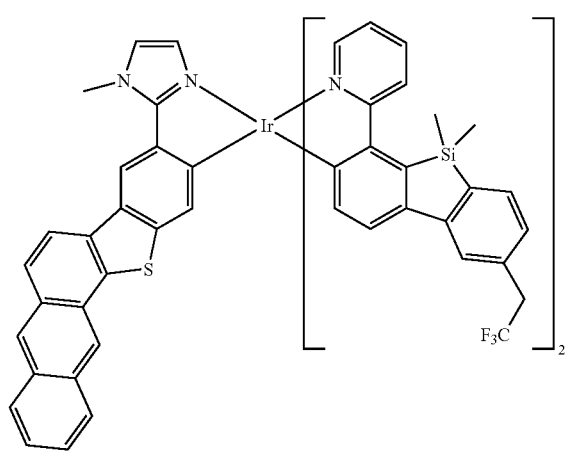
EX89
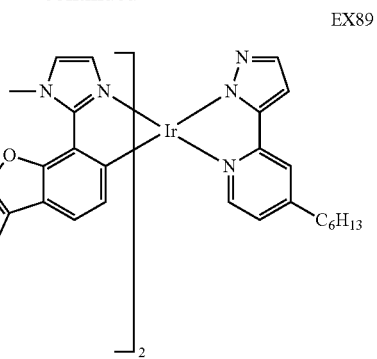
EX90
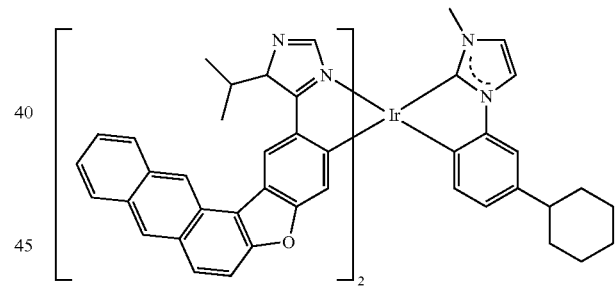
EX91
EX92
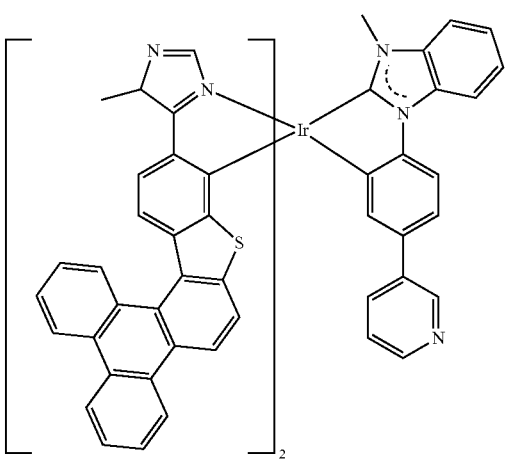

EX93
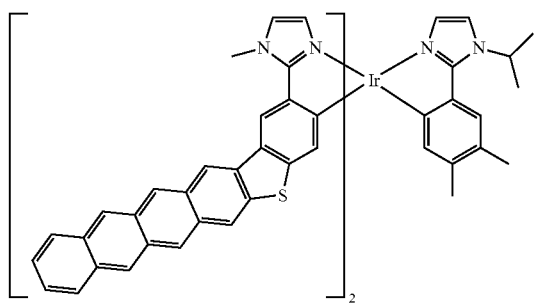
EX97
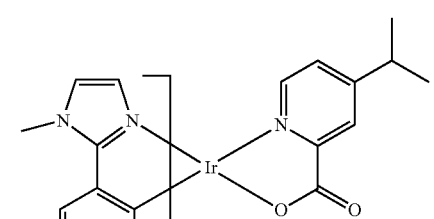
EX94
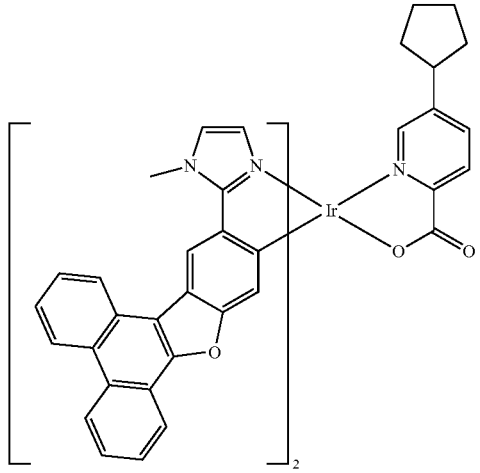
EX95
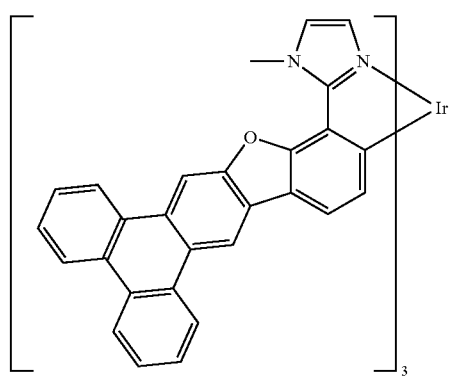
EX98
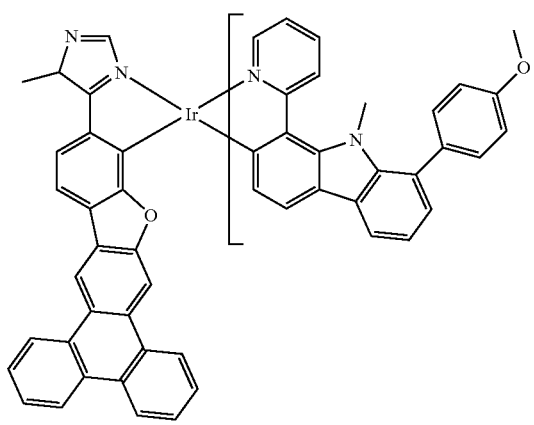
EX96
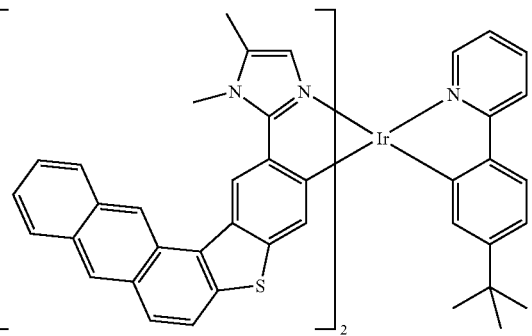
EX99

-continued

EX100
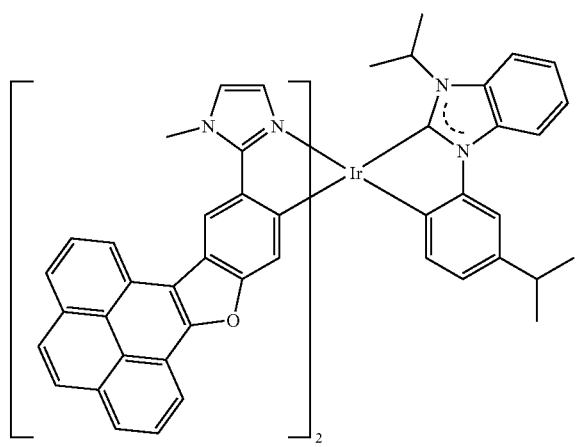

EX101
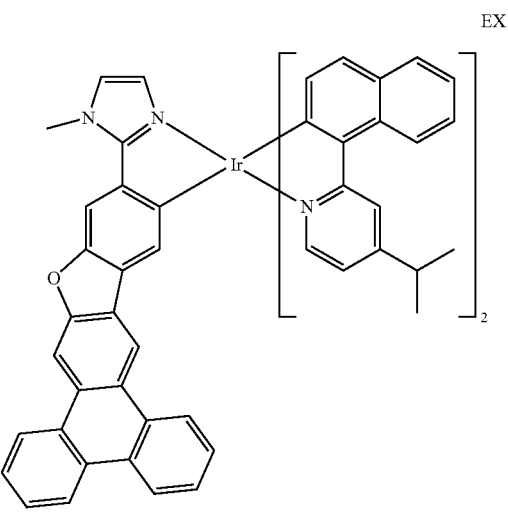

EX102
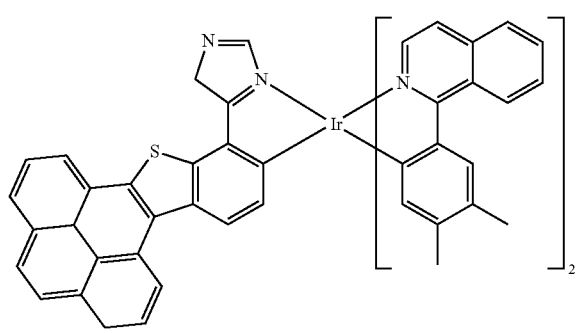

-continued

EX103
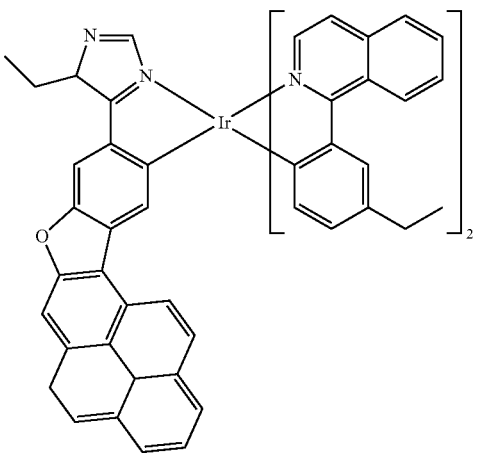

and

EX104
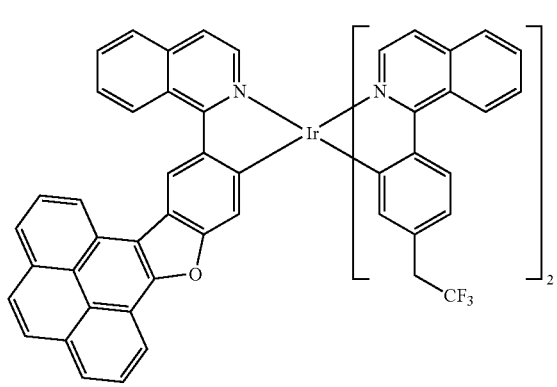

6. An organic electroluminescence device, comprising a pair of electrodes composed of a cathode and an anode, and a light emitting layer between the pair of electrodes, wherein the light emitting layer comprises the iridium complex of claim 1.

7. The organic electroluminescence device of claim 6, wherein the iridium complex of formula (1) is used as a phosphorescent dopant material.

8. The organic electroluminescence device of claim 6, wherein the light emitting layer emits red, yellow or green phosphorescence.

9. The organic electroluminescence device of claim 6, wherein the organic electroluminescence device is a lighting panel.

10. The organic electroluminescence device of claim 6, wherein the organic electroluminescence device is a backlight panel.

* * * * *

EX PARTE REEXAMINATION CERTIFICATE (12446th)
United States Patent
Yen et al.

(10) Number: US 11,239,435 C1
(45) Certificate Issued: Nov. 30, 2023

(54) IRIDIUM COMPLEX AND ORGANIC ELECTROLUMINESCENCE DEVICE USING THE SAME

(71) Applicants: Feng-Wen Yen, Taipei (TW); Li-Hsin Hsu, New Taipei (TW)

(72) Inventors: Feng-Wen Yen, Taipei (TW); Li-Hsin Hsu, New Taipei (TW)

(73) Assignee: UDC IRELAND LIMITED

Reexamination Request:
No. 90/015,208, Mar. 8, 2023

Reexamination Certificate for:
Patent No.: 11,239,435
Issued: Feb. 1, 2022
Appl. No.: 16/252,730
Filed: Jan. 21, 2019

(51) Int. Cl.
*H01L 51/00* (2006.01)
*C09K 11/06* (2006.01)
*C07F 15/00* (2006.01)
*H01L 51/50* (2006.01)
*H10K 85/30* (2023.01)
*H10K 101/10* (2023.01)
*H10K 50/11* (2023.01)

(52) U.S. Cl.
CPC ....... *H10K 85/342* (2023.02); *C07F 15/0033* (2013.01); *C09K 11/06* (2013.01); *C09K 2211/1007* (2013.01); *C09K 2211/1011* (2013.01); *C09K 2211/1029* (2013.01); *C09K 2211/1044* (2013.01); *C09K 2211/1088* (2013.01); *C09K 2211/1092* (2013.01); *C09K 2211/1096* (2013.01); *C09K 2211/185* (2013.01); *H10K 50/11* (2023.02); *H10K 2101/10* (2023.02)

(58) Field of Classification Search
None
See application file for complete search history.

(56) References Cited

To view the complete listing of prior art documents cited during the proceeding for Reexamination Control Number 90/015,208, please refer to the USPTO's Patent Electronic System.

*Primary Examiner* — Ling X Xu

(57) ABSTRACT

The present invention discloses an iridium complex represented by the following formula (1) and an organic electroluminescence device using the iridium complex as a phosphorescent dopant material. The phosphorescent dopant material may be for lowering a driving voltage or power consumption or increasing a current efficiency of half-life of the organic electroluminescence device.

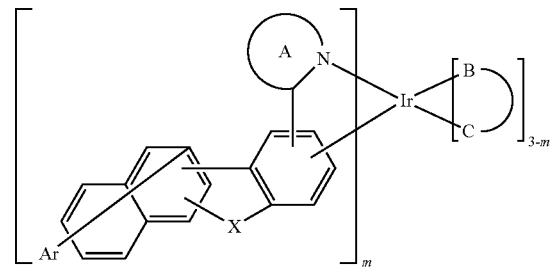

formula (1)

The same definition as described in the present invention.

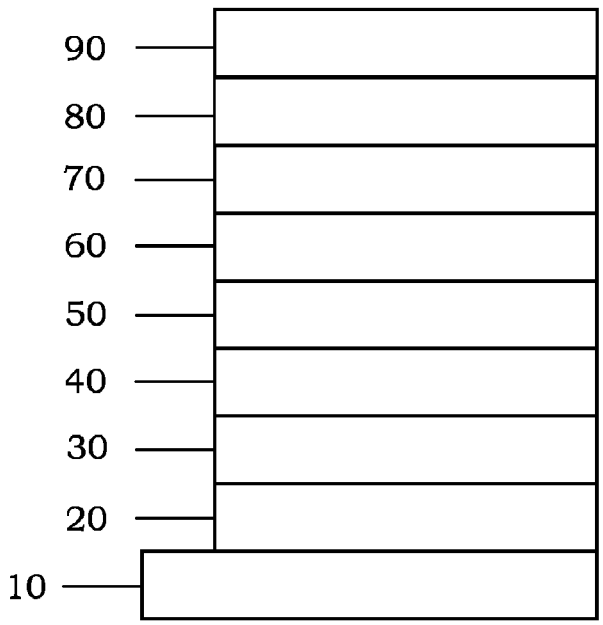

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPH OF THE SPECIFICATION AFFECTED BY AMENDMENT ARE PRINTED HEREIN.

Column 2, line 38 to Column 3, line 4:

The present invention has the economic advantages for industrial practice. Accordingly, the present invention discloses an iridium complex which may be used in organic EL devices. The mentioned iridium complex may be represented by the following formula (1):

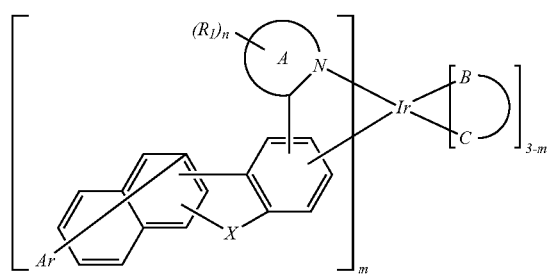

formula (1)

[
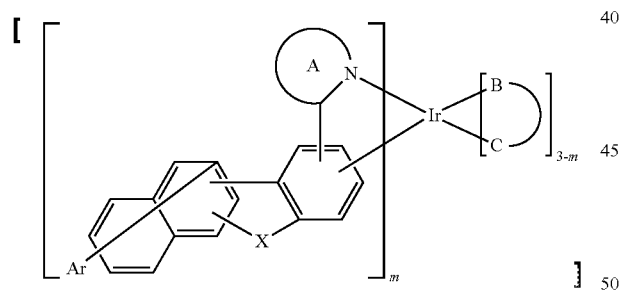
]

wherein B-C may represent a bidentate ligand. Ar may represent a substituted or unsubstituted fused ring hydrocarbon unit having one or two rings. Ring A may represents an imidazole, a pyridine, a quinoline or an isoquinoline. X may be O or S. The symbol m may represent an integer of 1, 2 or 3. The symbol n may represent an integer of 0, 1, 2, 3 or 4. $R_1$ may be selected from the group consisting of a hydrogen atom, a halogen, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

Column 5, line 32 to Column 5, line 65:

In one embodiment of the present invention, an iridium complex which can be used as a phosphorescent dopant material of a light emitting layer of an organic EL device is disclosed. The iridium complex may be represented by the following formula (1):

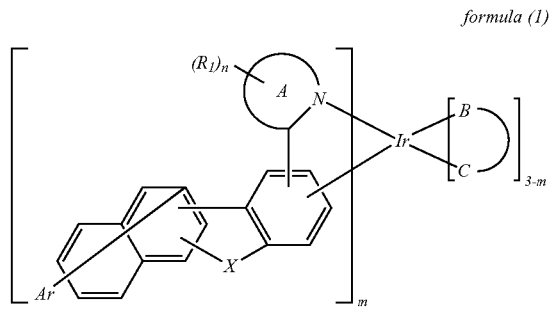

formula (1)

[
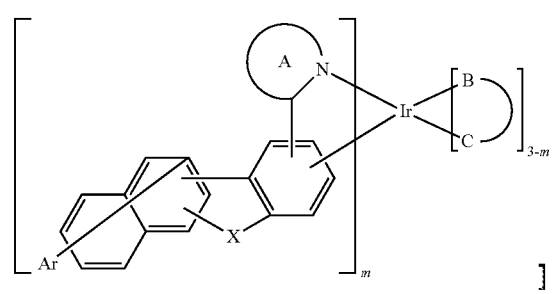
]

wherein B-C may represent a bidentate ligand. Ar may represent a substituted or unsubstituted fused ring hydrocarbon unit having one or two rings. Ring A may represents an imidazole, a pyridine, a quinoline or an isoquinoline. X may be O or S. The symbol m may represent an integer of 1, 2 or 3. The symbol n may represent an integer of 0, 1, 2, 3 or 4. $R_1$ may be selected from the group consisting of a hydrogen atom, a halogen, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

AS A RESULT OF REEXAMINATION, IT HAS BEEN DETERMINED THAT:

Claims 4-5 are cancelled.

Claims 1-3 are determined to be patentable as amended.

Claims 6-10, dependent on an amended claim, are determined to be patentable.

New claims 11-12 are added and determined to be patentable.

1. An iridium complex represented by the following formula (1) having a naphthalene [ring] *group*:

formula (1)

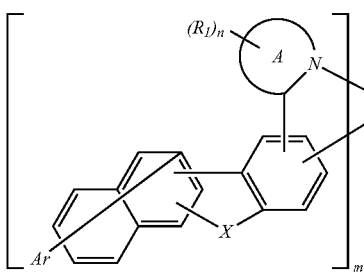

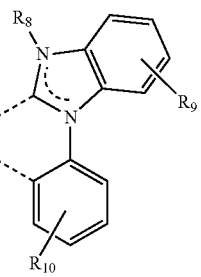 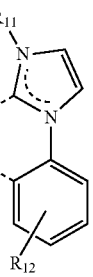 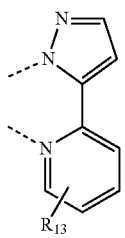

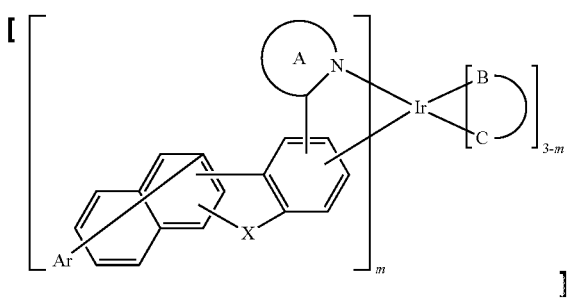

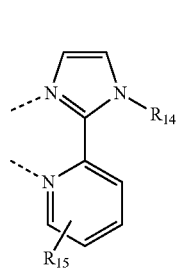 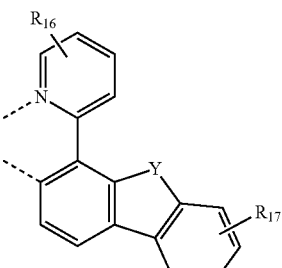

wherein B-C represents a bidentate ligand;

Ar [represent] *represents* a substituted or unsubstituted fused ring hydrocarbon unit *having one or two rings fused onto the naphthalene* [ring] *group, wherein a combination of the naphthalene group and Ar forms a pyrenyl group,* group A [ring] represents an imidazole, a pyridine, a [quinolone and] *quinoline or* an isoquinoline;

X is O or S;

m represents an integer of 1 to 3;

n represents an integer of 0 to 4; and

*each* $R_1$ is independently a hydrogen atom, a halogen, a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

2. The iridium complex according to claim 1, wherein the bidentate ligand *B-C* has one of the following formulas:

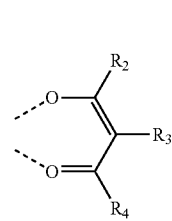 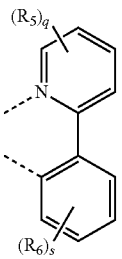 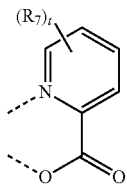

wherein Y is selected from the group consisting of O, S, Se, $CR_{22}R_{23}$, $NR_{24}$ or $SiR_{25}R_{26}$; *each of* q, s, and t independently represents an integer of 1 to 4; and *each* $R_2$ to $R_{26}$ [are] *is* independently a hydrogen atom, a halogen, a substituted or unsubstituted alkyl group having 1 to 30 carbon atoms, a substituted or unsubstituted cycloalkyl group having [1] 3 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

3. The iridium complex according to claim 2, wherein each $R_2$ to $R_{21}$ [are] *is* independently a hydrogen atom, a methyl group, an isopropyl group, an isobutyl group, a cyclopentyl group, a hexyl group, a cyclohexyl group, or a phenyl group.

11. The iridium complex according to claim 1, wherein the iridium complex is one of the following compounds:
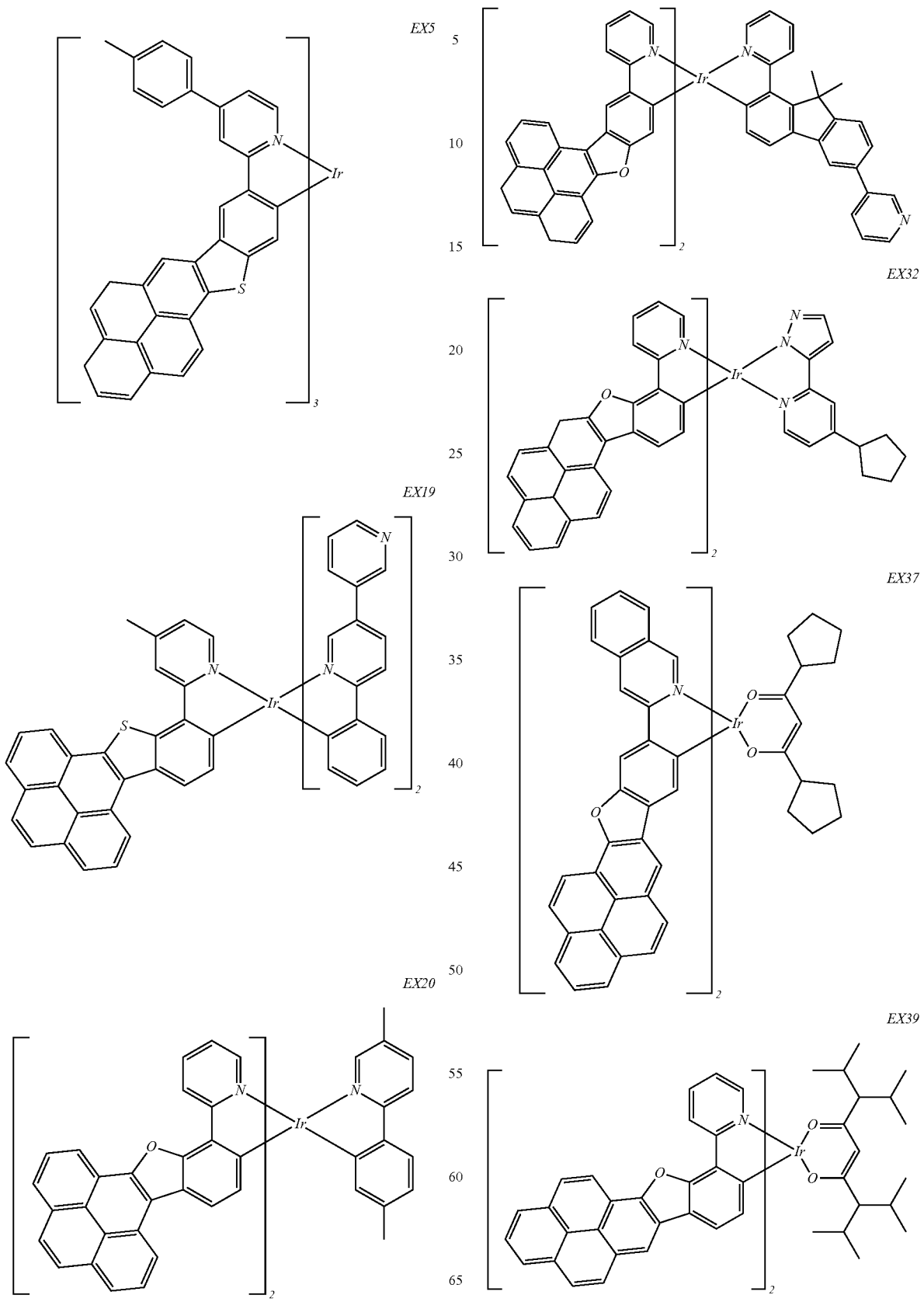

EX42
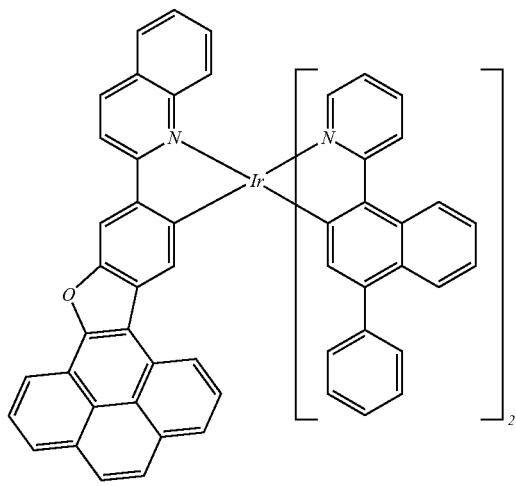
EX49
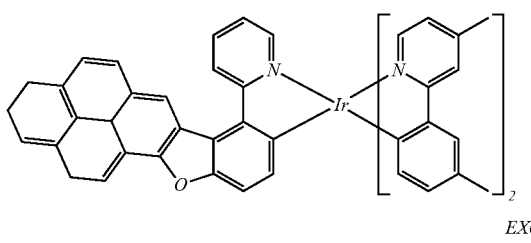
EX63
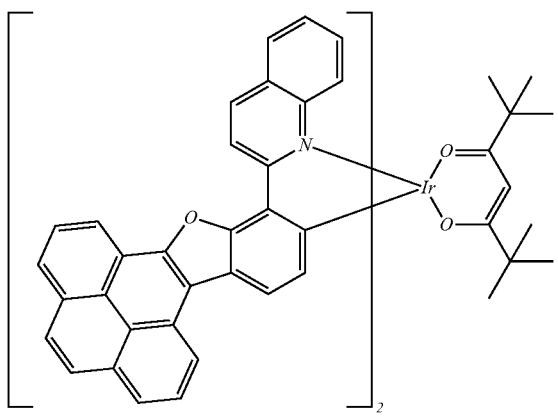
EX64
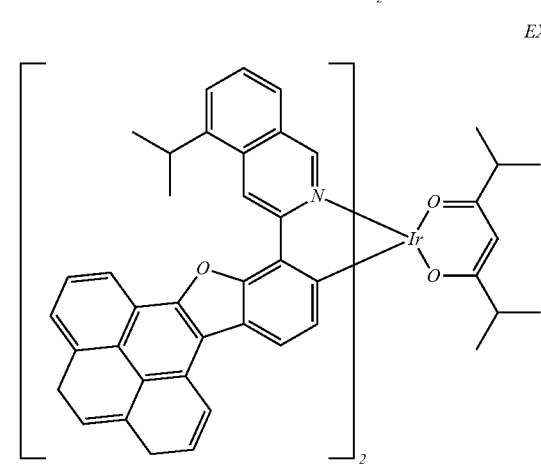
EX68
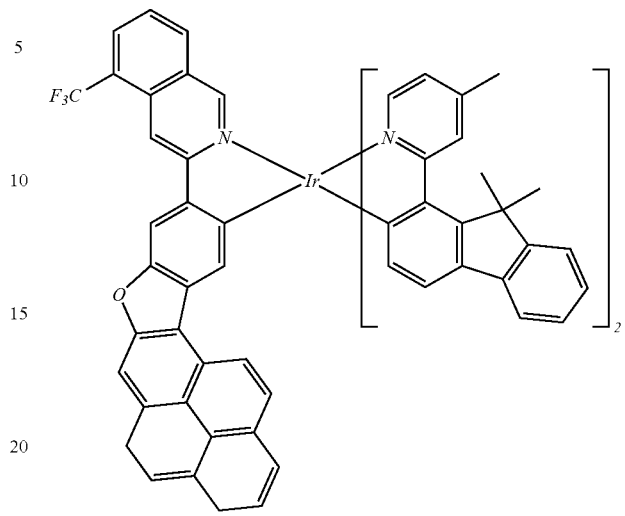
EX78
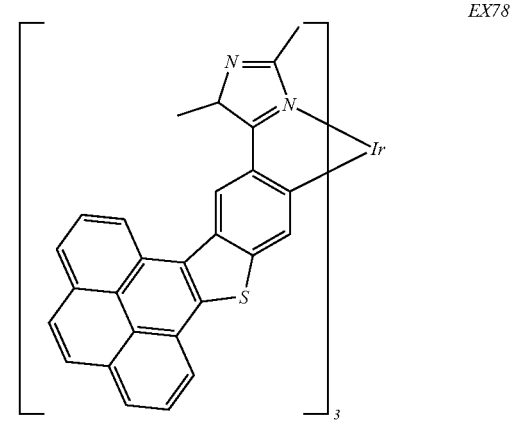
EX83
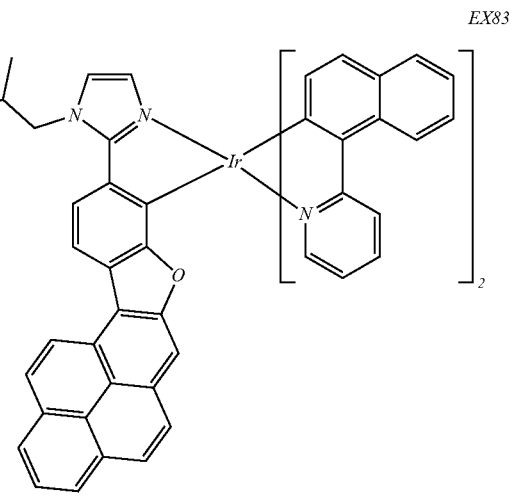

EX86
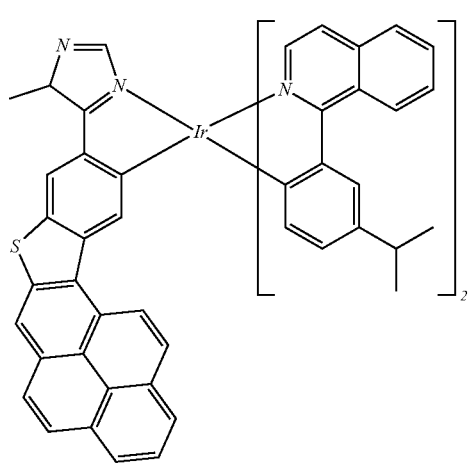
EX103
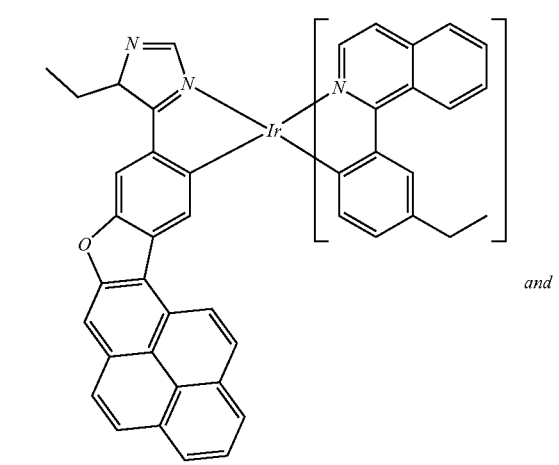
and
EX100
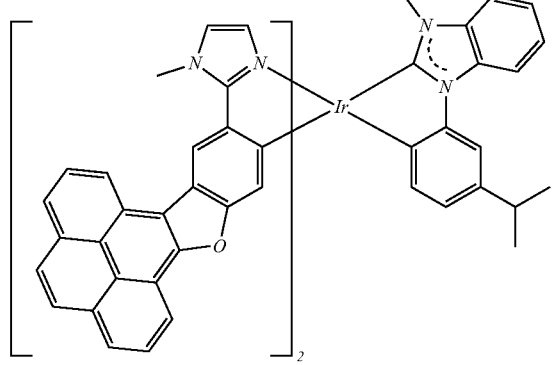
EX104
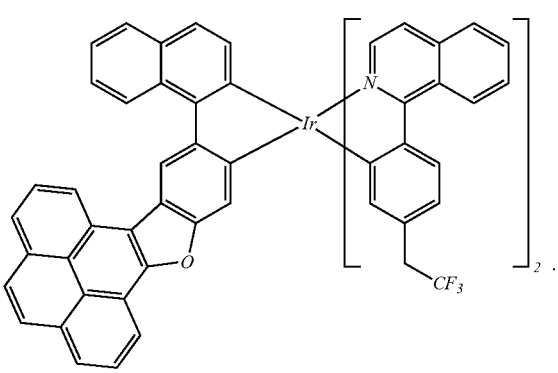
12. An iridium complex represented by one of formula (2),
formula (2)
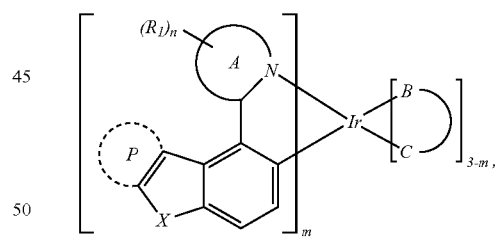
EX102
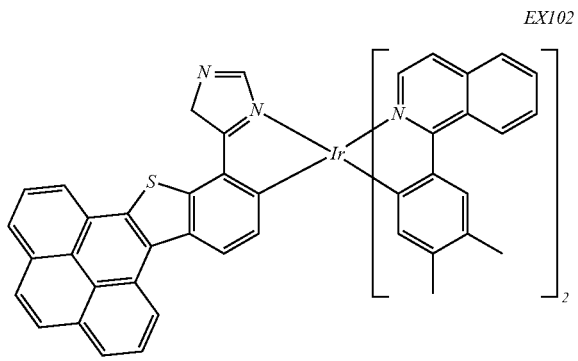
formula (3)
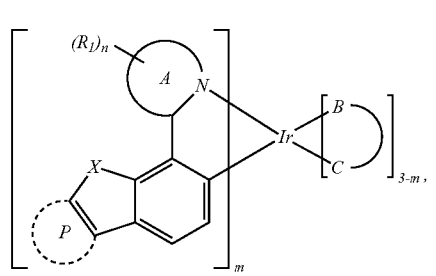

formula (4)

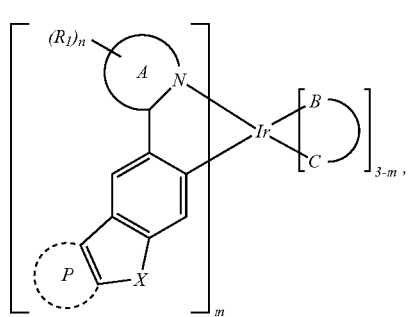

formula (5)

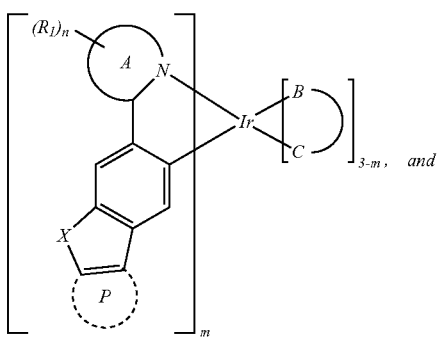

formula (6)

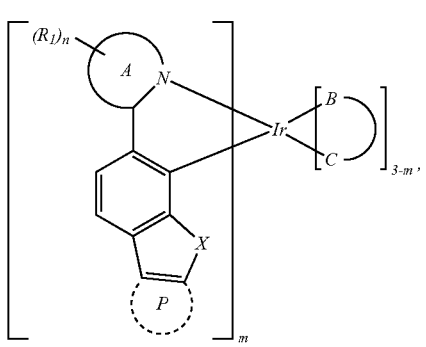

wherein:
B-C represents a bidentate ligand;
moiety P is substituted or unsubstituted pyrenyl:
group A represents an imidazole, a pyridine, a quinoline, or an isoquinoline;,
X is O or S;
m represents an integer of 1 to 3;
n represents an integer of 0 to 4; and
each $R_1$ is independently a hydrogen a halogen a substituted or unsubstituted alkyl group having 1 to 30 carbon atoms, a substituted or unsubstituted alkoxy group having 1 to 30 carbon atoms, a substituted or unsubstituted aryl group having 6 to 30 carbon atoms, a substituted or unsubstituted aralkyl group having 7 to 30 carbon atoms, or a substituted or unsubstituted heteroaryl group having 3 to 30 carbon atoms.

* * * * *